US008247687B2

(12) United States Patent
Miwa et al.

(10) Patent No.: US 8,247,687 B2
(45) **Date of Patent: *Aug. 21, 2012**

(54) PHOTOELECTRIC CONVERSION ELEMENT AND SOLAR CELL

(75) Inventors: Hideya Miwa, Tokyo (JP); Akihiko Itami, Tokyo (JP); Kazuya Isobe, Tokyo (JP); Kazukuni Nishimura, Tokyo (JP); Hidekazu Kawasaki, Tokyo (JP); Mayuko Ushiro, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 458 days.

This patent is subject to a terminal disclaimer.

(21) Appl. No.: 12/416,959

(22) Filed: Apr. 2, 2009

(65) Prior Publication Data

US 2009/0250115 A1 Oct. 8, 2009

(30) Foreign Application Priority Data

Apr. 7, 2008 (JP) ................................. 2008-099453

(51) Int. Cl.

| | |
|---|---|
| ***H01L 31/00*** | (2006.01) |
| ***H01L 51/00*** | (2006.01) |
| ***H01L 21/00*** | (2006.01) |
| ***C07C 211/00*** | (2006.01) |
| ***H01M 6/30*** | (2006.01) |

(52) U.S. Cl. .............. 136/263; 136/252; 257/40; 257/3; 257/431; 438/85; 438/82; 564/434; 564/305; 429/111

(58) Field of Classification Search .................. 136/263, 136/252; 257/40, 3, 431; 438/85, 82; 564/434, 564/305; 429/111

See application file for complete search history.

(56) References Cited

U.S. PATENT DOCUMENTS

| | | | | |
|---|---|---|---|---|
| 2008/0115826 | A1 * | 5/2008 | Nishimura et al. ........... | 136/252 |
| 2008/0173346 | A1 * | 7/2008 | Itami et al. .................... | 136/252 |

FOREIGN PATENT DOCUMENTS

| | | | |
|---|---|---|---|
| JP | 2005019253 | | 1/2005 |
| JP | 2005123033 | | 5/2005 |
| JP | 2006-079898 | * | 3/2006 |
| JP | 2006079898 | | 3/2006 |
| JP | 2006134649 | | 5/2006 |
| JP | 2006156212 | | 6/2006 |

OTHER PUBLICATIONS

Meng "Novel Cyanine Dyes with Multi-carboxyl groups and their Sensitization on Nanocrystalline Electrodes" Synthetic Metals, p. 1542-1544. Dec. 2003.*

JP2006-79898, Machine Translation, Mar. 2006, Shigaki.*

Nature, 353, 737 (1991), B.O. Regan, M. Gratzel.

* cited by examiner

*Primary Examiner* — Basia Ridley
*Assistant Examiner* — Devina Pillay
(74) *Attorney, Agent, or Firm* — Lucas & Mercanti, LLP

(57) ABSTRACT

Provided are a newly developed dye-sensitizing type photoelectric conversion element employing a highly durable sensitizing dye, exhibiting high photoelectric conversion efficiency, and a solar cell fitted with the photoelectric conversion element. Also disclosed is a photoelectric conversion element comprising a compound represented by Formula (1) between a pair of facing electrodes.

Formula (1)

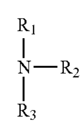

11 Claims, 1 Drawing Sheet

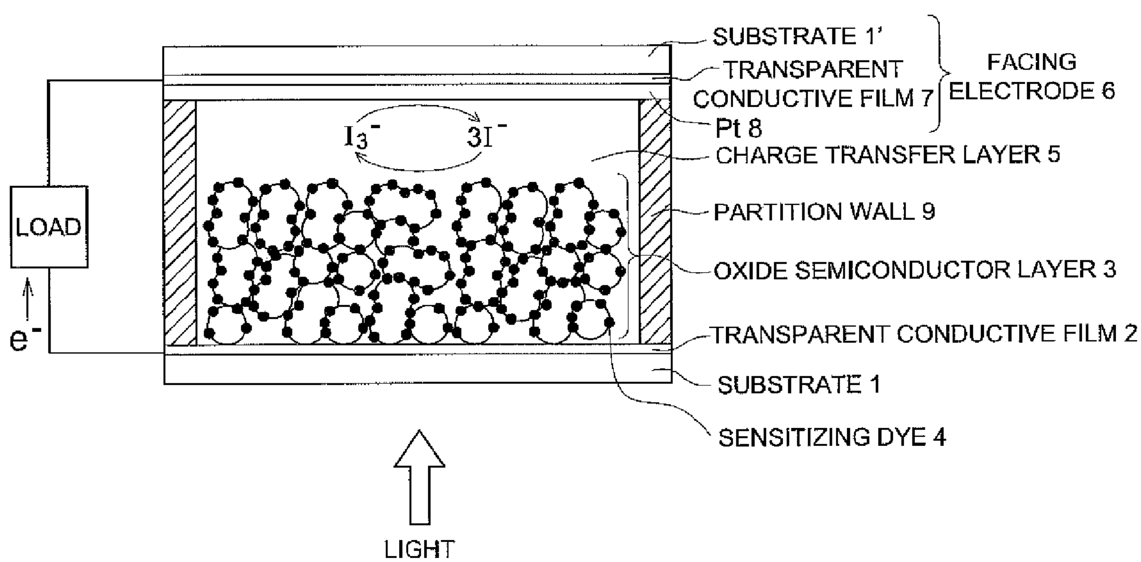
SUBSTRATE 1'
TRANSPARENT CONDUCTIVE FILM 7
FACING ELECTRODE 6
Pt 8
$I_3^-$
$3I^-$
CHARGE TRANSFER LAYER 5
LOAD
PARTITION WALL 9
OXIDE SEMICONDUCTOR LAYER 3
$e^-$
TRANSPARENT CONDUCTIVE FILM 2
SUBSTRATE 1
SENSITIZING DYE 4
LIGHT

PHOTOELECTRIC CONVERSION ELEMENT AND SOLAR CELL

This application claims priority from Japanese Patent Application No. 2008-099453 filed on Apr. 7, 2008, which is incorporated hereinto by reference.

TECHNICAL FIELD

The present invention relates to a photoelectric conversion element, and specifically to a dye-sensitizing type photoelectric conversion element and a solar cell fitted with the photoelectric conversion element.

BACKGROUND

In recent years, application of infinite solar light producing no harmful substances has been actively studied. Inorganic type solar cells such as single crystalline silicon, polycrystalline silicon, amorphous silicon, and cadmium telluride and indium copper selenide for domestic use are provided as those presently available in practical use as a clean energy source in application of solar light.

However, as drawbacks of these inorganic type solar cells, in the case of the silicon type, no only extremely high purity is required, but also the complicated purification process includes many steps at high production coat.

On the other hand, many solar cells employing an organic material have also been proposed. Examples of the organic solar cell include a Schottky type photoelectric conversion element in which a p-type organic semiconductor and metal having a small work function are joined, and a heterojunction type photoelectric conversion element in which a p-type organic semiconductor and an n-type inorganic semiconductor or a p-type organic semiconductor and an electron acceptable organic compound are joined. The utilized organic semiconductors are synthesized dyes or pigments such as chlorophyll, perylene and so forth, conductive polymers such as polyacetylene and so forth, and the composite material thereof. Such the material to be used as the cell material is thin-layered by a vacuum evaporation method, a casting method, a dipping method or the like. The organic materials have advantages of low cost is low and easy production of large area, but there is a problem such as a low conversion efficiency of 1% or less together with insufficient durability.

In such the situation, a solar cell exhibiting favorable properties has been reported by Dr. Gratzel et al. in Switzerland, cf. Non-patent document 1 for example. The proposed cell is a dye sensitizing type solar cell, and a wet type solar cell in which a porous titanium oxide thin film spectrally sensitized by a ruthenium complex is provided as a functional electrode. Advantages of this technique are that purification of a cheep oxide semiconductor such as titanium oxide up to high purity is not necessary, and solar light having a large visible light component can be effectively converted into electricity in accordance with usable light covering a wide wavelength of visible light at low cost.

In contrast, ruthenium complex is under threat of its supply in cases where this solar cell is put into practical use, since the ruthenium complex as limited resource is utilized. Further, since ruthenium complex is expensive, and produces a problem in aging stability, this problem can be solved if the ruthenium complex can be replaced by an inexpensive and stable organic dye.

It is known that a dye molecule having both of a π-electron conjugated system exhibiting electron donating ability and an acidic adsorption group exhibiting an electron withdrawing property provides an element exhibiting high photoelectric conversion efficiency. Triarylamine derivatives have been widely used as the electron donating π-electron conjugated system (refer to Patent Documents 1-4, for example). However, there remains a problem such that absorption on the long wavelength side of visible light is weak, since a solution of this dye has an absorption peak of 500 nm or less. A photoelectric conversion element capable of more effectively utilizing solar light energy can be provided when expanding the light absorption range of the dye further to the longer wavelength side. As a means to expand the light absorption range to the longer wavelength side, longer wavelength via absorption through J-aggregate can be provided (refer to Patent Document 5, for example). However, since the durability level is not satisfactory, it is found out that the level is demanded to be further improved.

(Patent Document 1) Japanese Patent O.P.I. Publication No. 2005-123033

(Patent Document 2) Japanese Patent O.P.I. Publication (Patent Document 3) Japanese Patent O.P.I. Publication (Patent Document 4) Japanese Patent O.P.I. Publication (Patent Document 5) Japanese Patent O.P.I. Publication (Non-patent Document 1) Nature, 353, 737 (1991), B. O. Regan, M. Gratzel

SUMMARY

It is an object of the present invention to provide a newly developed photoelectric conversion element composed of a highly durable sensitizing dye, exhibiting high photoelectric conversion efficiency, which is utilized as a dye-sensitizing type photoelectric conversion element, and also to provide a solar cell fitted with the photoelectric conversion element.

BRIEF DESCRIPTION OF THE DRAWING

FIG. 1 is a schematic cross-sectional view showing an example of a photoelectric conversion element of the present invention.

DESCRIPTION OF THE PREFERRED EMBODIMENTS

The above object of the present invention is accomplished by any of the following structures.

(Structure 1) A photoelectric conversion element comprising a compound represented by the following Formula (1) between a pair of facing electrodes:

Formula (1)

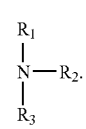

wherein each of $R_1$, $R_2$ and $R_3$ represents an aromatic hydrocarbon group or a heterocyclic group that may have a substituent; and each of at least two of $R_1$, $R_2$ and $R_3$ is represented by the following Formula (2):

Formula (2)

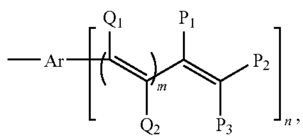

wherein Ar represents an aromatic hydrocarbon group or a heterocyclic group that may have a substituent; n is an integer of 1-5; m is 0 or 1; each of $Q_1$ and $Q_2$ independently represents a hydrogen atom, a nitro group, a cyano group, a hydroxyl group, a carbonyl group, a thiol group, an alkyl group that may be substituted, an alkenyl group, an alkynyl group, an alkoxy group, a thioalkyl group, an amino group, an arylene group or a heterocyclic group; each of $P_1$, $P_2$ and $P_3$ independently represents a hydrogen atom, a halogen atom, a nitro group, a cyano group, a hydroxyl group, a carbonyl group, a thiol group, an alkyl group that may be substituted, an alkenyl group that may be substituted, an alkynyl group that may be substituted, an alkoxy group that may be substituted, a thioalkyl group that may be substituted, an amino group that may be substituted, an aryl group that may be substituted or a heterocyclic group that may be substituted; at least one of $P_1$, $P_2$ and $P_3$ represents an aromatic hydrocarbon group or a heterocyclic group substituted by an organic residue having an acidic group; $R_1$, $R_2$, $R_3$, $P_1$, $P_2$, $P_3$, $Q_1$ and $Q_2$ may form a cyclic structure directly, or via other bonded atoms; and a carbon-carbon double bond may be in any of a cis arrangement and a trans arrangement.

(Structure 2) The photoelectric conversion element of Structure 1, wherein Ar in Formula (2) comprises a phenylene group.

(Structure 3) The photoelectric conversion element of Structure 1 or 2, wherein m is 0 in Formula (2).

(Structure 4) The photoelectric conversion element of any one of Structures 1-3, wherein n is 1 in Formula (2).

(Structure 5) The photoelectric conversion element of any one of Structures 1-4, wherein $P_1$ comprises a hydrogen atom, and at least one of $P_2$ and $P_3$ comprises an aromatic hydrocarbon group substituted by an organic residue having an acidic group.

(Structure 6) The photoelectric conversion element of any one of Structures 1-5, wherein the organic residue having the acidic group comprises an ethylene group substituted by a carboxylic acid group or a cyano group.

(Structure 7) The photoelectric conversion element of any one of Structures 1-6, wherein each of $R_1$ and $R_2$ is represented by Formula (2); Ar is an arylene group; m is 0; n is 1; $P_1$ is a hydrogen atom; and $P_2$ or $P_3$ comprises a phenyl group substituted by an organic residue having an acidic group.

(Structure 8) The photoelectric conversion element of any one of Structures 1-7, wherein Formula (2) is represented by the following Formula (3), and $P_2$ comprises a phenyl group that may have a hydrogen atom or a substituent:

Formula (3)

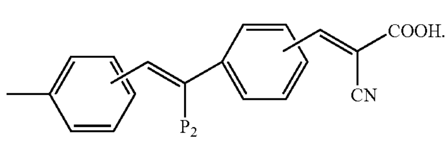

(Structure 9) The photoelectric conversion element of structure 1, wherein Formula (2) is represented by the following Formula (4):

Formula (4)

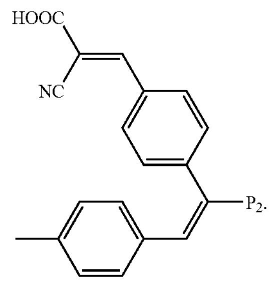

(Structure 10) The photoelectric conversion element of Structure 1, wherein Formula (2) is represented by the following Formula (5):

Formula (5)

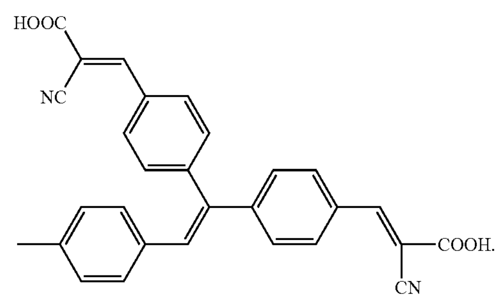

(Structure 11) The photoelectric conversion element of any one of Structures 1-101 comprising a charge transfer layer and a semiconductor layer carrying a compound having a structure represented by Formula (1).

(Structure 12) A solar cell comprising the photoelectric conversion element of any one of Structures 1-11.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

Next, the photoelectric conversion element of the present invention will be described on the basis of FIG. 1.

FIG. 1 is a schematic cross-sectional view showing an example of a photoelectric conversion element of the present invention.

As shown in FIG. 1, the photoelectric conversion element possesses substrate 1, substrate 1', transparent conductive film 2, transparent conductive film 7, semiconductor 3, sensitizing dye 4, electrolyte 5, partition wall 9, and so forth.

As a photoelectrode, utilized is one in which a semiconductor layer having air holes formed via sintering of particles of semiconductor 3 is provided on substrate 1 on which transparent conductive film 2 is placed, and sensitizing dye 4 is adsorbed on the air hole surface.

As shown in FIG. 1, one in which transparent conductive layer 7 is formed on substrate 1', and platinum 8 is deposited thereon via evaporation is utilized for facing electrode 6, and an electrolyte is filled in between both electrodes to form an electrolyte layer (charge transfer layer) 5.

The present invention is of one in which a newly developed sensitizing dye represented by Formula (1) is applied to this photoelectric conversion element. The sensitizing dye generates electric current via repetition of photooxidation reaction during power generation. Thus, a dye exhibiting excellent optical stability to realize improved durability has been demanded.

The inventors have prepared a structure capable of adsorption to titanium oxide via addition of an acid group in such a way that photo-excited electrons can be effectively moved to the titanium oxide electrode by setting triaryl amine such as triphenylamine or the like exhibiting high photoelectric conversion efficiency to a base moiety of the sensitizing dye. Further, in order to provide ozone stability and optical stability to possibly improve durability against the photooxidation reaction, they have found out that this problem is solved by further introducing an aryl group, a heterocyclic group or the like into an ethylene portion with respect to a styryl unit constituting a compound represented by forgoing Formula (1).

The reason why ozone stability and optical stability have been improved by introducing an aryl group, a heterocyclic group or the like into a styryl unit in forgoing Formula (1) is unknown, but the following reason can be taken into account. That is, when a bulky substituent such as an aryl group, a heterocyclic group or the like is introduced into an ethylene portion which tends to be easily oxydation-deteriorated via electricity application, attack from the degraded reactant tends to be inhibited, whereby oxidation-deterioration and so forth can be presumably arranged to be controlled.

In such the way, a photoelectric conversion element employing a newly developed sensitizing dye, exhibiting high photoelectric conversion efficiency together with high durability has become possible to be provided by using the above-described structure in the present invention.

Next, the compound represented by foregoing Formula (1) (hereinafter, referred to also as a sensitizing dye of the present invention) will be described.

In the compound represented by foregoing Formula (1), $R_1$, $R_2$ and $R_3$ each represents a substituted or unsubstituted aryl group, or a substituted or unsubstituted heterocyclic group, and at least two of $R_1$, $R_2$ and $R_3$ are represented by foregoing Formula (2). These may form a cyclic structure via connection to each other. Further, when $P_1$, $P_2$ and $P_3$ each are an alkyl group, an aryl group or a heterocyclic group, a substituent may be contained, and at least one of $P_1$, $P_2$ and $P_3$ represents an aromatic hydrocarbon group or a heterocyclic group substituted by an organic residue having an acidic group. Each of these aryl group and heterocyclic group may be one having a substituent, the following examples are cited as the substituent. That is, (1) a halogen group such as fluorine, chlorine, bromine or the like; (2) each of substituted and unsubstituted alkyl group such as a methyl group, an ethyl group, a t-butyl group, an isobutyl group, a dodecyl group, a hydroxyethyl group, a methoxyethyl group or the like; (3) an alkoxy group such as a methoxy group or the like; (4) an aryl group such as a phenyl group, a tolyl group or the like; (5) an alkenyl group such as an allyl group or the like; (6) an amino group such as a dimethylamino group or the like; and (7) a heterocyclic group such as a morphonyl group, a furanyl group or the like.

Examples of the acidic group include a carboxyl group, a phosphonyl group, a sulphonyl group and so forth, and examples of the organic residue include an alkylene group, an alkenylene group, an arylene group, a heterocyclic group and so forth, or their combinations. Examples of a preferred organic residue having an acidic group include -(alkylene)-COOH, -(arylene)-COOH, -(alkylene)-$PO(OH)_2$, —CH═C(CN)COOH, -(heterocycle)-(alkylene)-COOH, —CH=(heterocycle)-(alkylene)-COOH, and so forth. An electron-withdrawing group is more preferably adjacent to an carboxylic group, and electrons are favorably localized around the adsorption portion of a dye and titanium oxide. As the electron-withdrawing group, a cyano group is preferable, and for example, —CH═C(CN)COOH is provided.

Examples of the aromatic hydrocarbon group contained in the compound represented by Formula (1) include a phenyl group, a naphthyl group, a biphenyl group, a fluorenyl group, an anthryl group, a phenanthryl group and so forth, and examples of the heterocyclic group include a thienyl group, a furyl group, an indolyl group and so forth.

Further, the compound represented by Formula (1) is preferably one having n equal to 2, and is specifically preferably one having n equal to 2 and m equal to 0. The compound satisfying this condition is strongly adsorped to titanium oxide on the terminal side of two aryls mainly for nitrogen atom N in the triarylamine molecule. On the other hand, the remaining one aryl is located outside from titanium oxide to cover the titanium oxide surface densely with a dye, whereby contact between a charge transfer layer and titanium oxide is inhibited, and reverse electron transfer is prevented. Thus, presumably, to obtain an excellent photoelectric conversion characteristic in this case is preferable.

Further, when the compound represented by Formula (1) constitutes a π-conjugation system by the entire compound, longer wavelength concerning the absorption wavelength can be preferably produced, and an activated gas resistance property is preferably improved.

Specific examples of the group represented by $R_1$, $R_2$, $R_3$, $P_1$, $P_2$ or $P_3$ will be shown below. In addition, at least one of $P_1$, $P_2$ and $P_3$ is an aromatic hydrocarbon group or a heterocyclic group substituted by an organic residue having an acidic group, but in the following, the organic residue having an acidic group has been omitted.

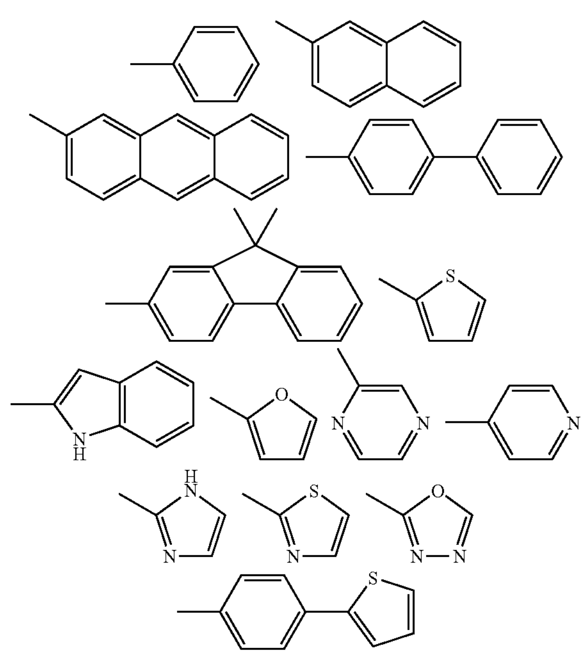

-continued
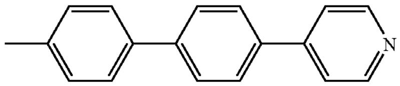
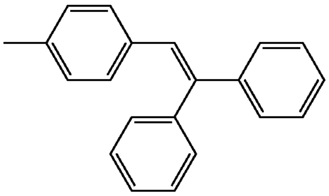
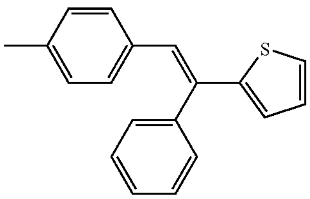
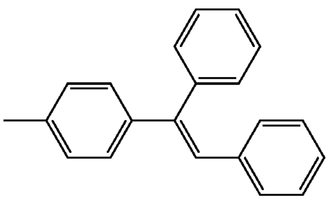
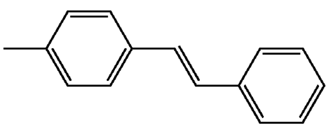
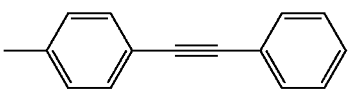
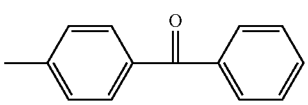
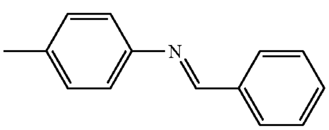
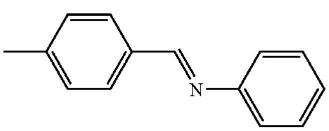
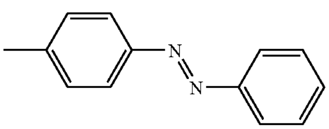
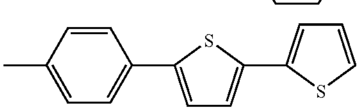
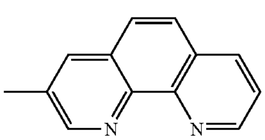
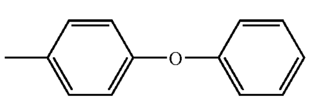
-continued
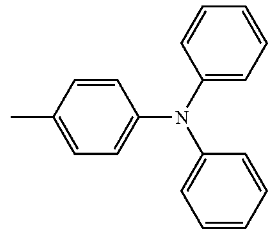
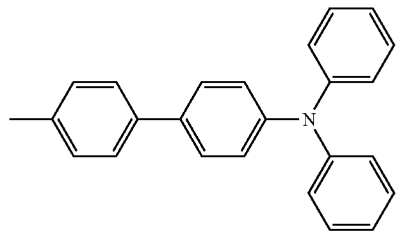
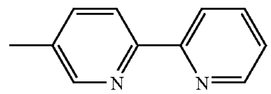
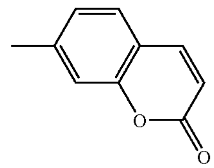
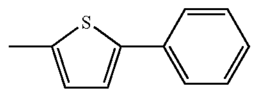
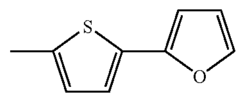
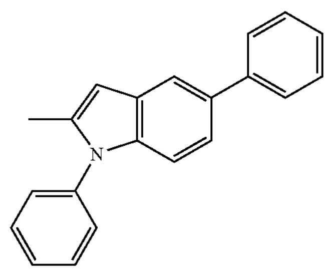
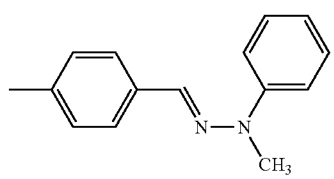
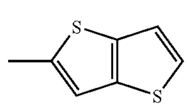
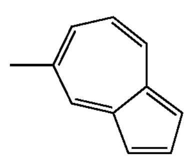
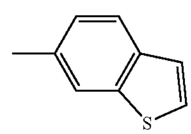
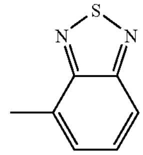
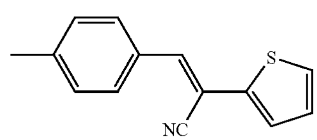
Next, specific examples of the sensitizing dye of the present invention are shown below, but the compound represented by Formula (1) which is usable in the present invention is not limited thereto.

A-1
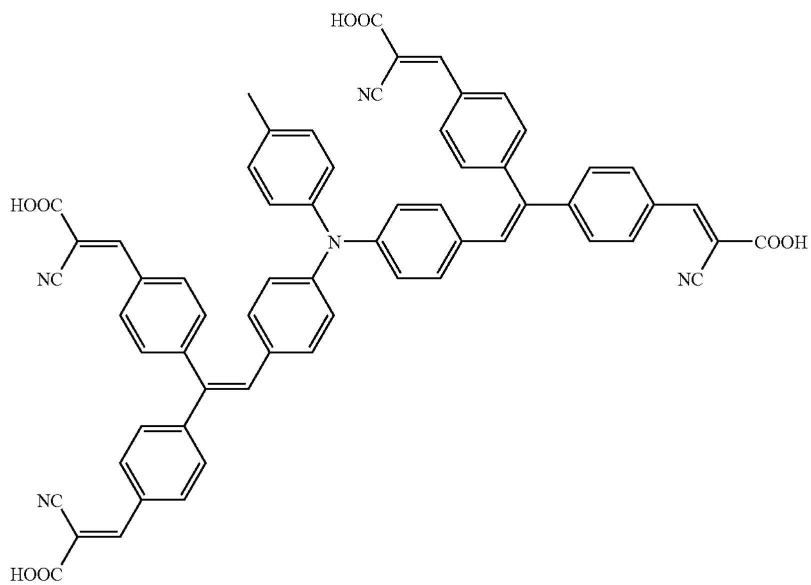
A-2
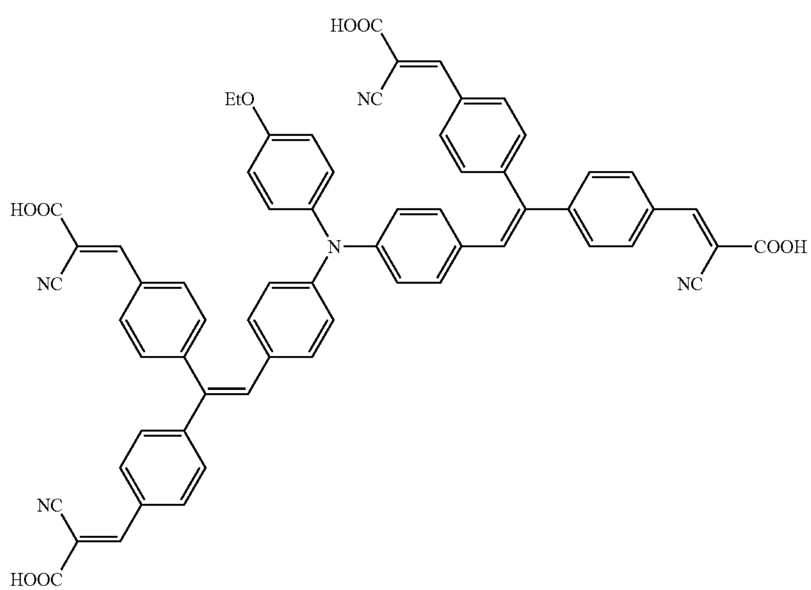

-continued
A-3
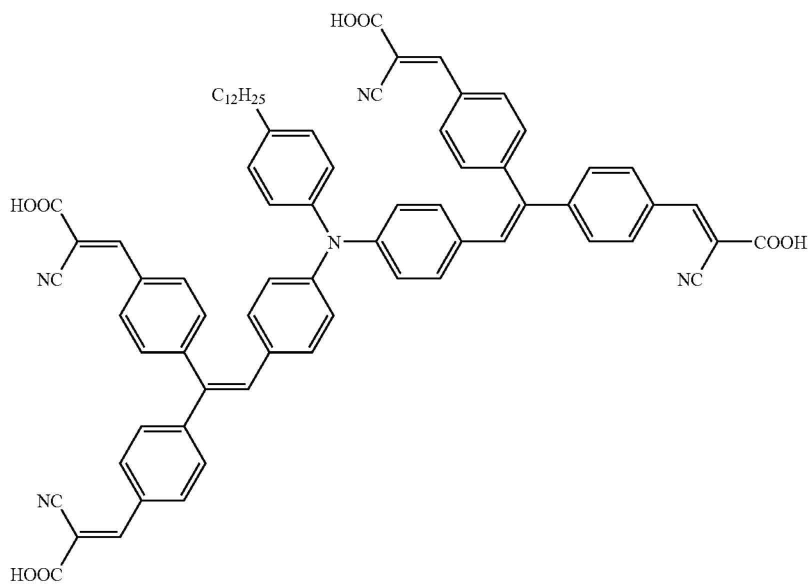
A-4
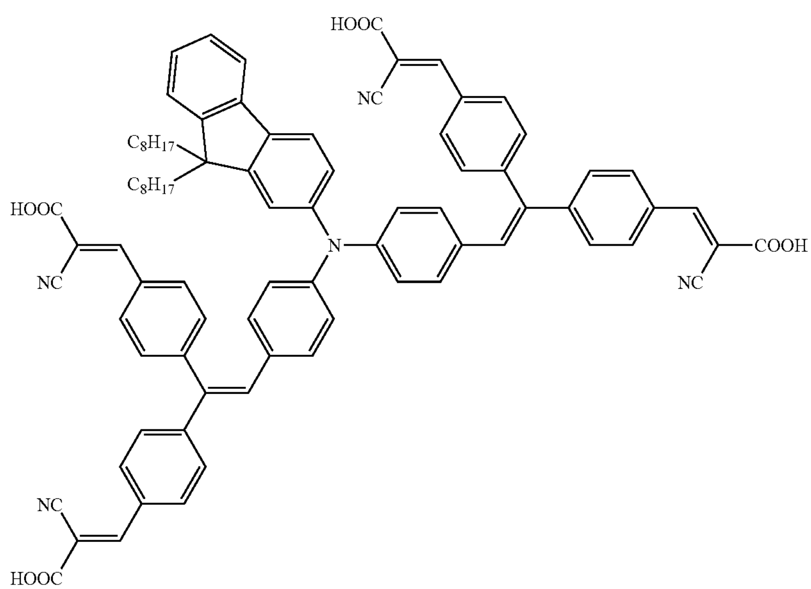

-continued
A-5
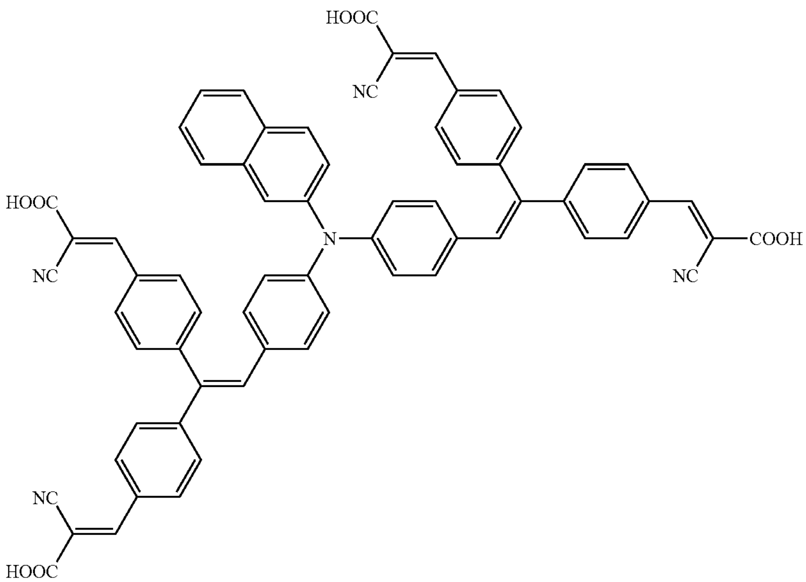
A-6
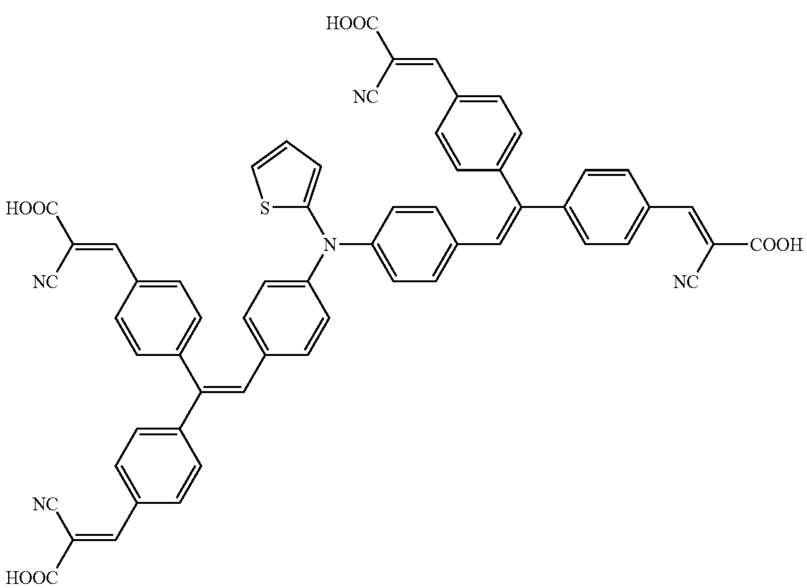

-continued
A-7
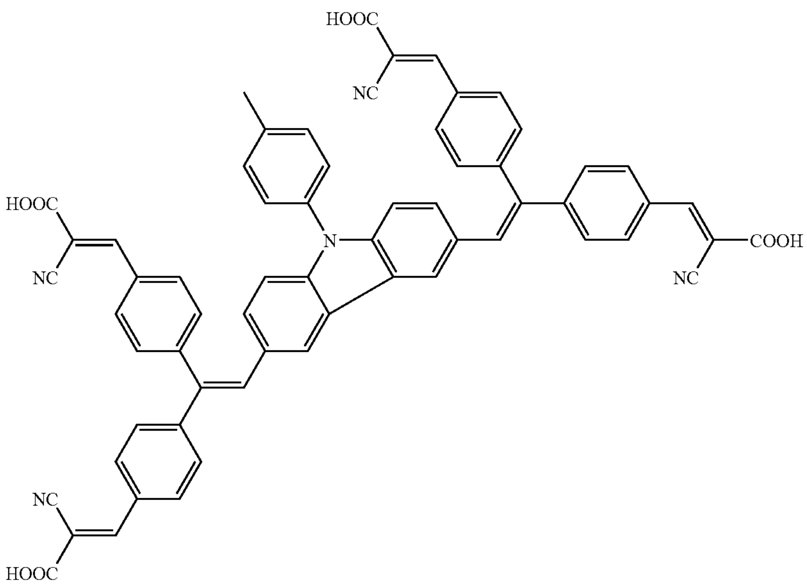
A-8
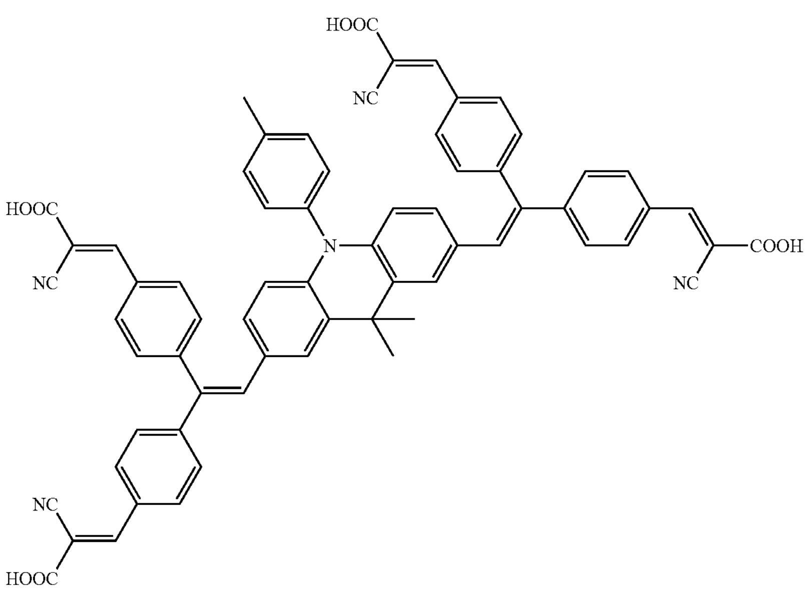

-continued
A-9
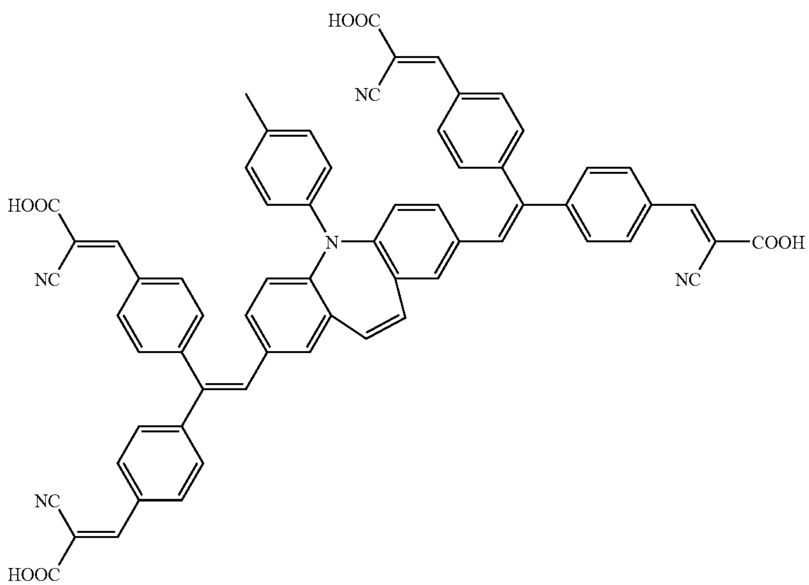
A-10
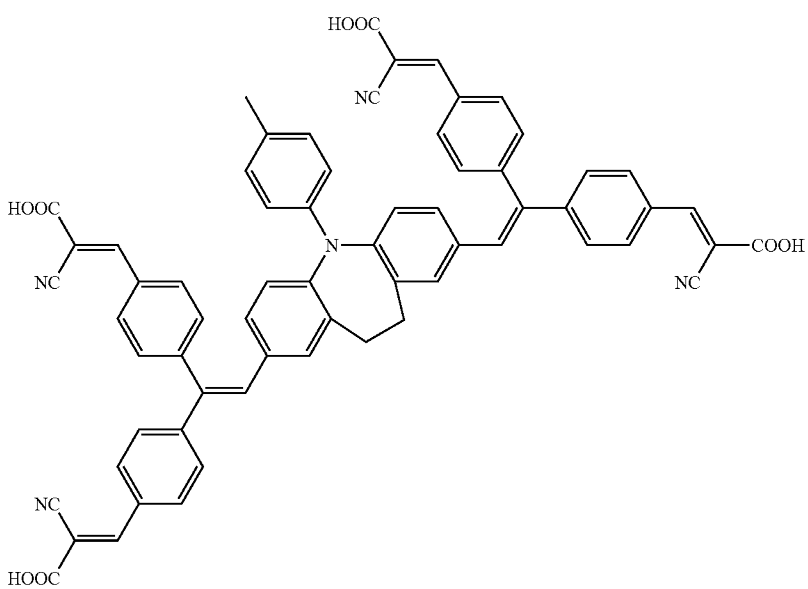

-continued
A-11
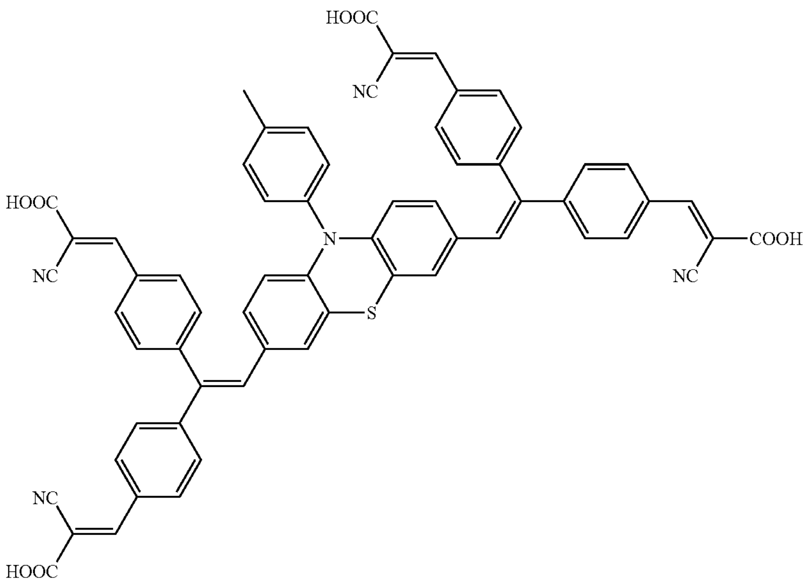
A-12
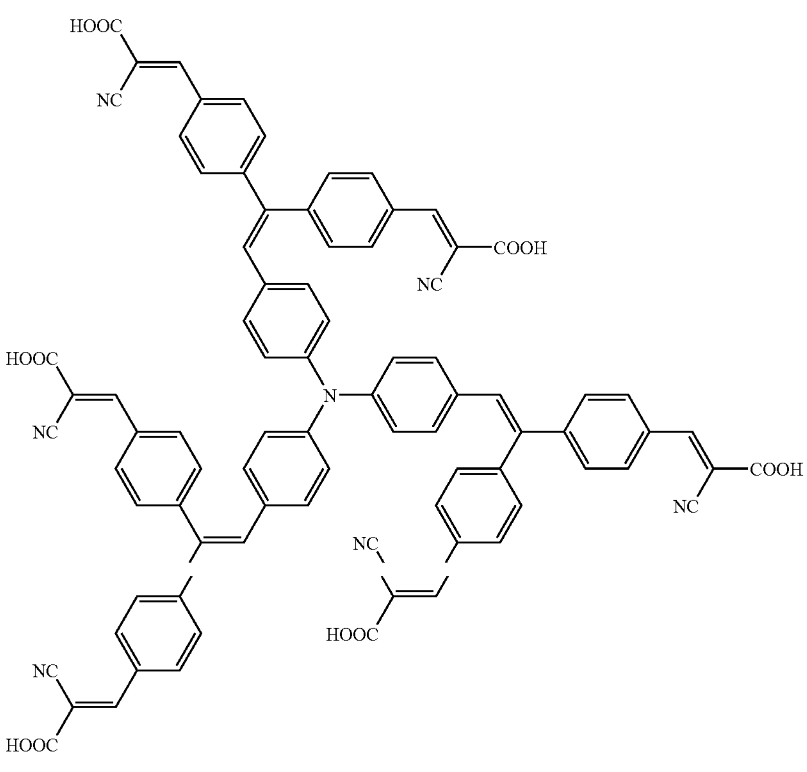

-continued
A-13
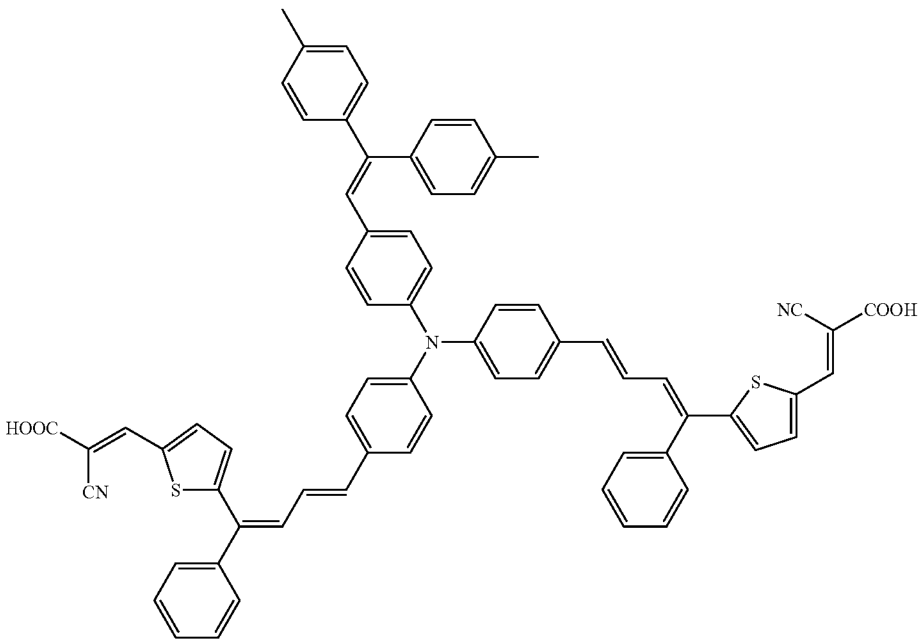
A-14
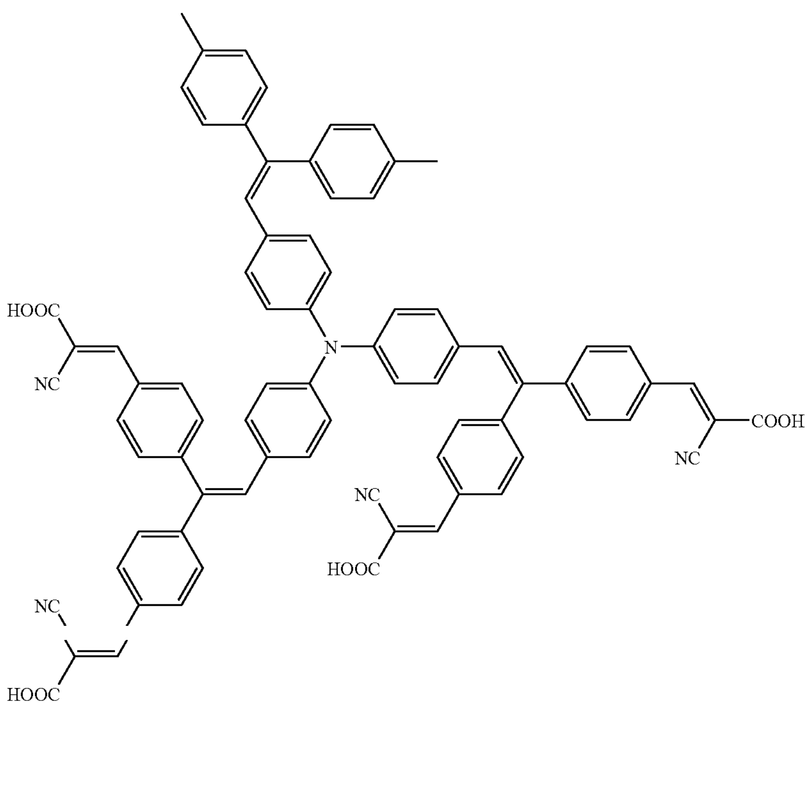

-continued
A-15
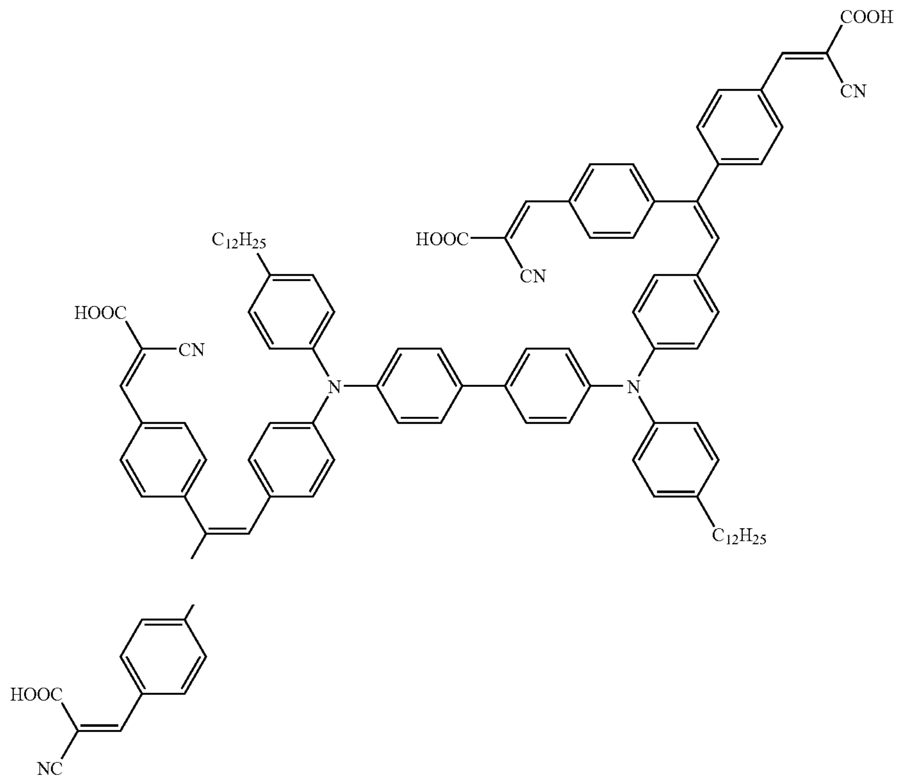
A-16
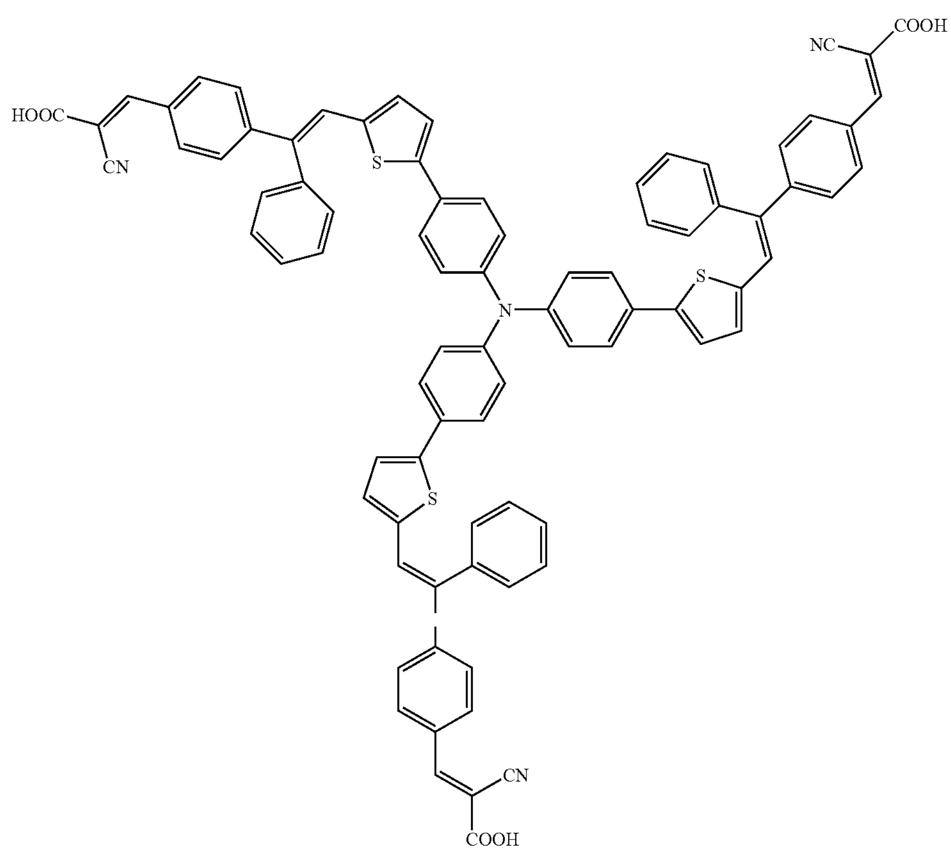

-continued
A-17
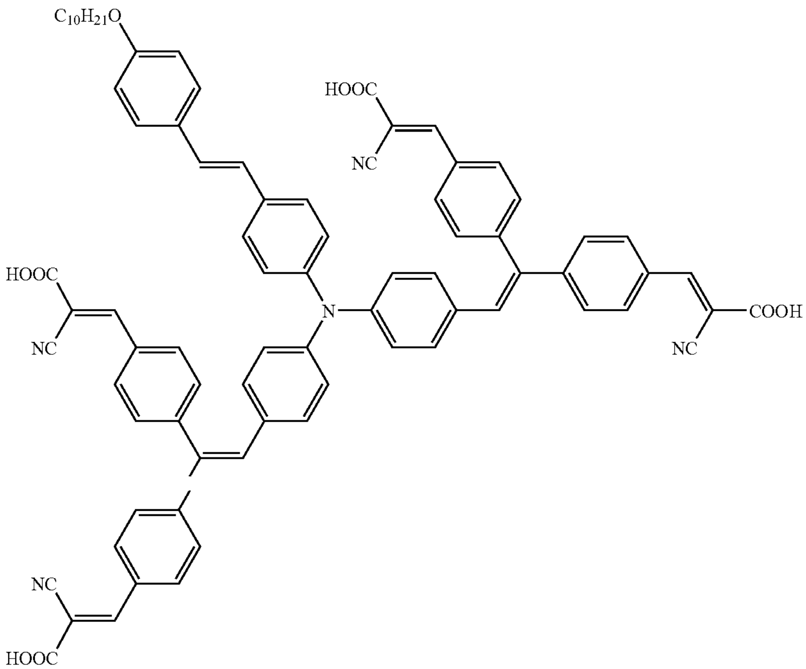
A-18
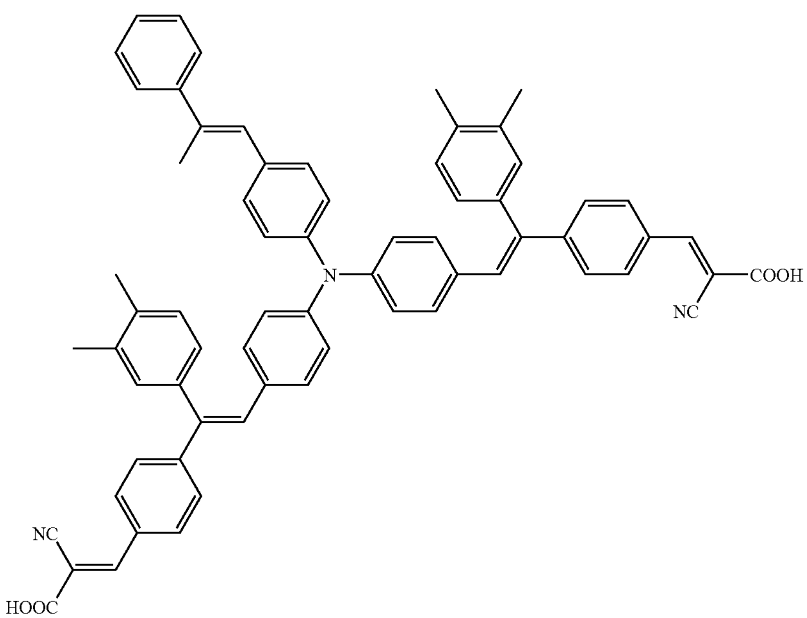

-continued
A-19
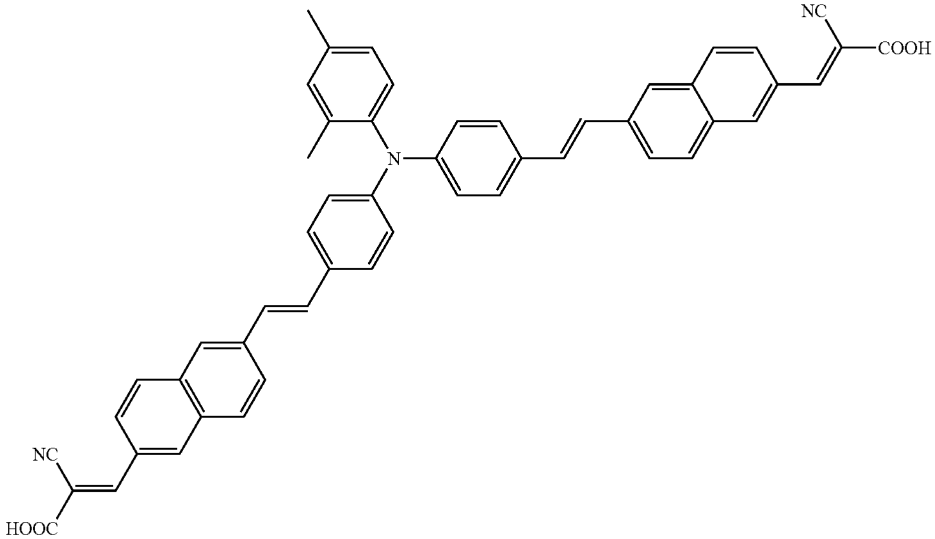
A-20
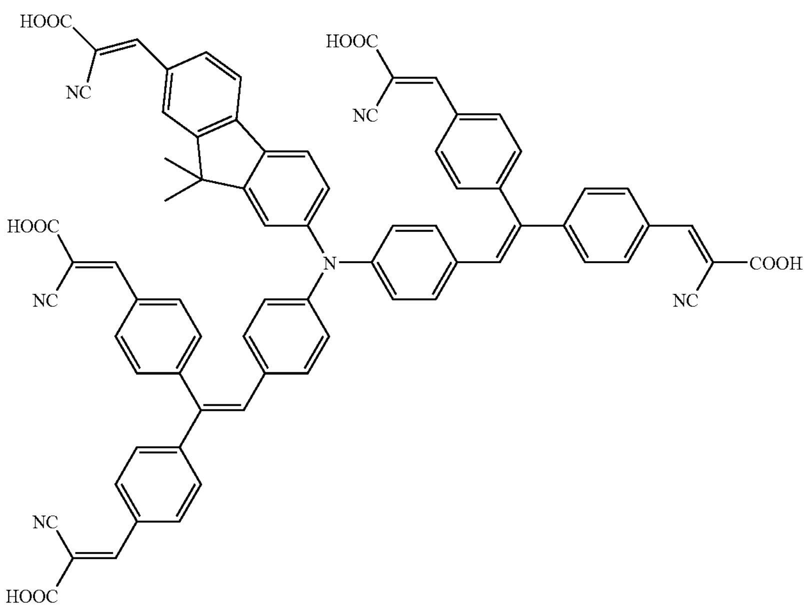
A-21
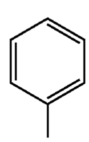

-continued
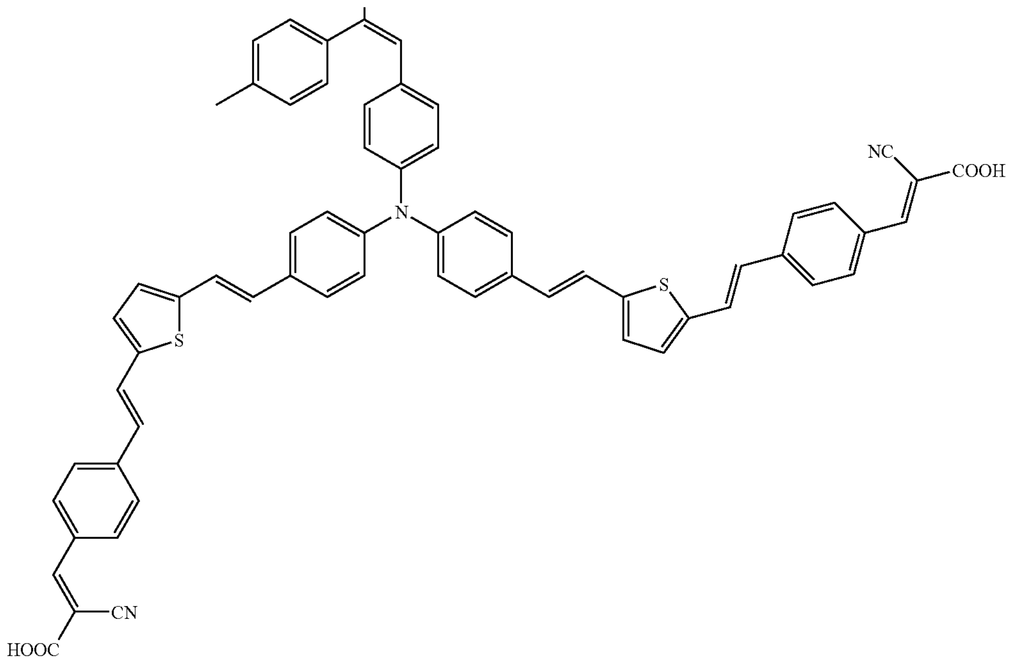
A-22
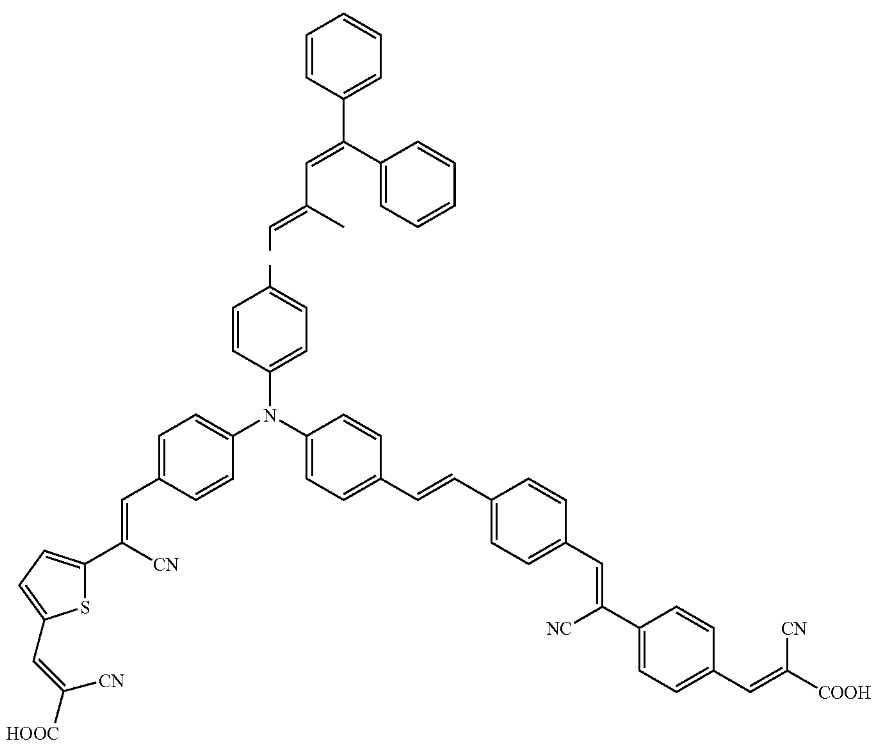

-continued
A-23
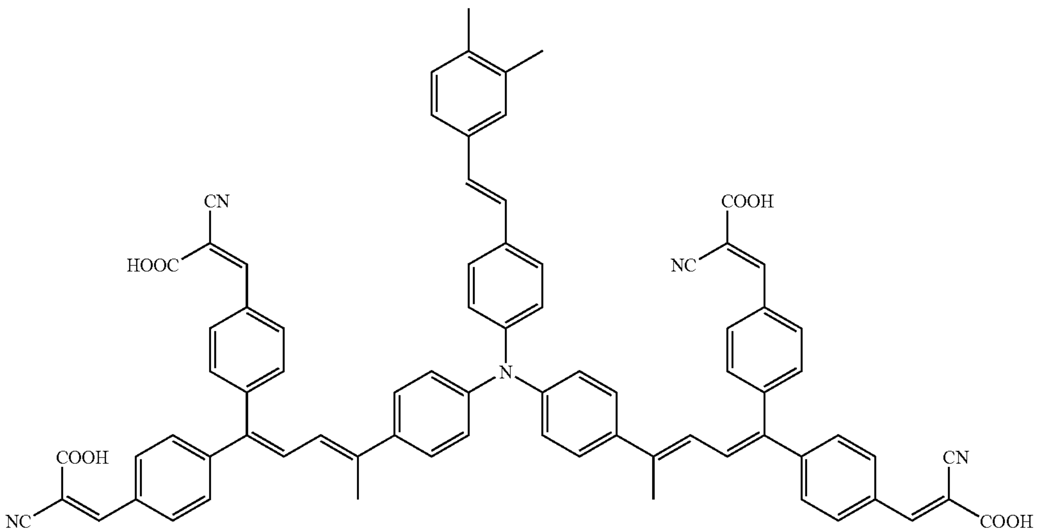
A-24
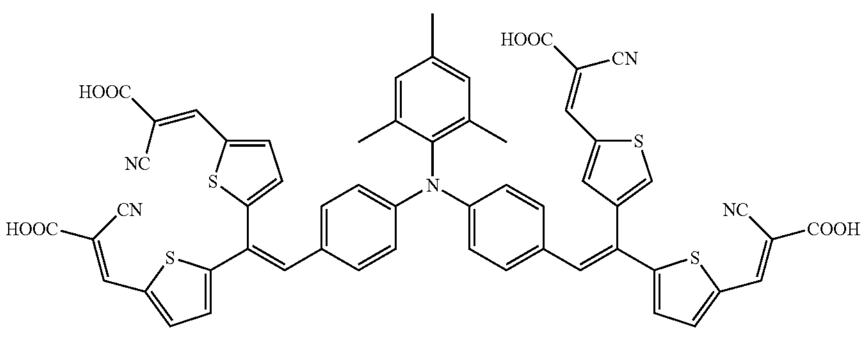
A-25
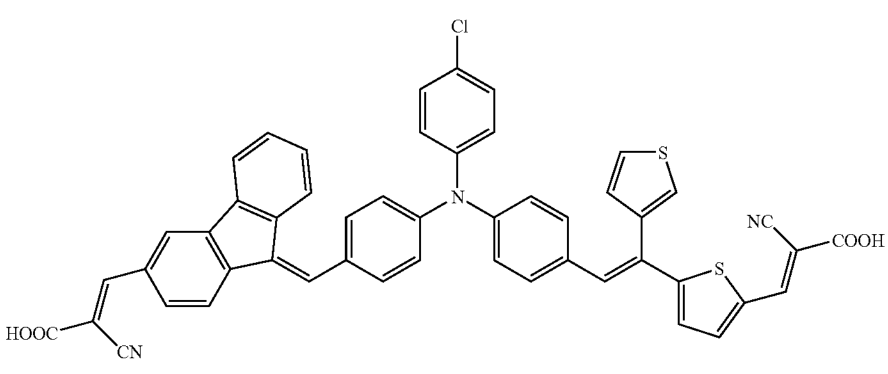

-continued
A-26
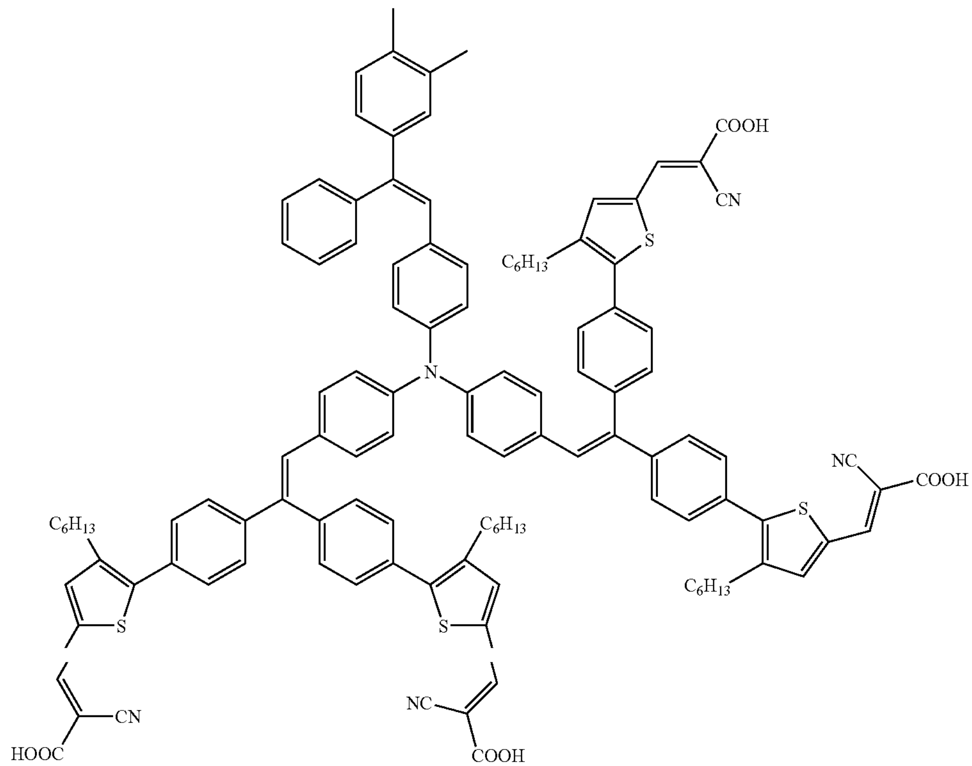
A-27
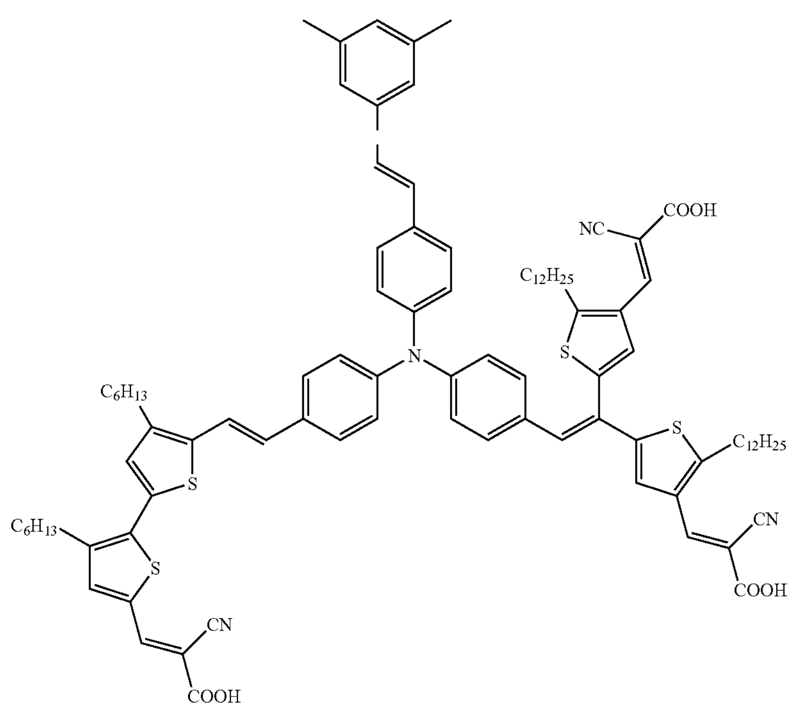

-continued
A-28
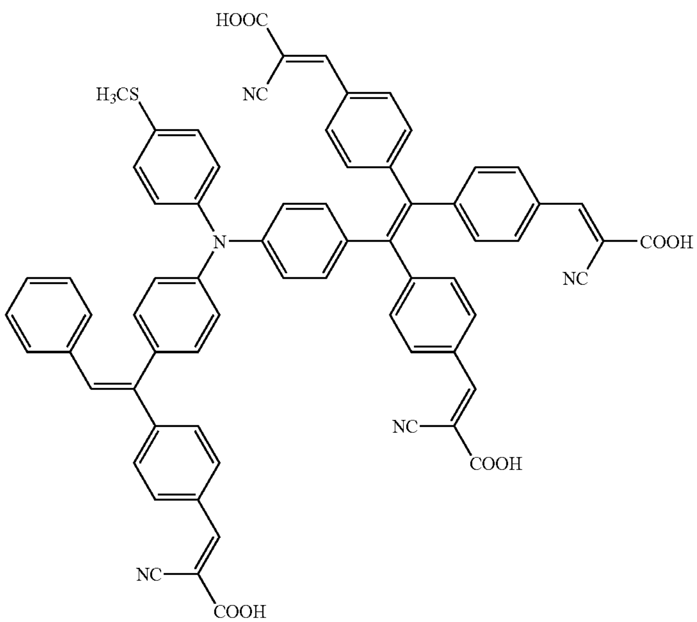
A-29
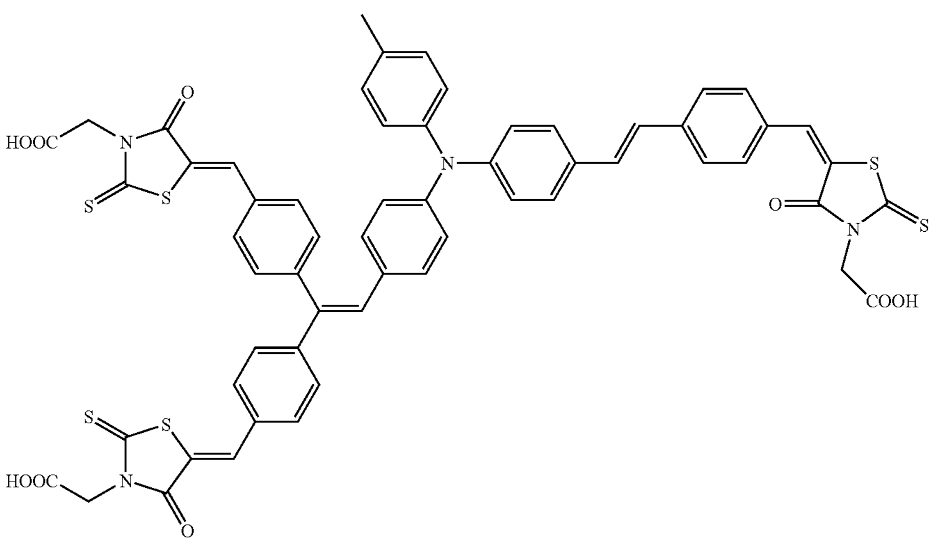
A-30
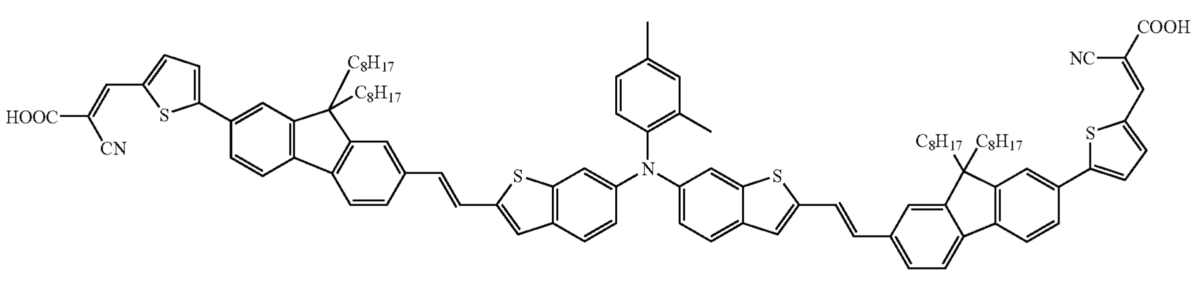

-continued
A-31
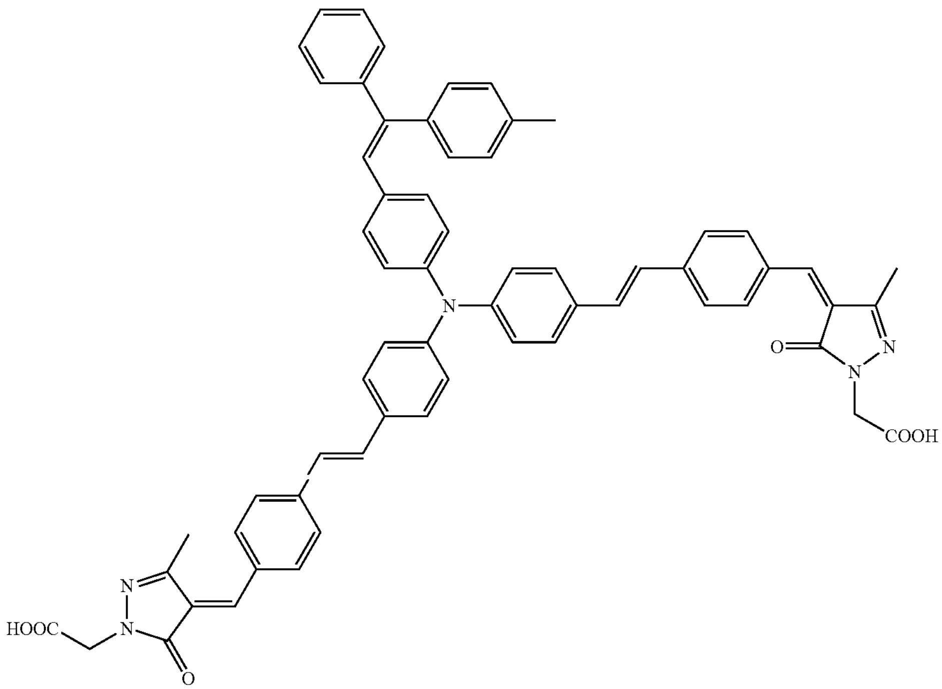
A-32
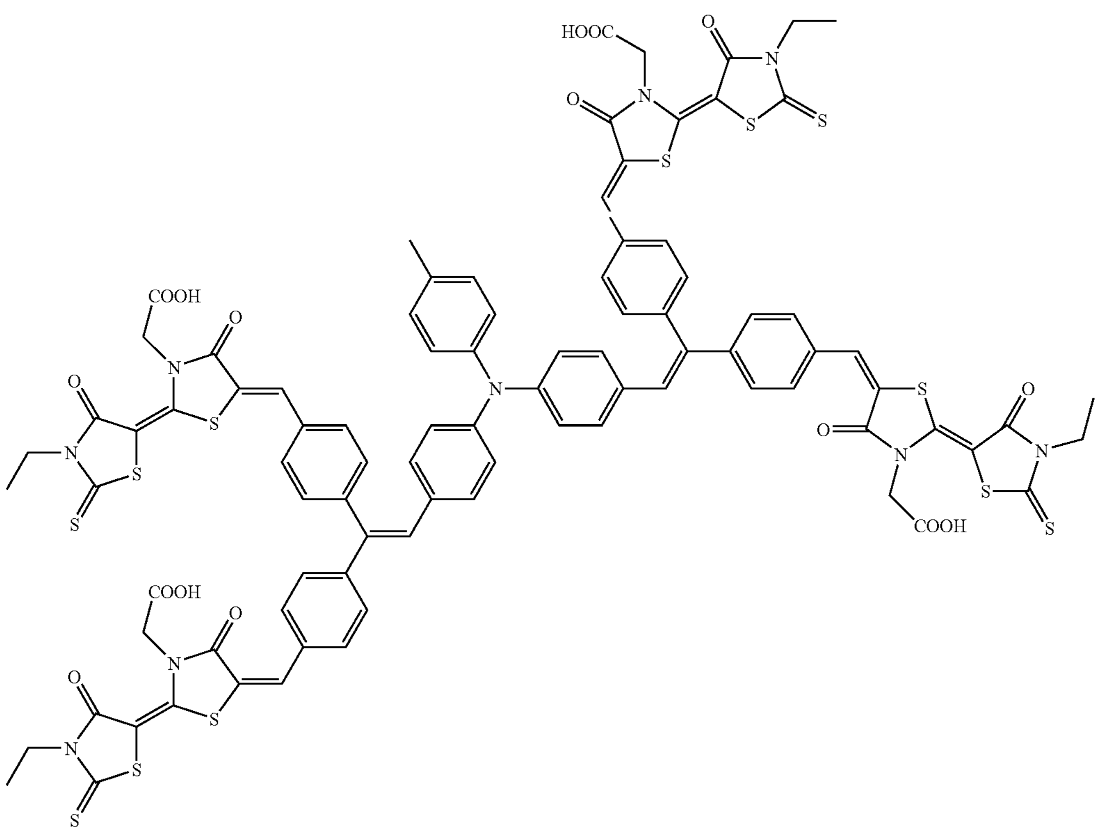

-continued
A-33
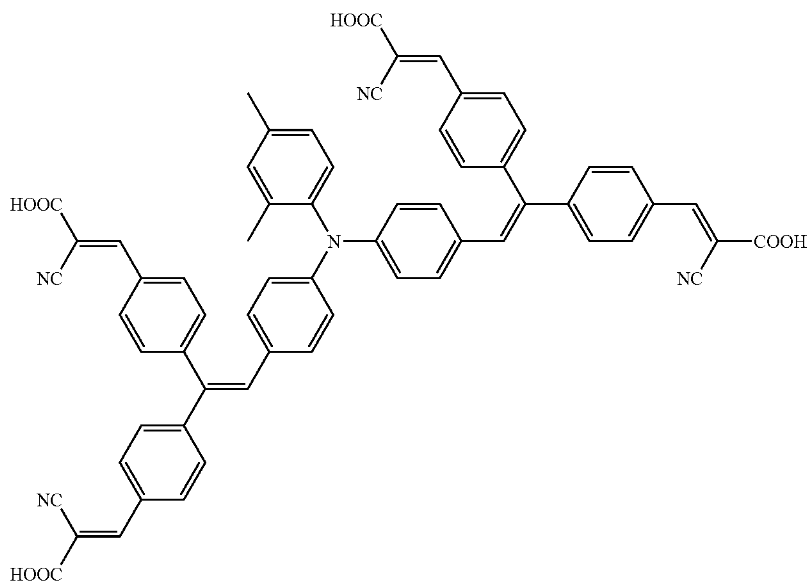
A-34
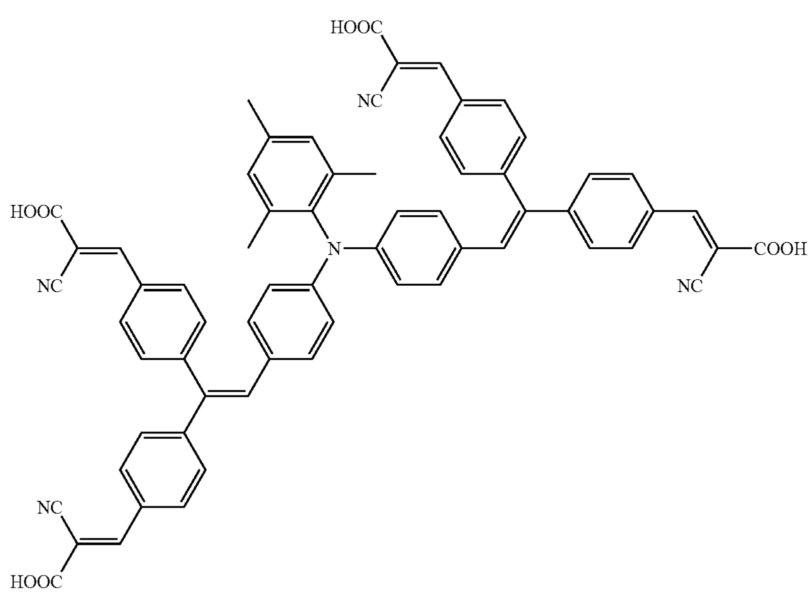

-continued
A-35
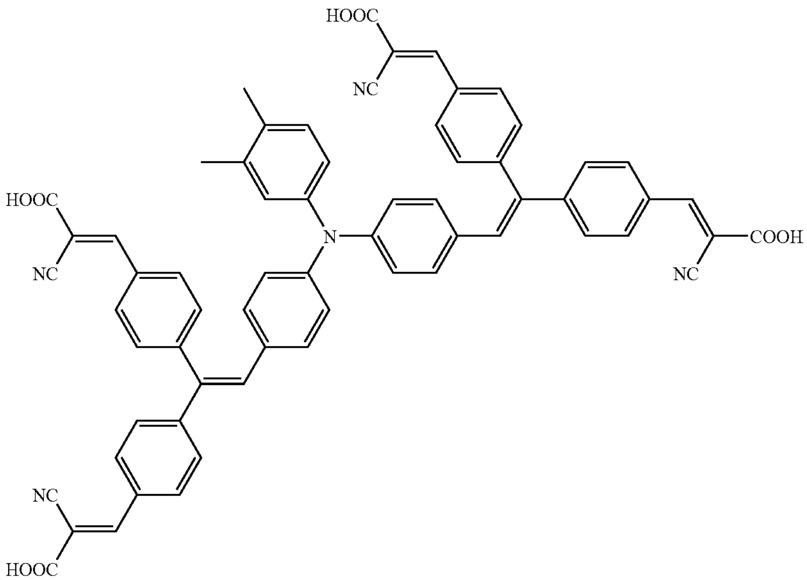
A-36
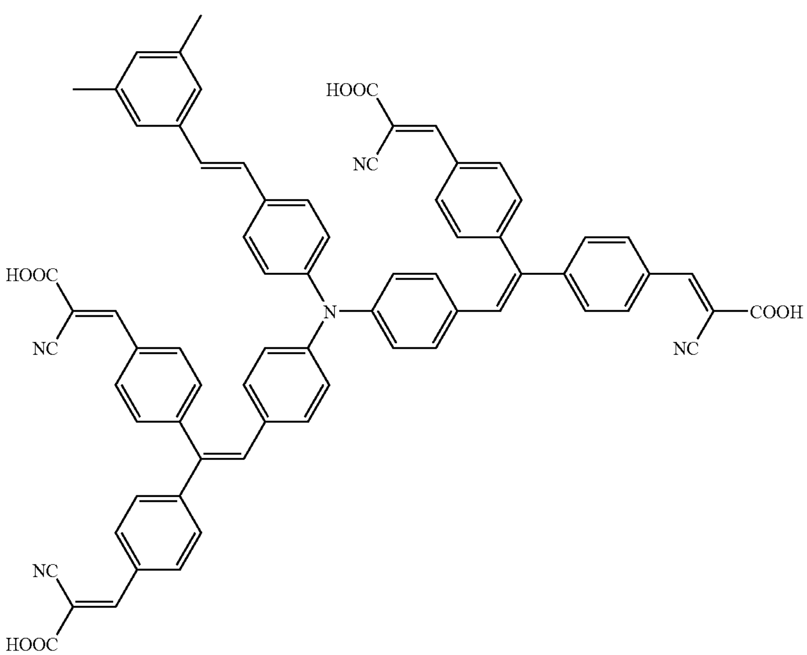

-continued
A-37
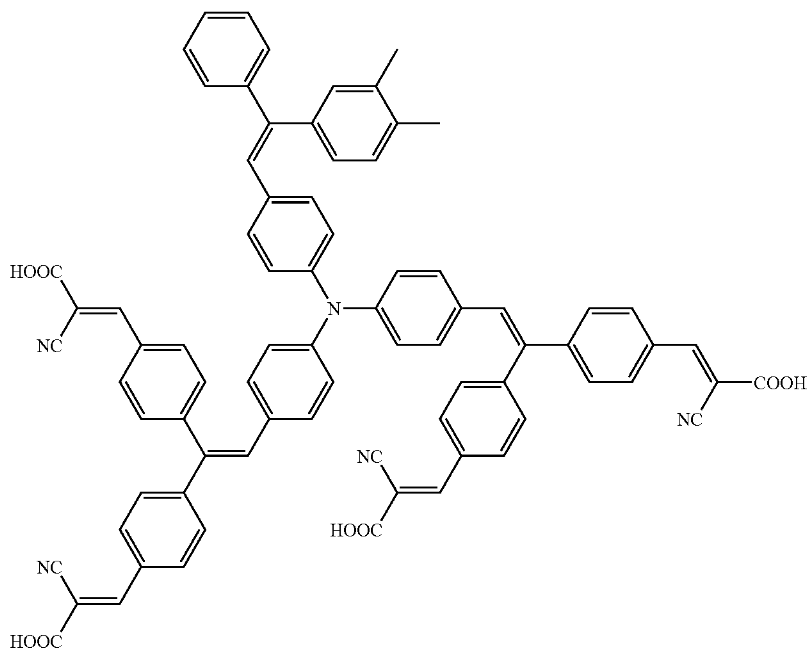
A-38
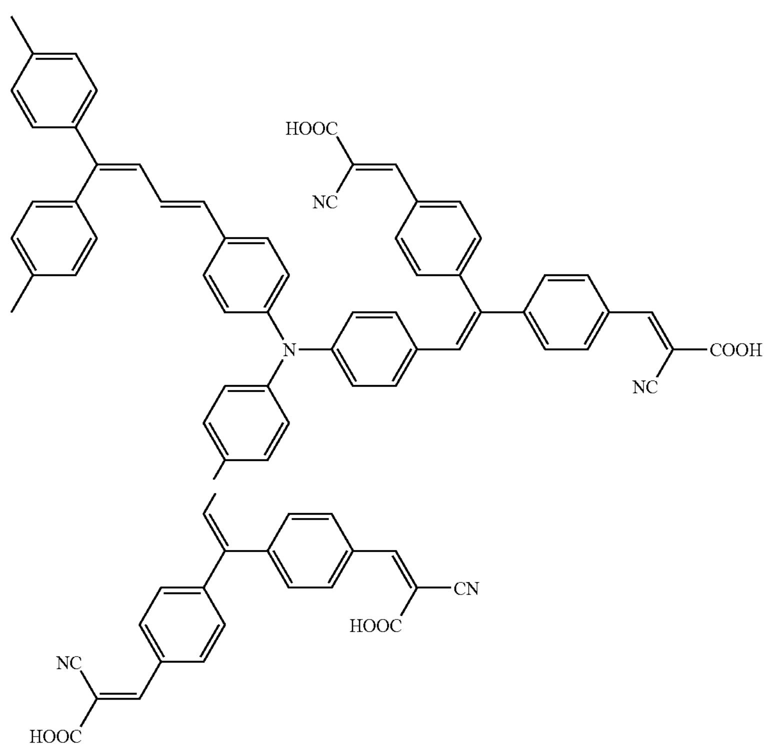

-continued
A-39
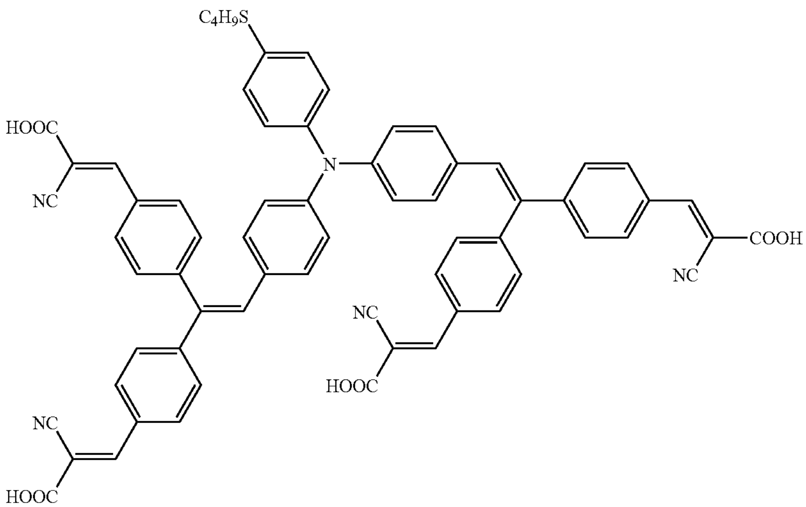
A-40
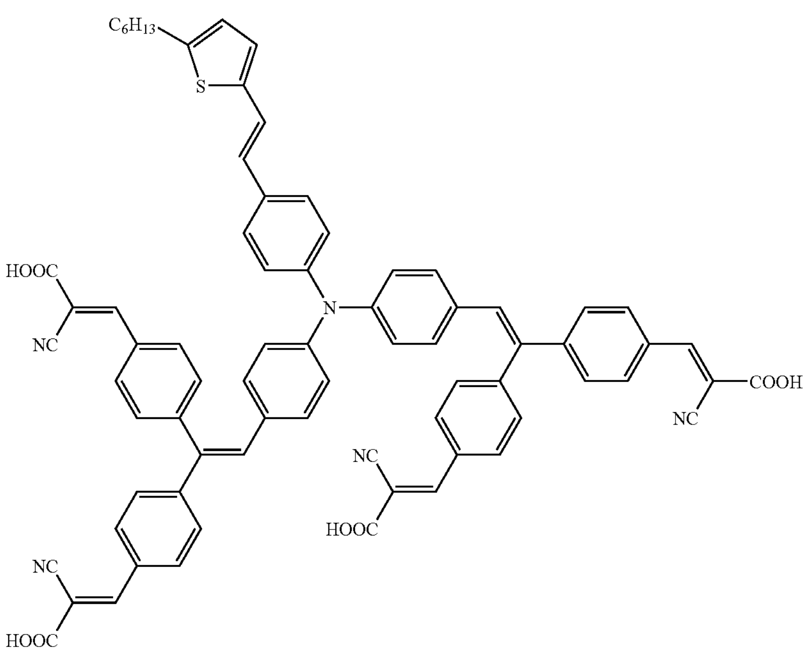

-continued
A-41
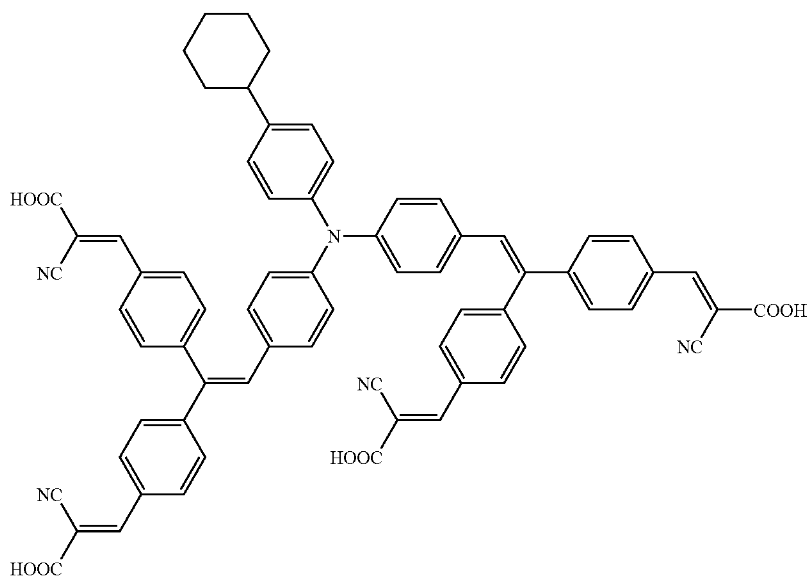
A-42
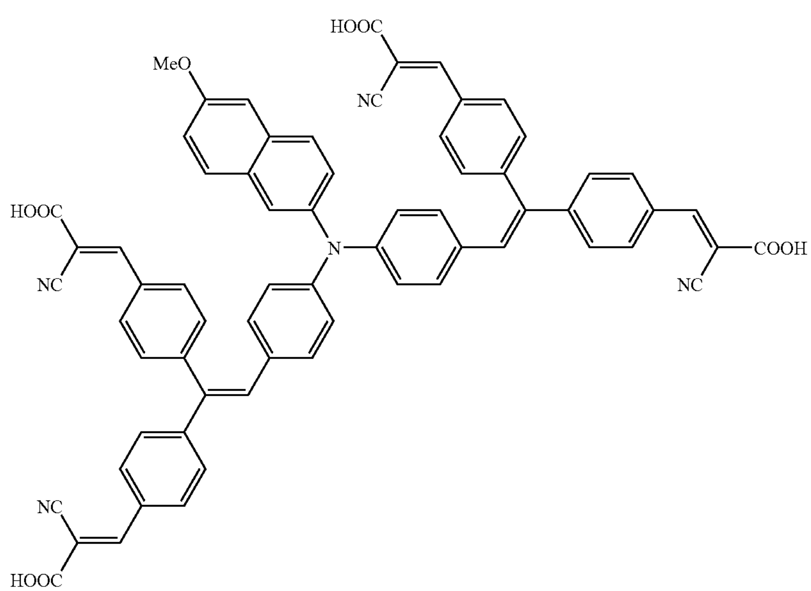

-continued
A-43
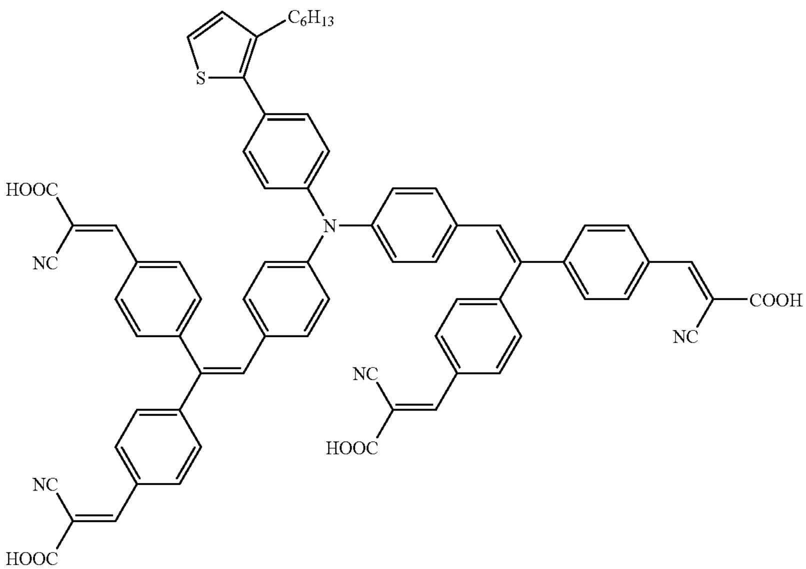
A-44
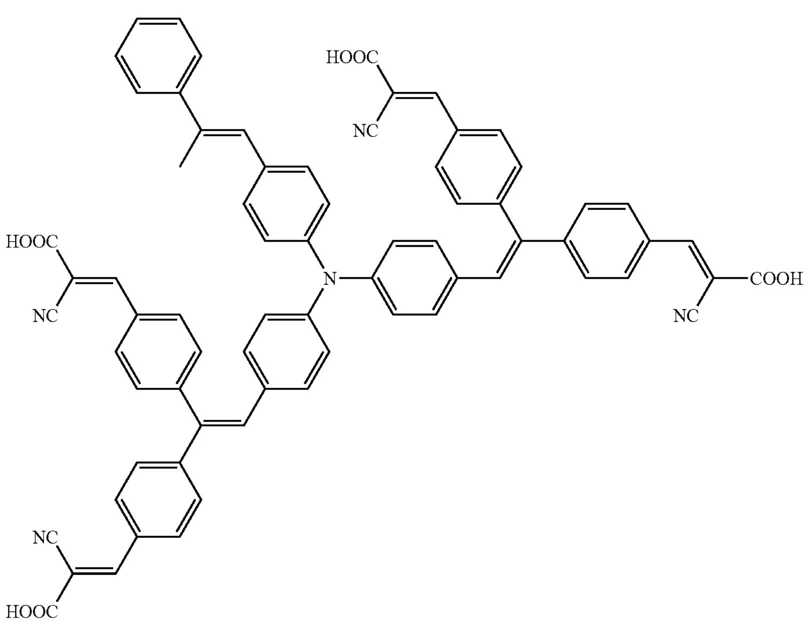

-continued
A-45
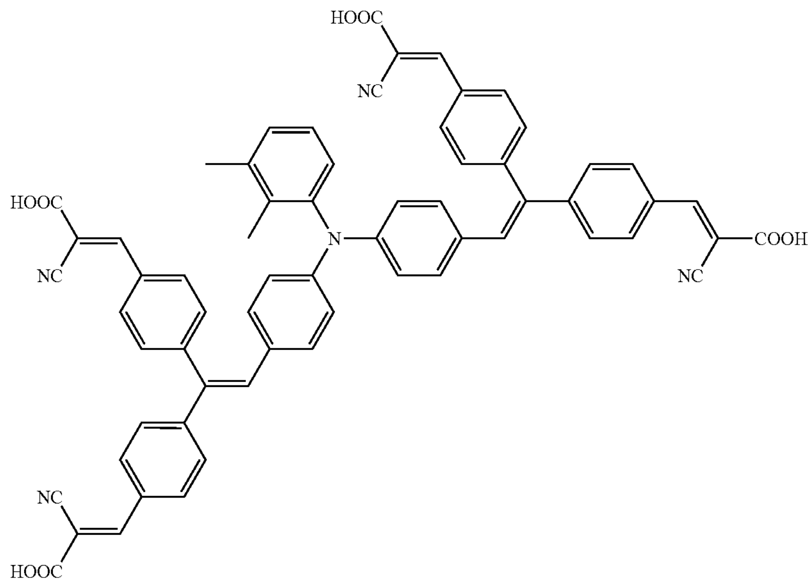
A-46
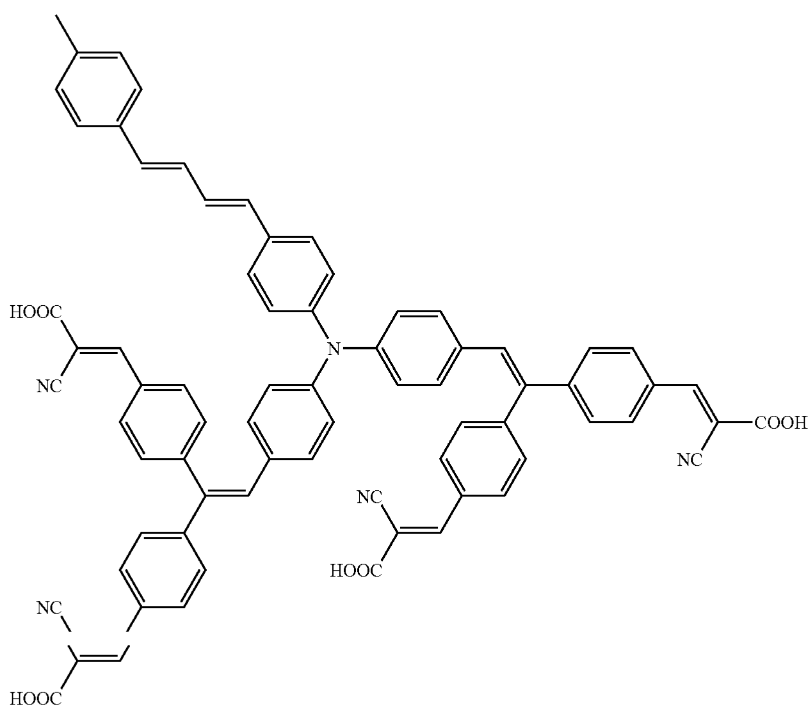

-continued
A-47
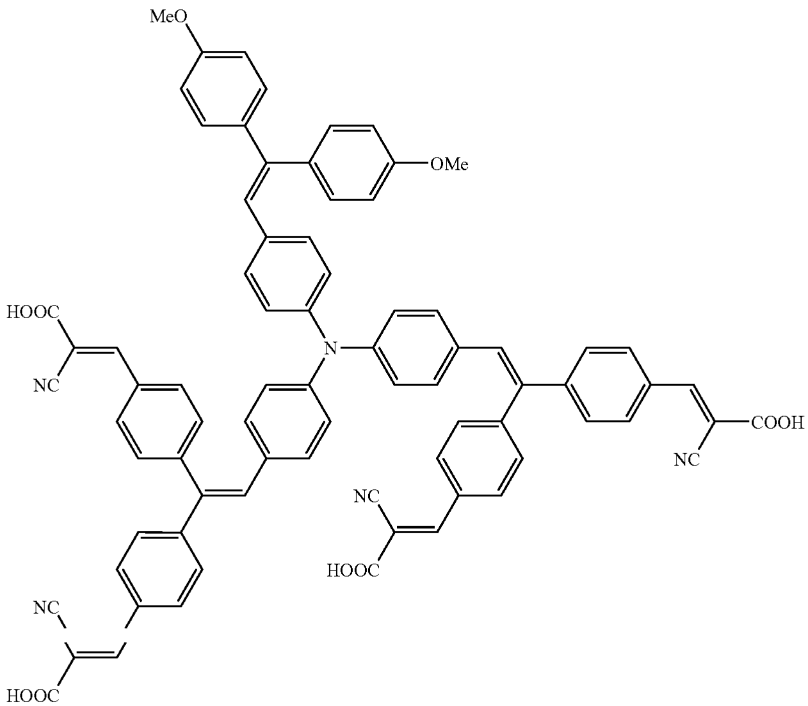
A-48
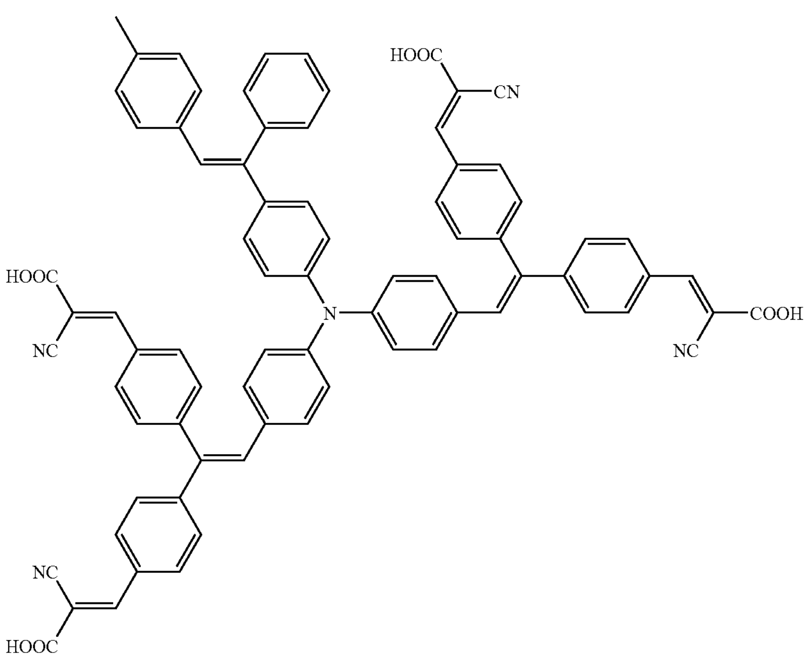

-continued
A-49
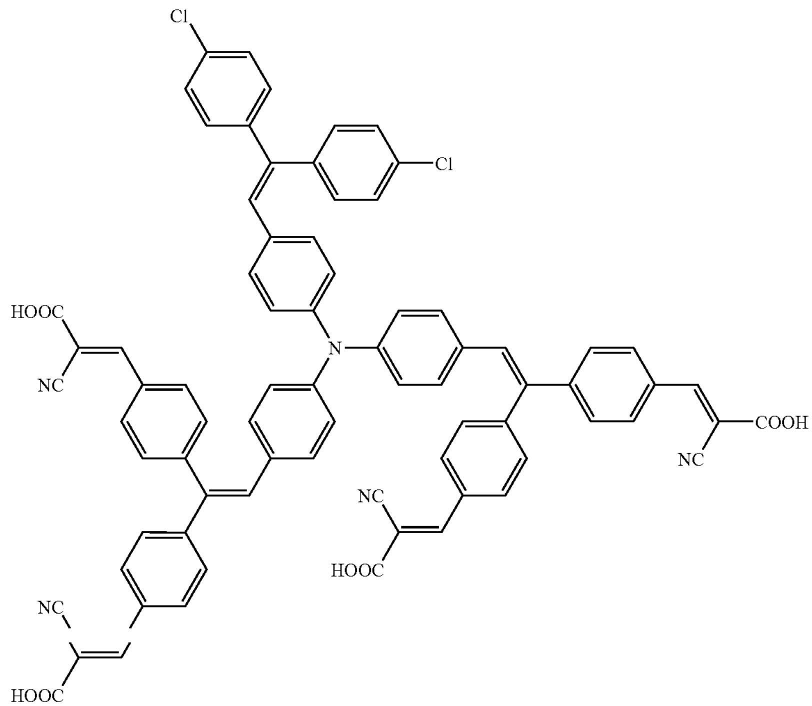
A-50
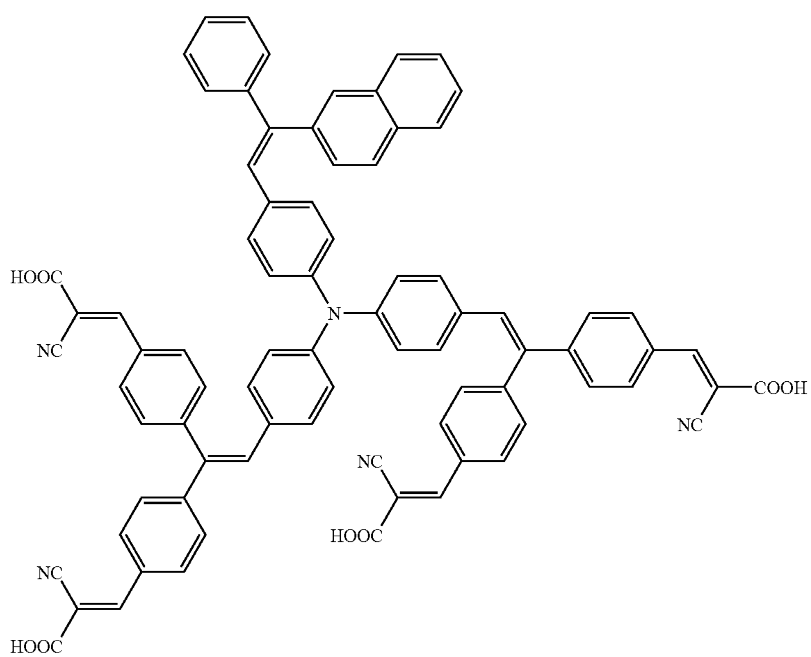

-continued
A-51
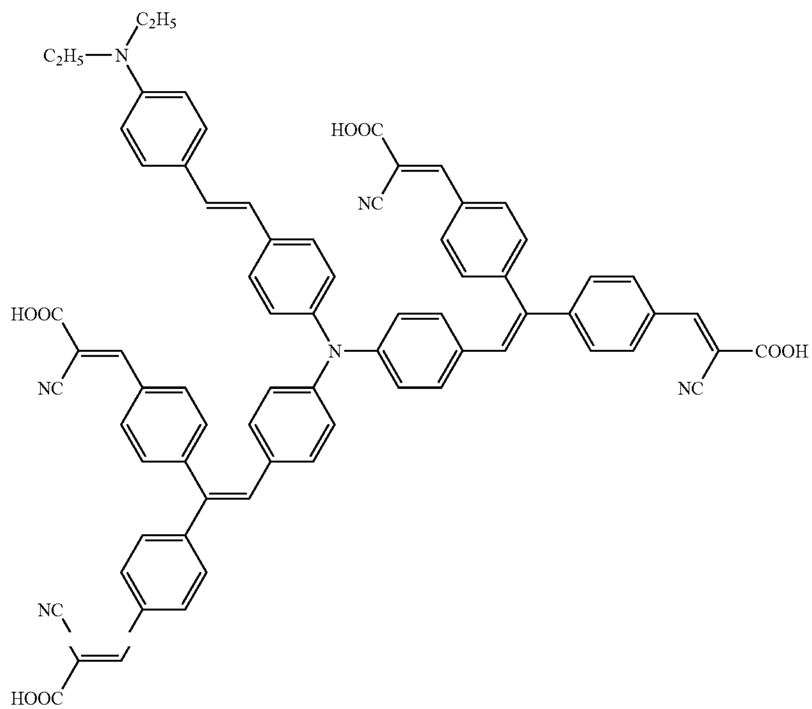
A-52
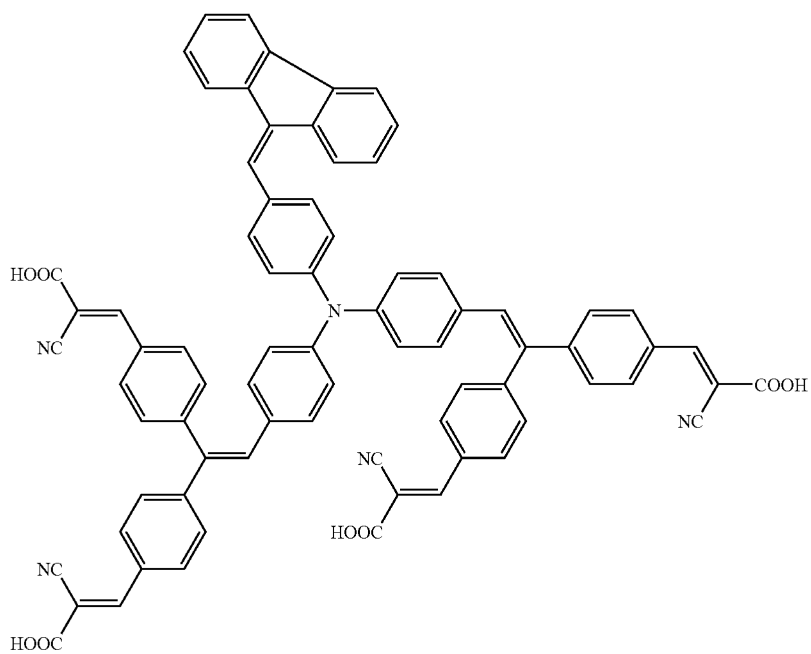
A-53
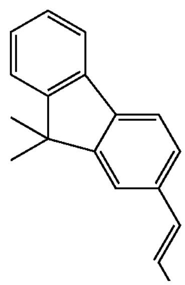

-continued
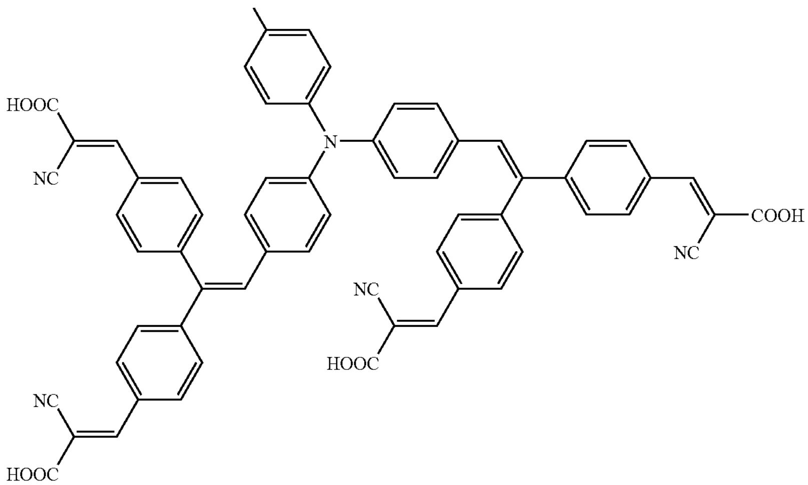
A-54
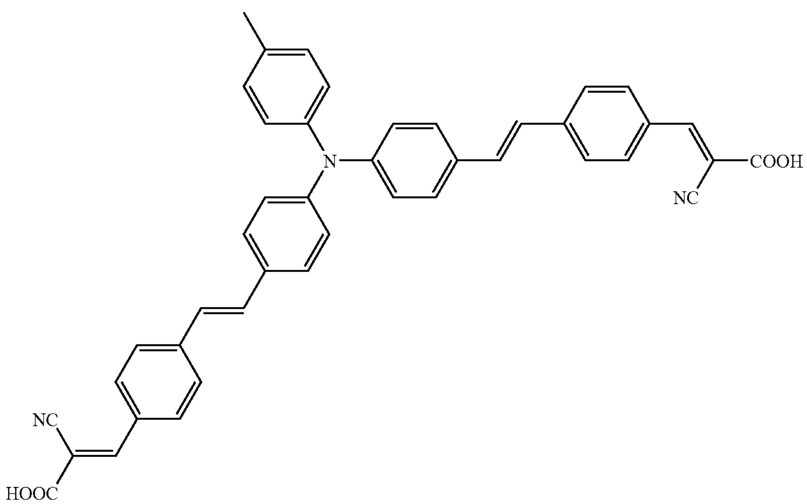
A-55
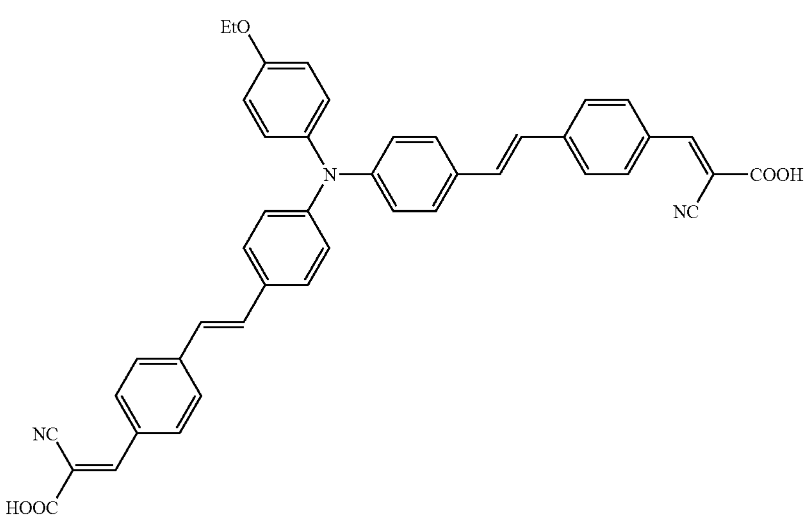

-continued
A-56
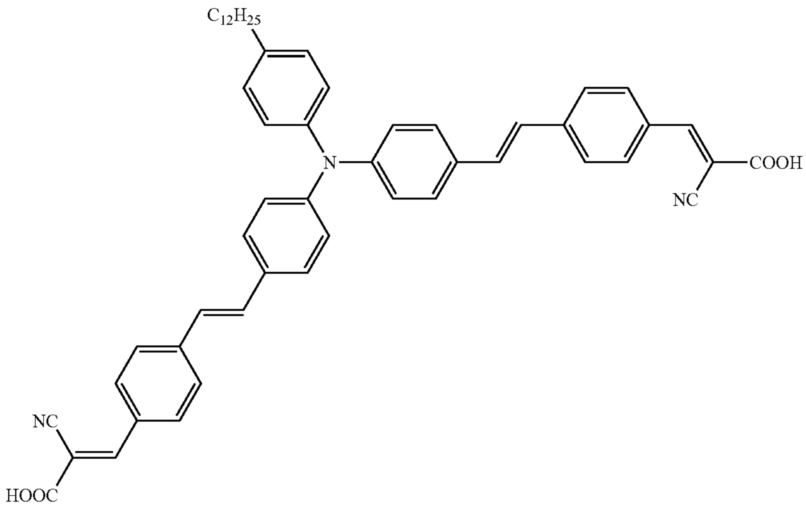
A-57
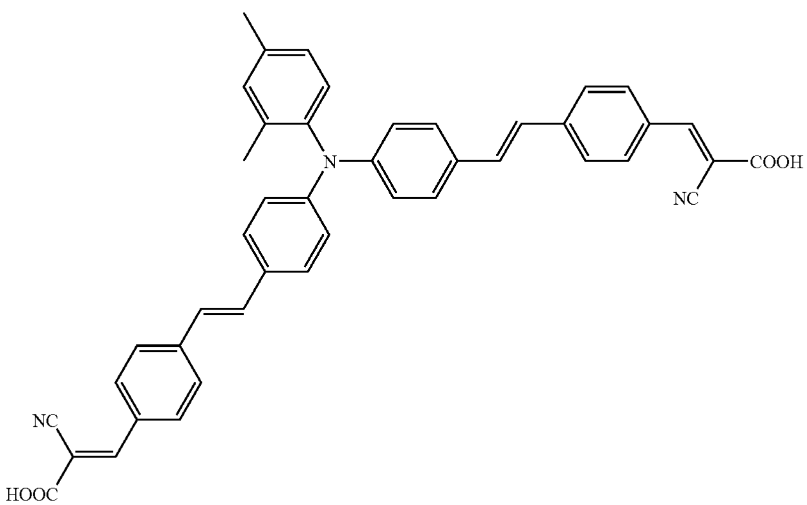
A-58
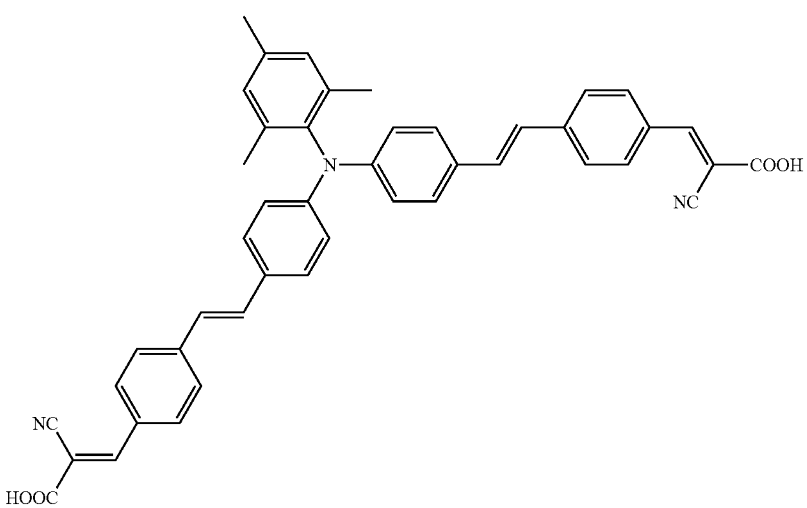

-continued
A-59
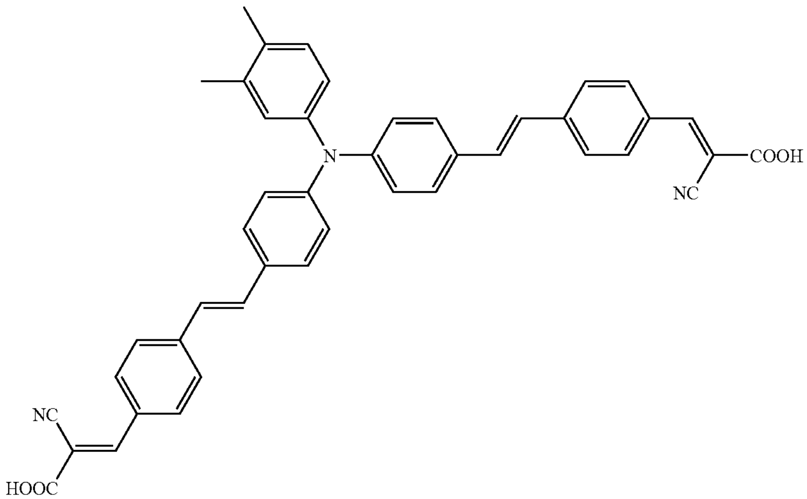
A-60
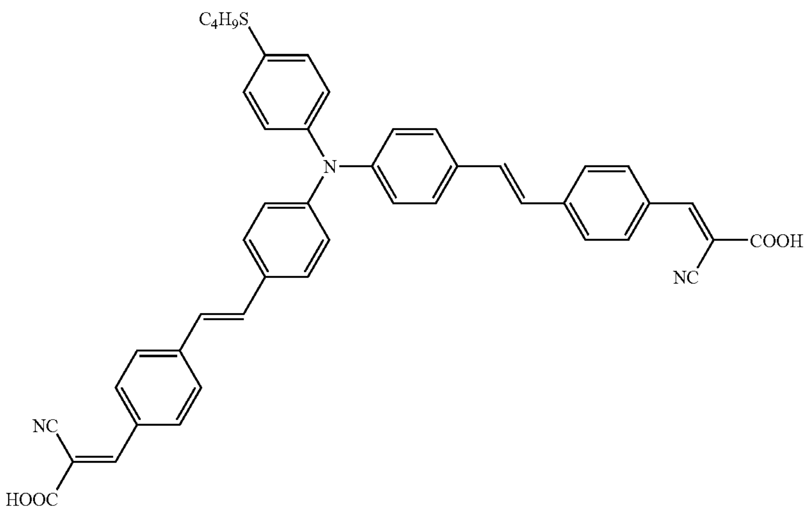
A-61
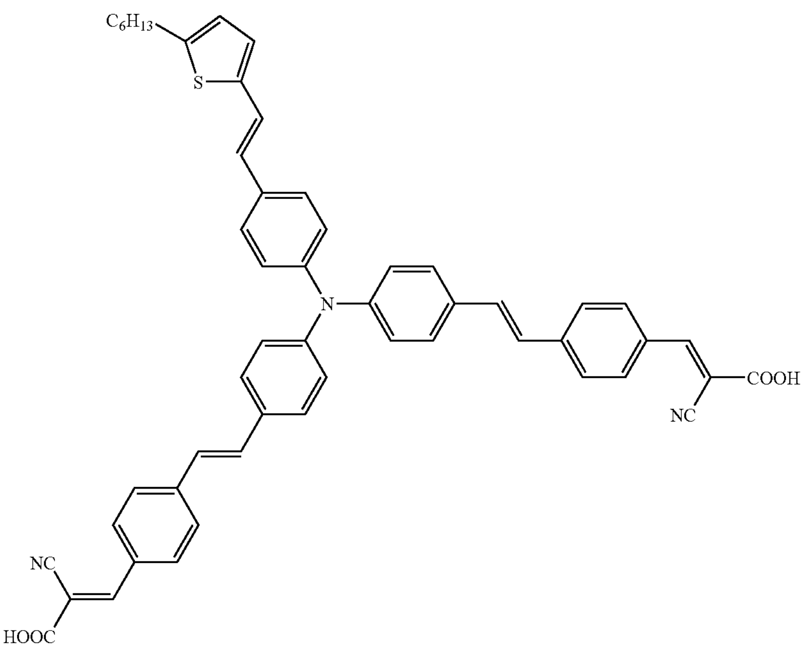

-continued
A-62
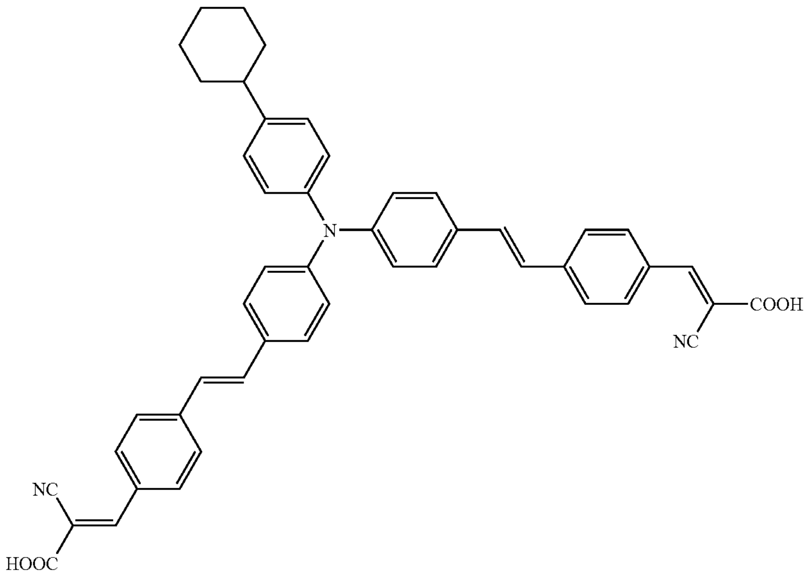
A-63
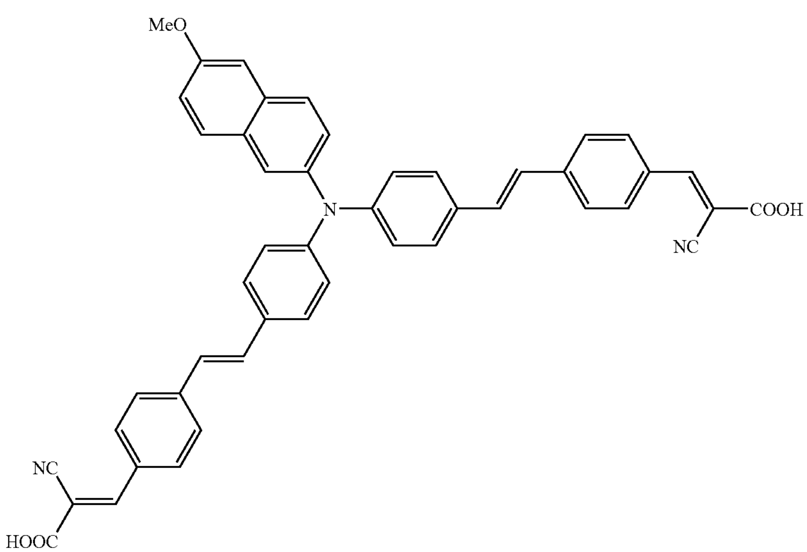

-continued
A-64
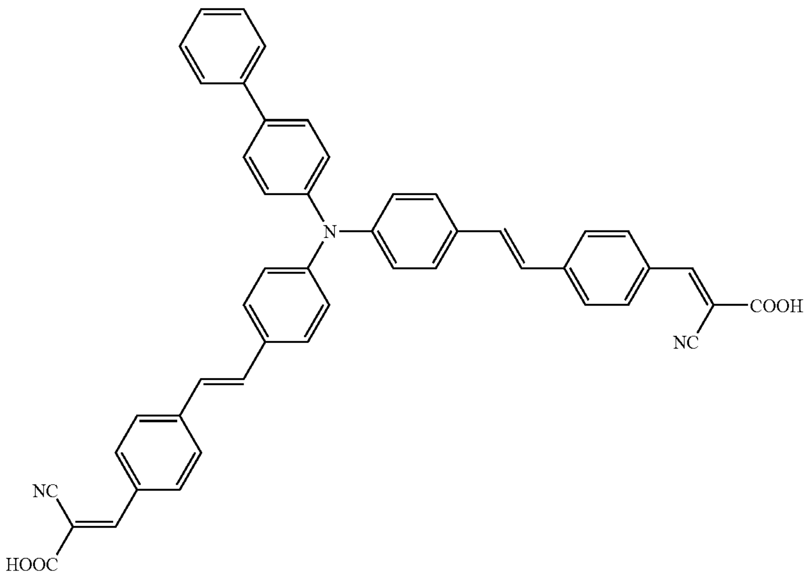
A-65
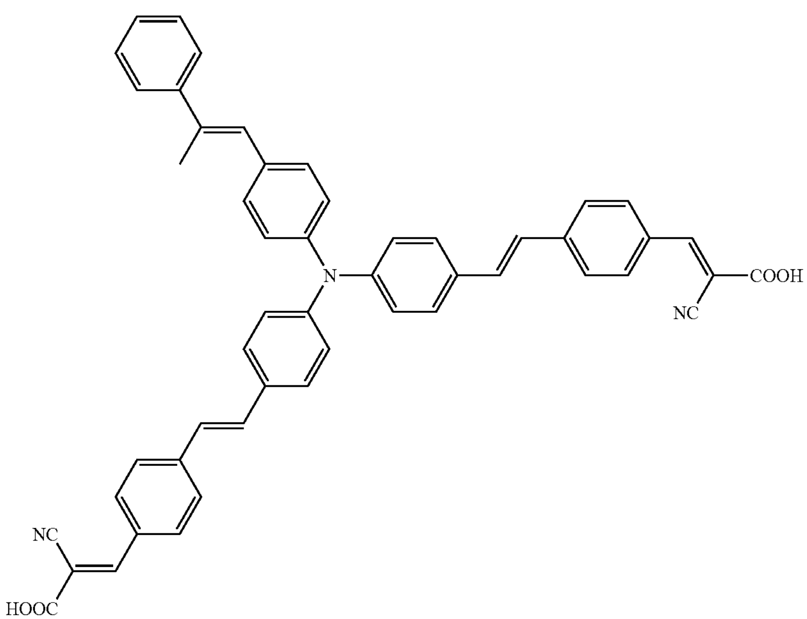

-continued
A-66
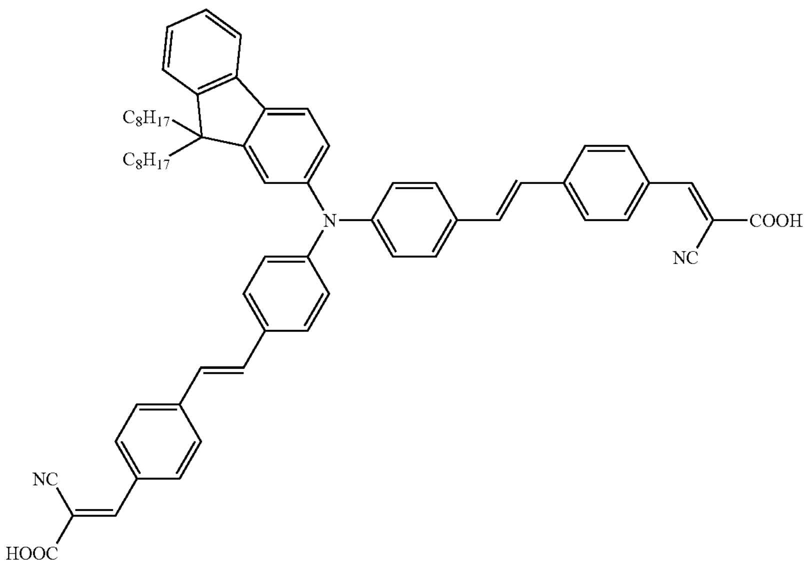
A-67
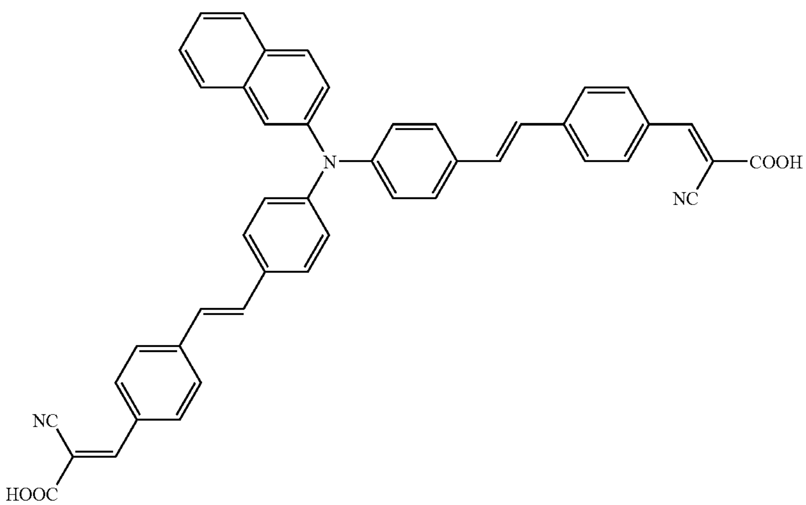
A-68
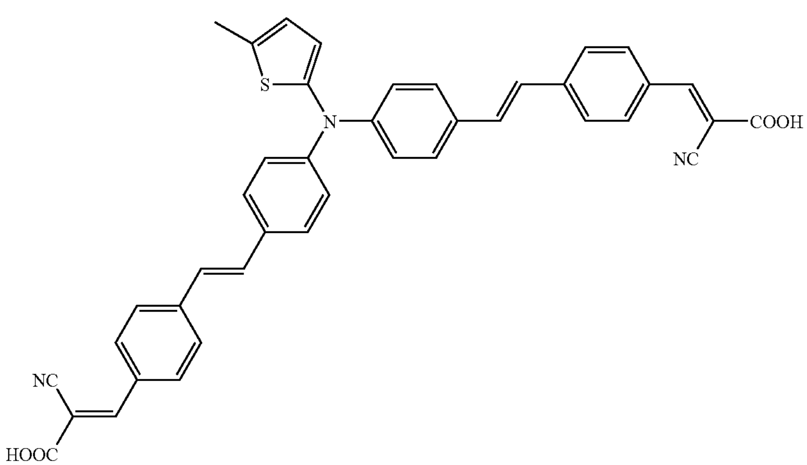

-continued
A-69
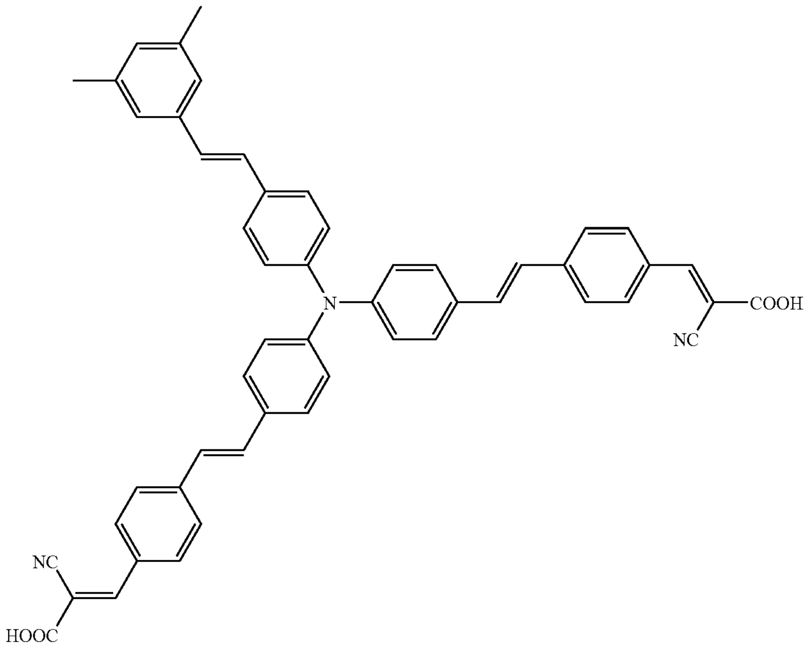
A-70
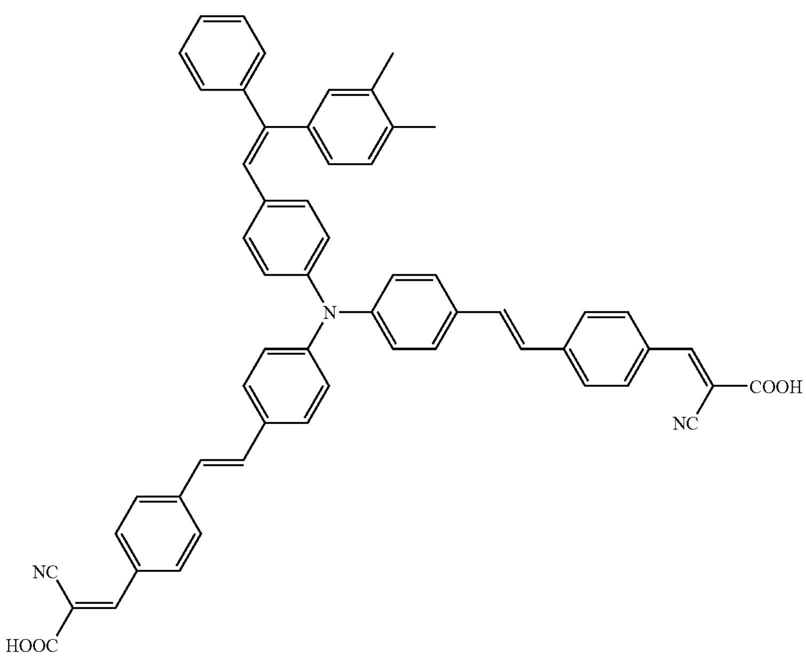

-continued
A-71
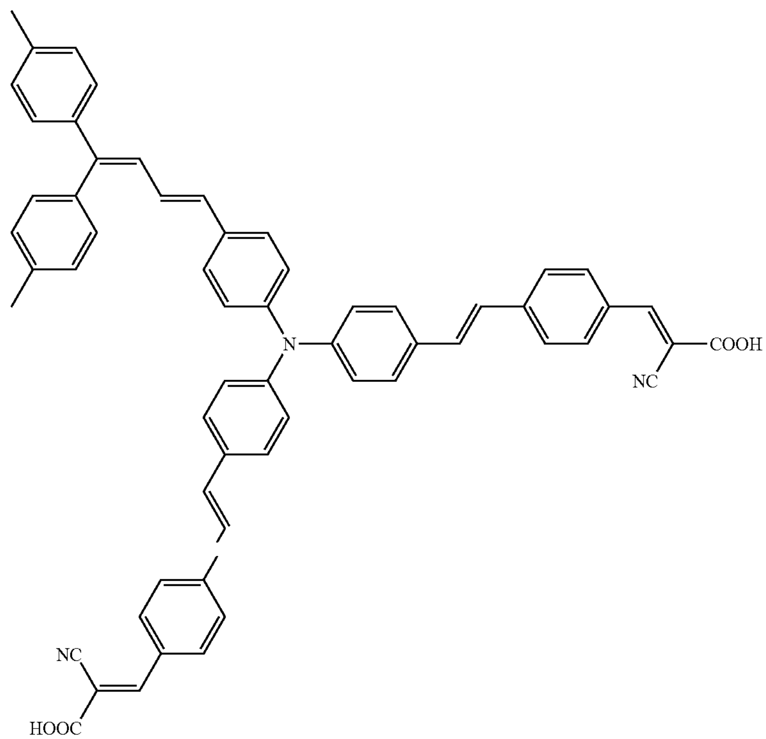
A-72
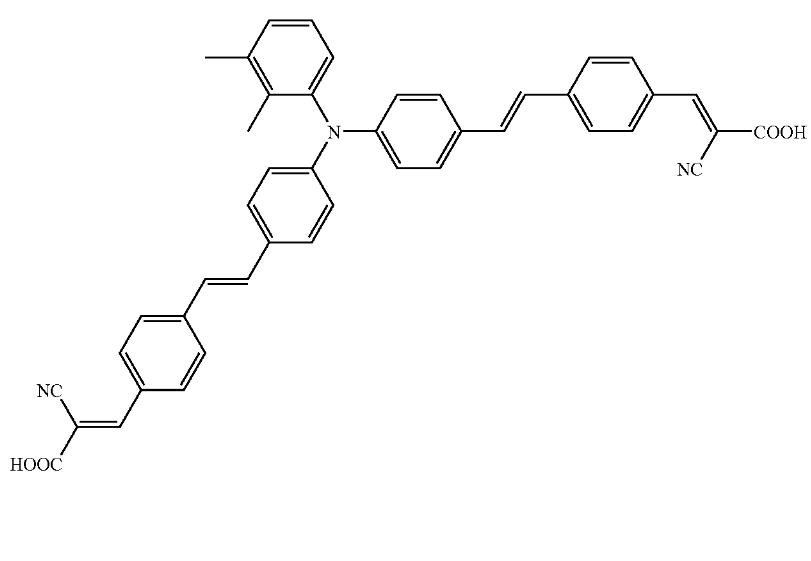

-continued
A-73
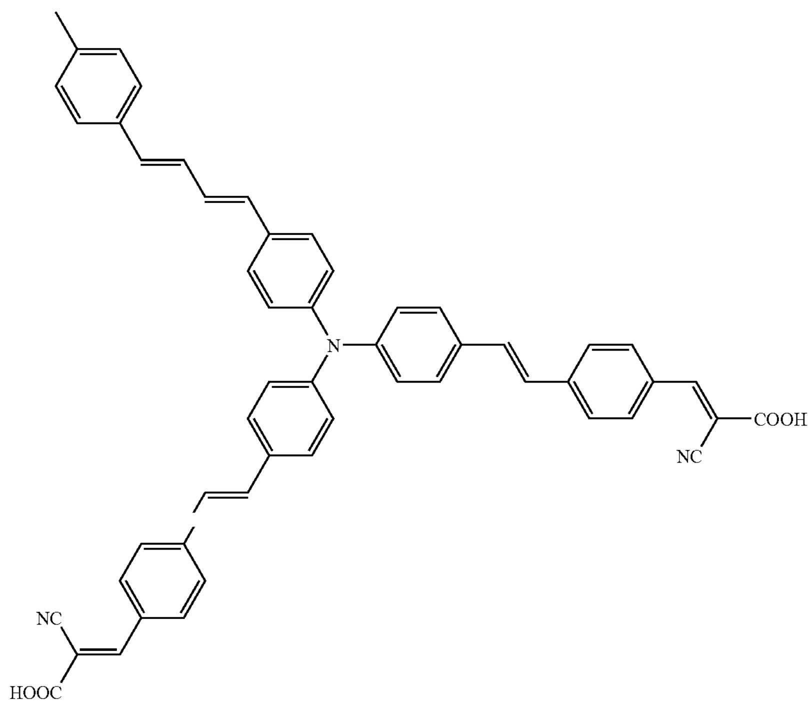
A-74
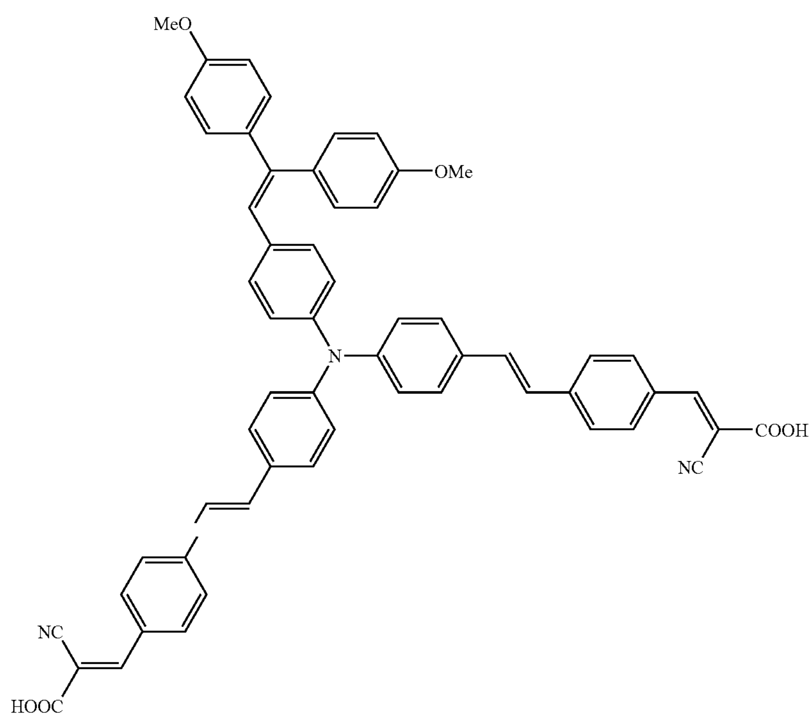

-continued
A-75
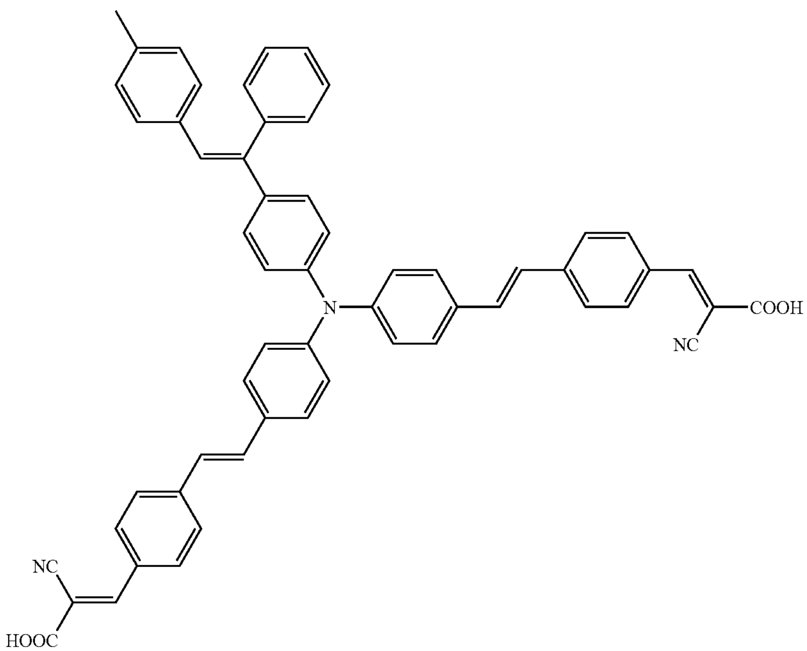
A-76
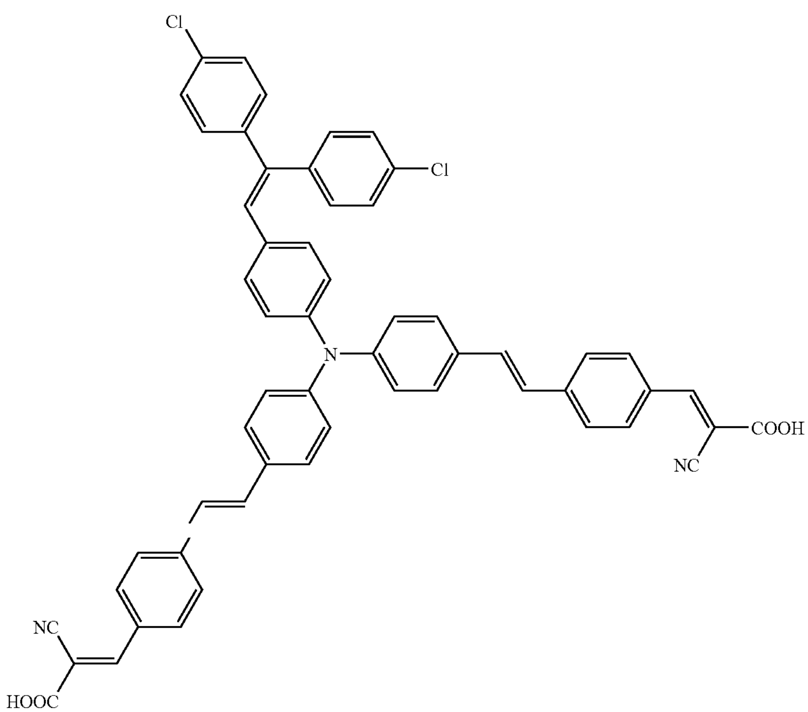

-continued
A-77
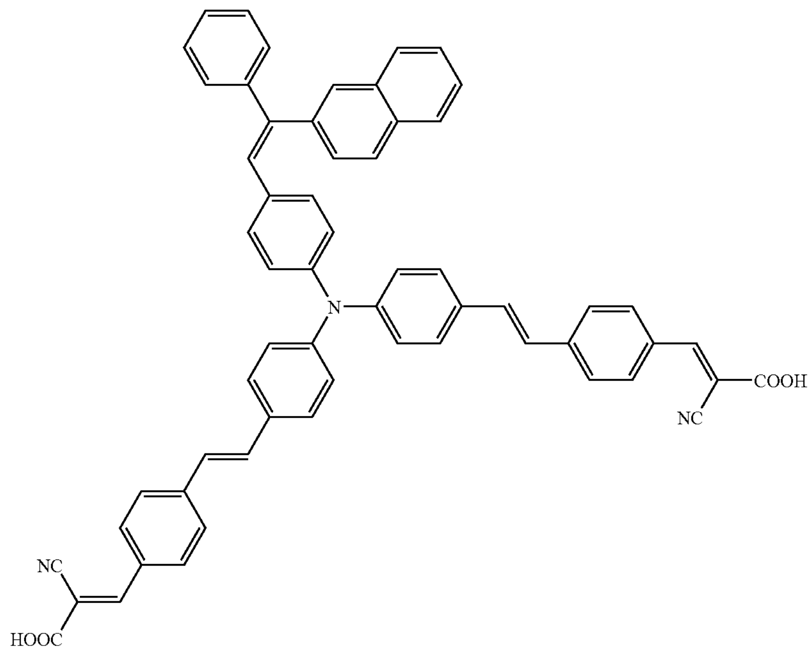
A-78
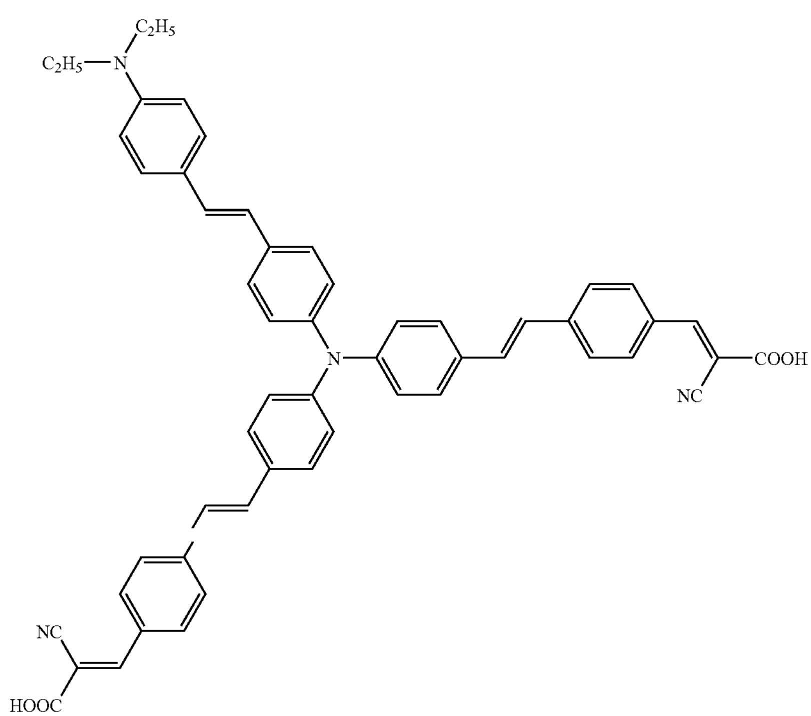

-continued
A-79
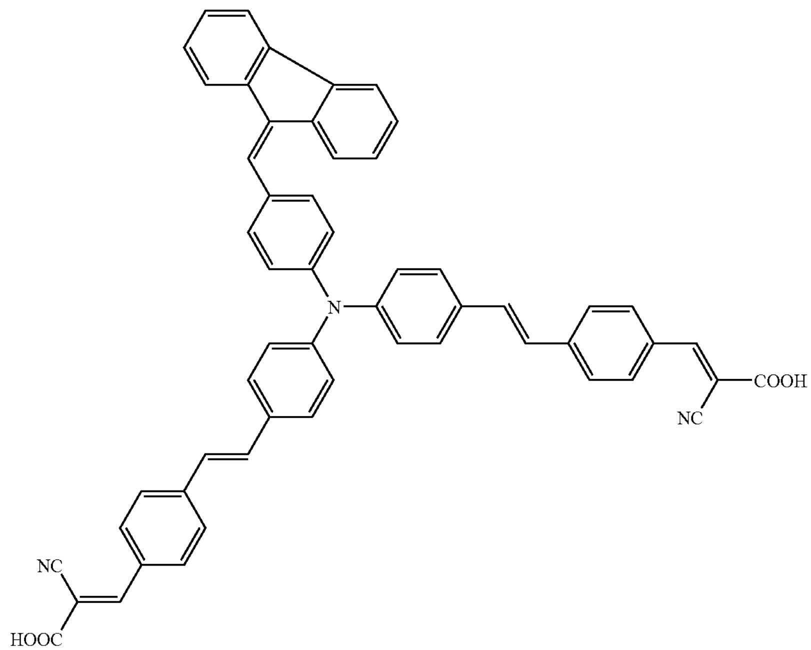
A-80
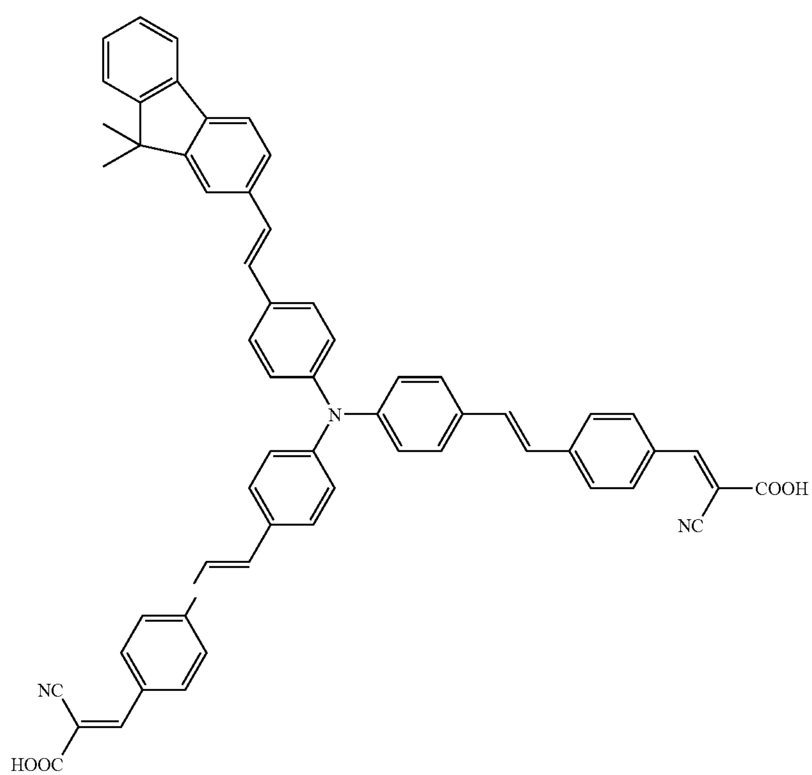

-continued
A-81
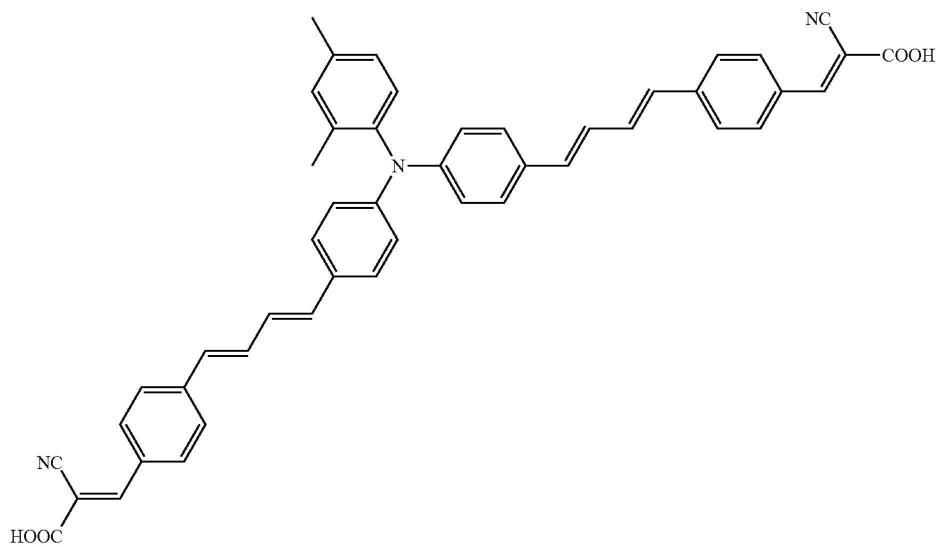
A-82
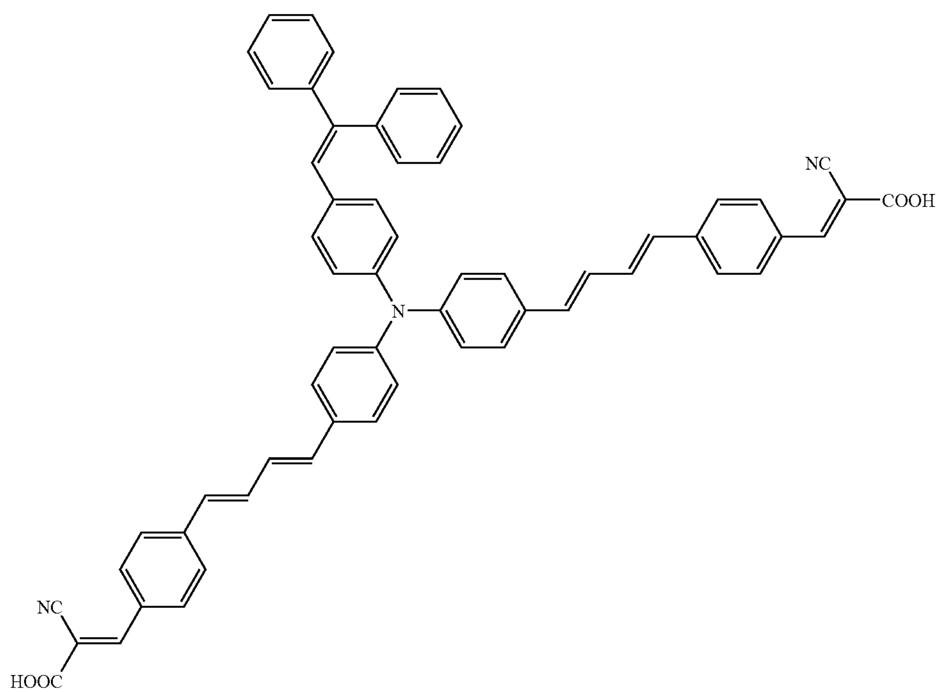

-continued
A-83
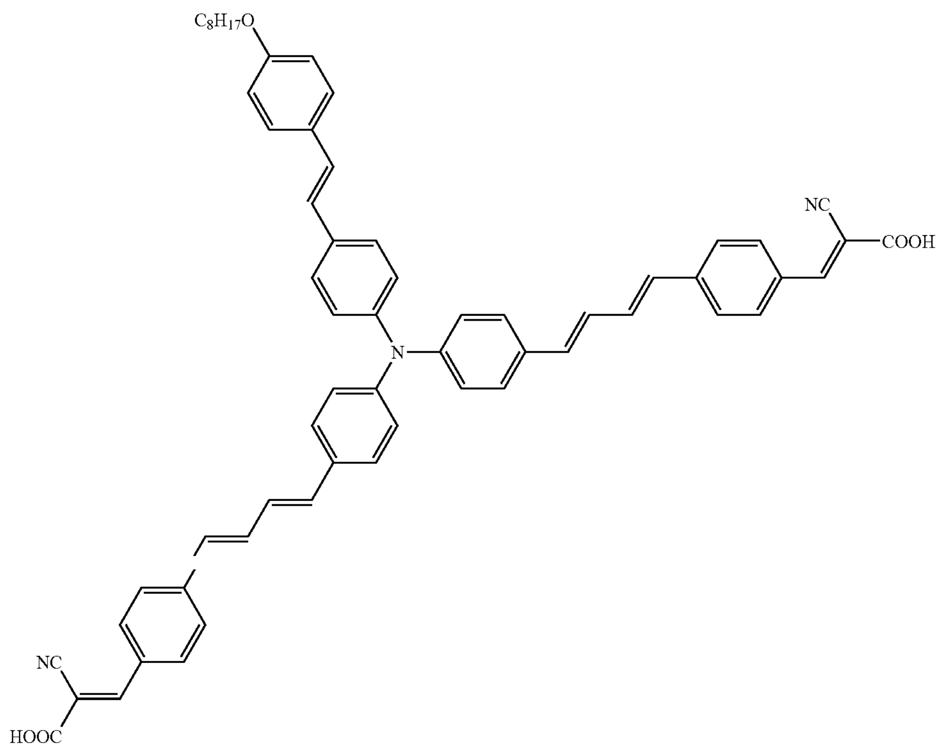
A-84
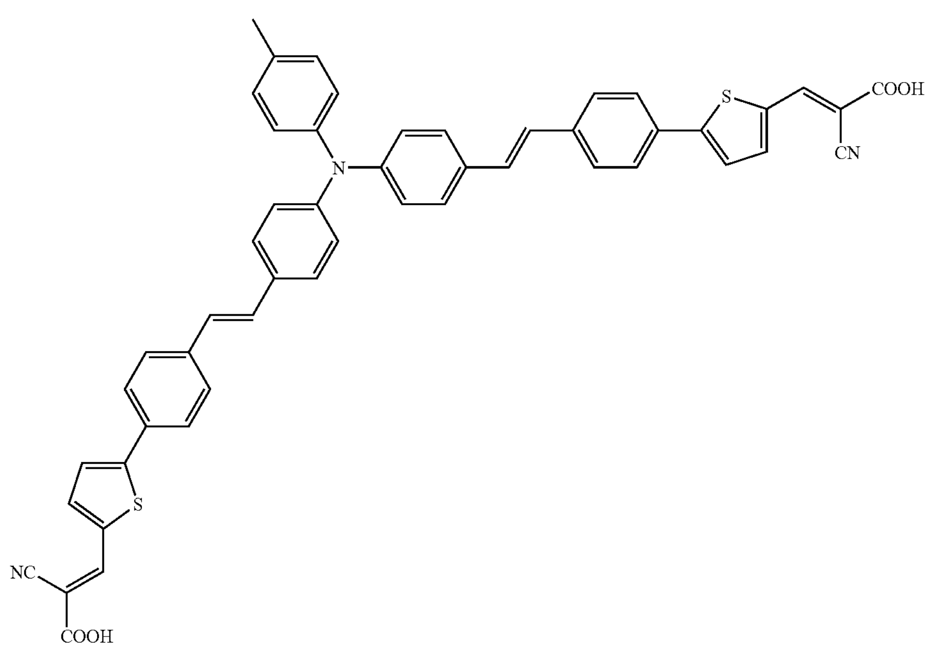

-continued
A-85
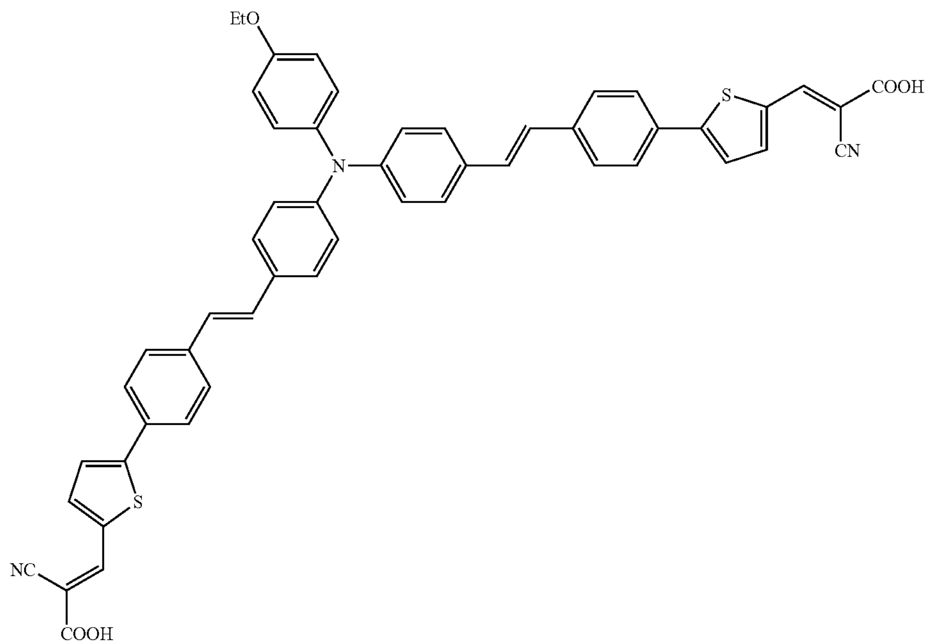
A-86
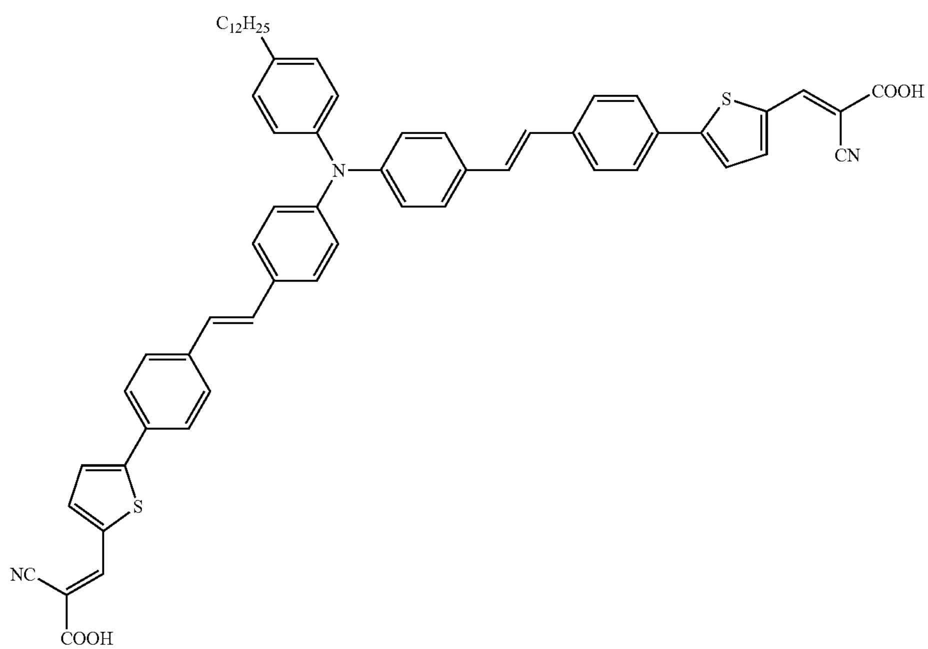

-continued
A-87
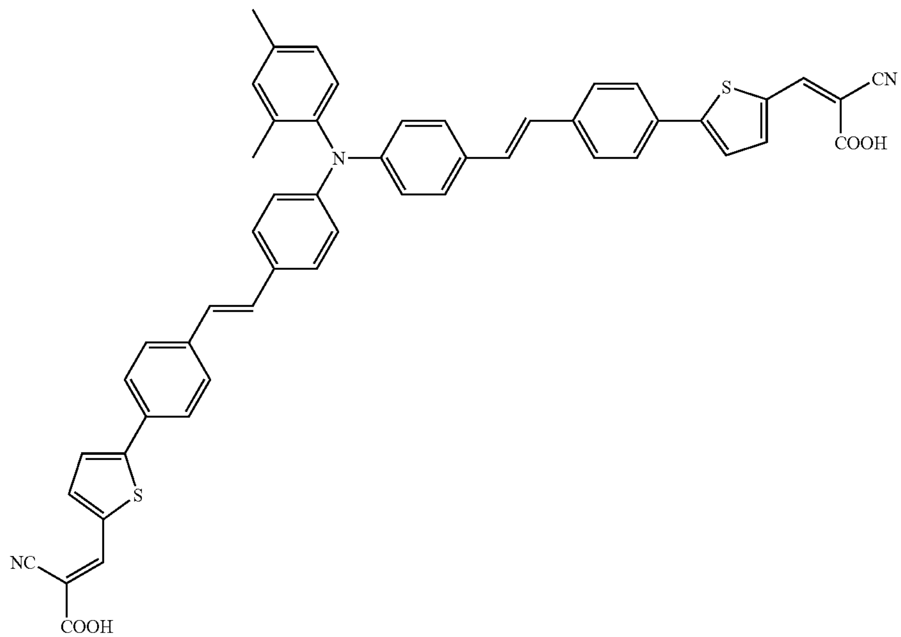
A-88
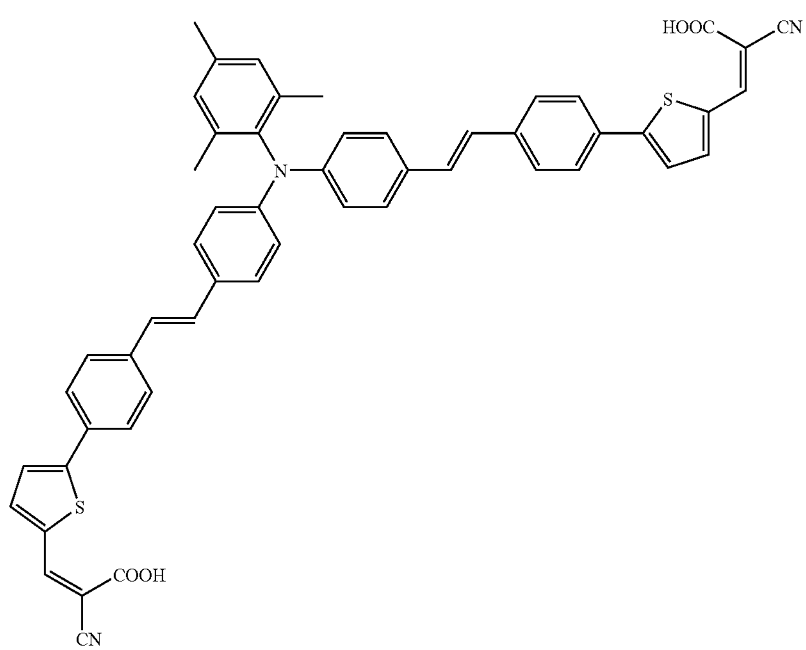

-continued
A-89
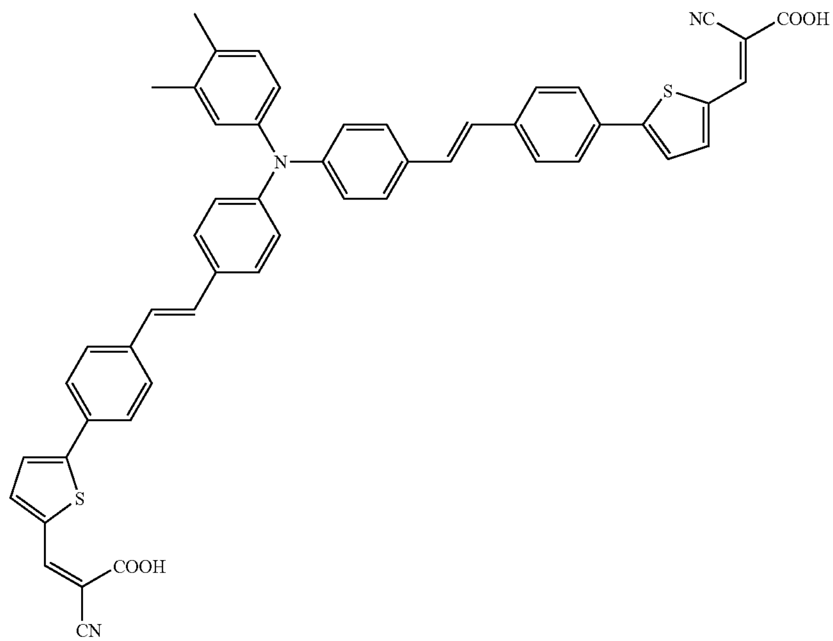
A-90
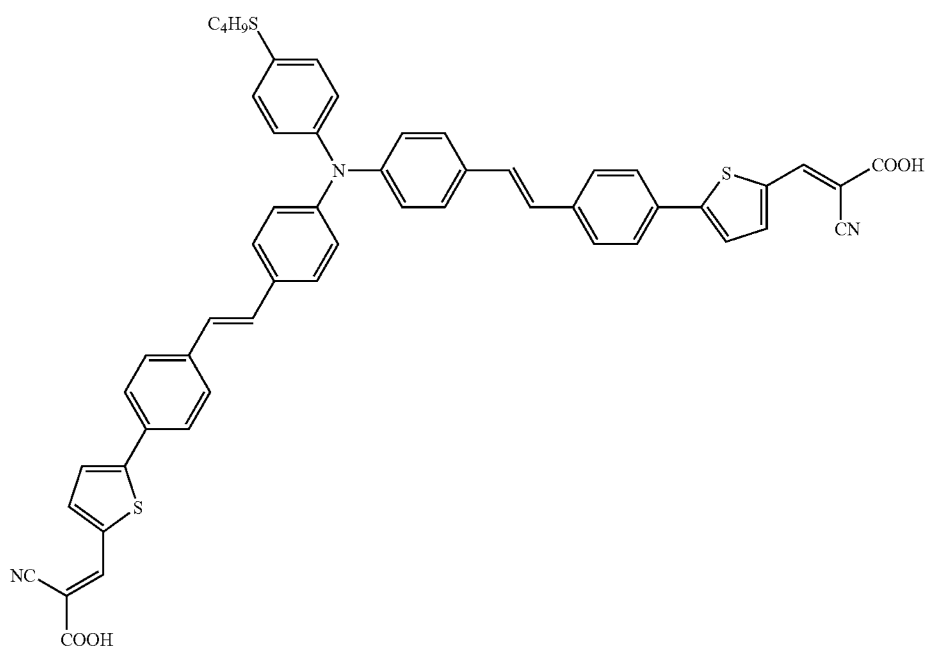

-continued
A-91
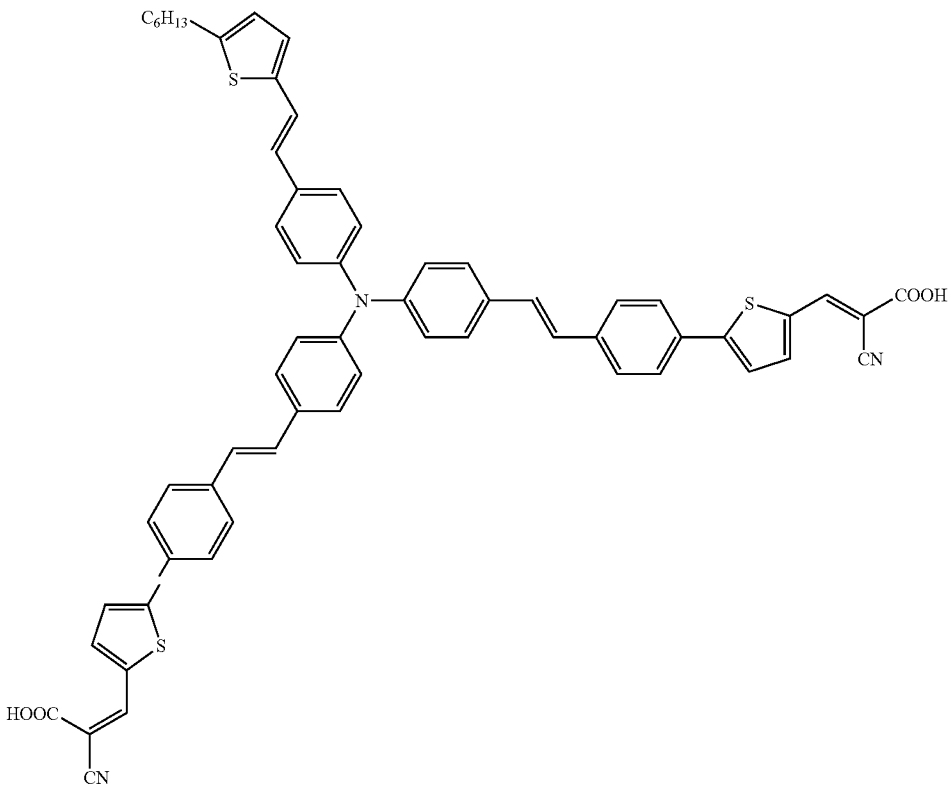
A-92
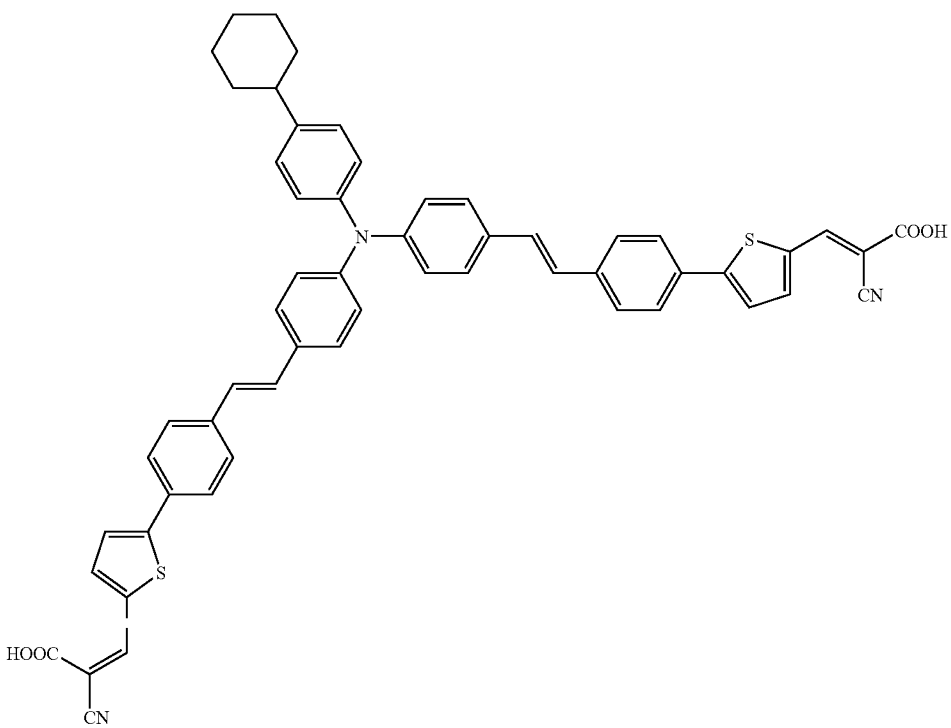

-continued
A-93
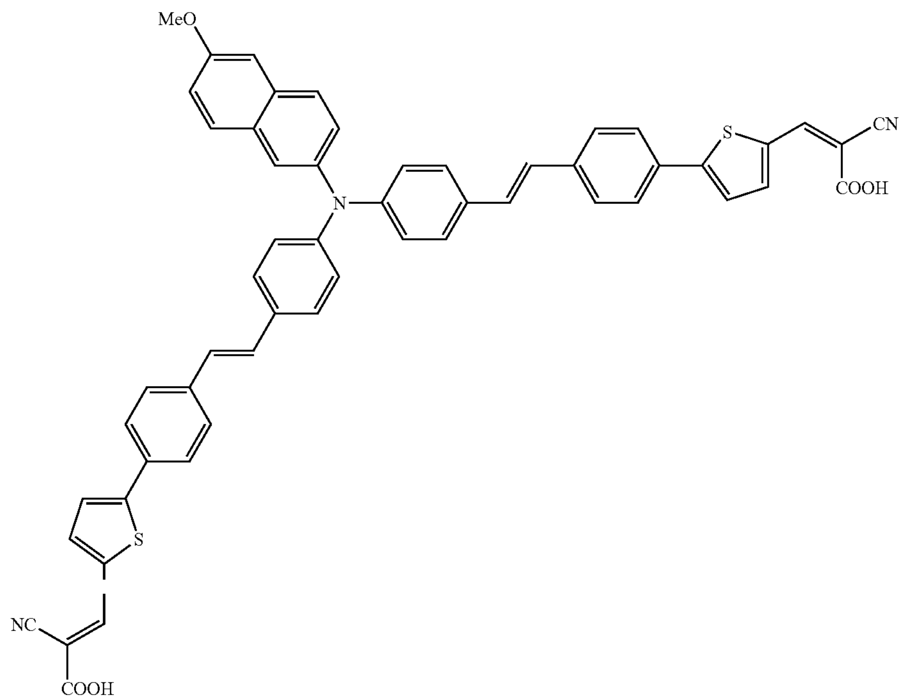
A-94
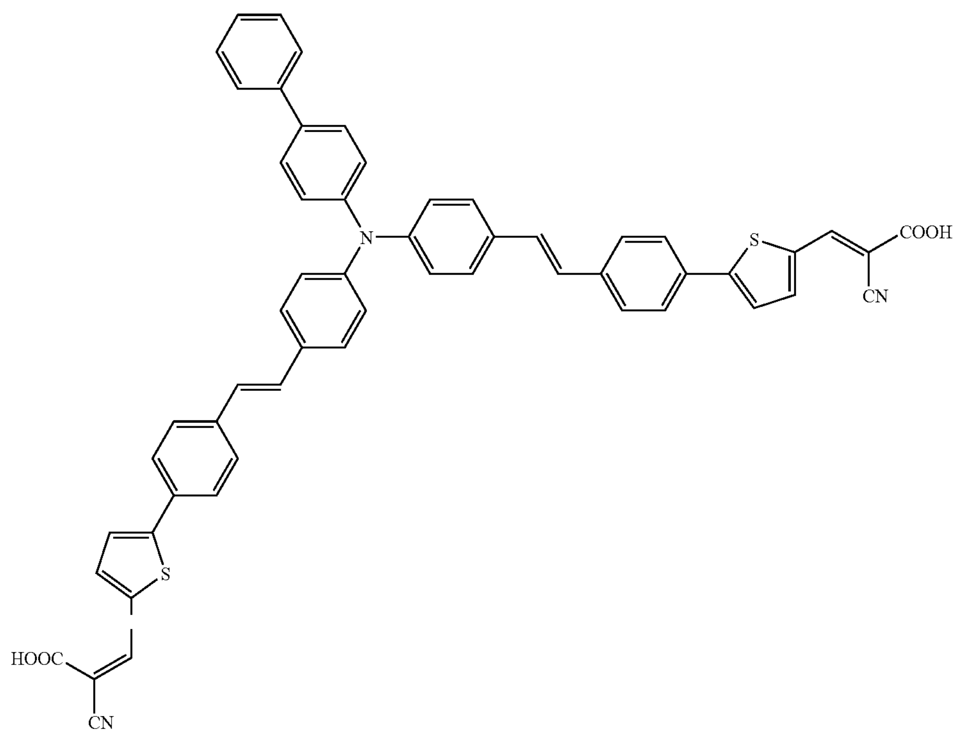

-continued
A-95
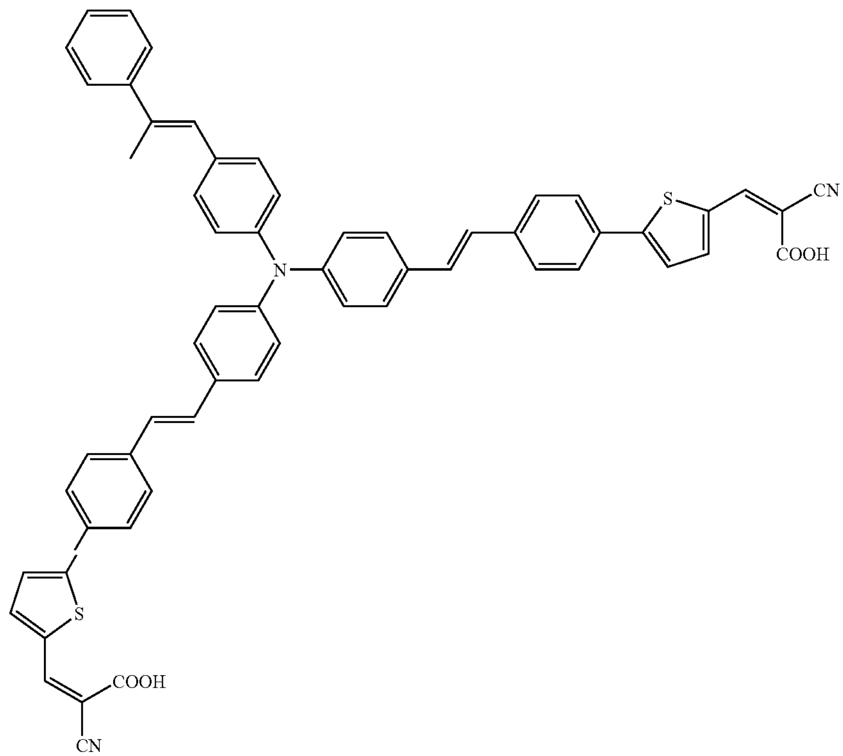
A-96
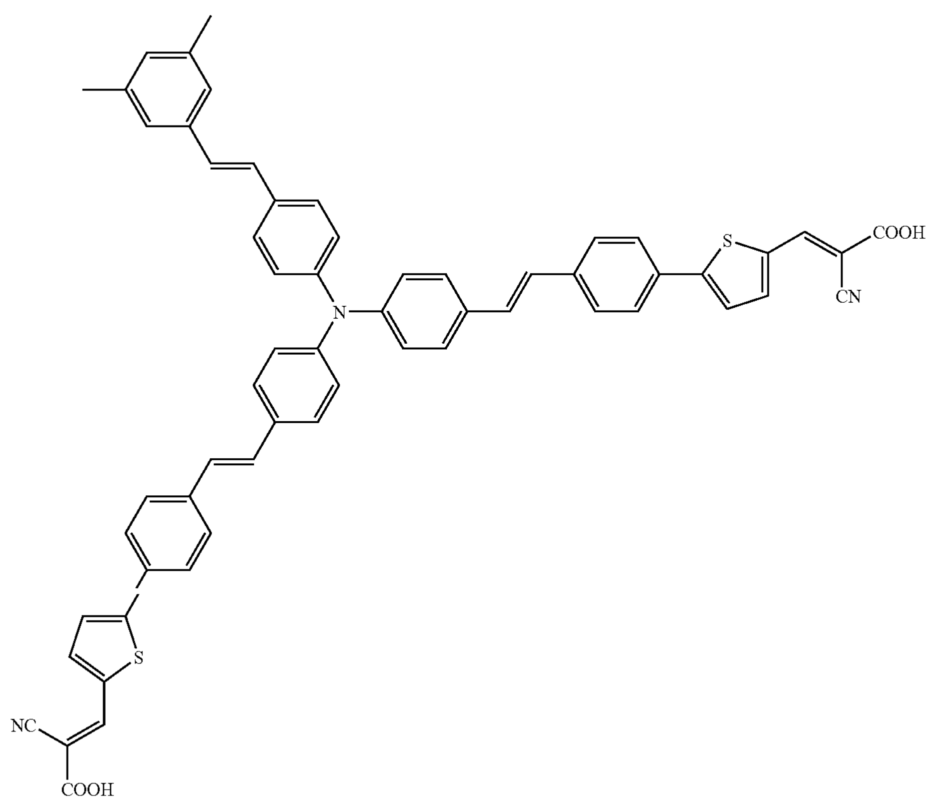

-continued
A-97
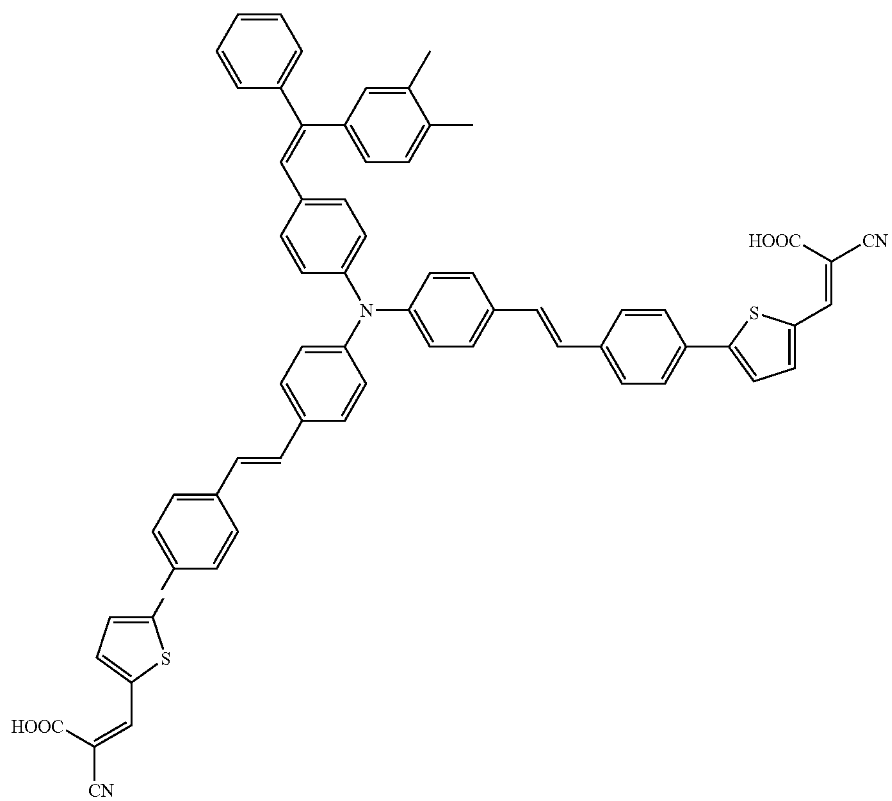
A-98
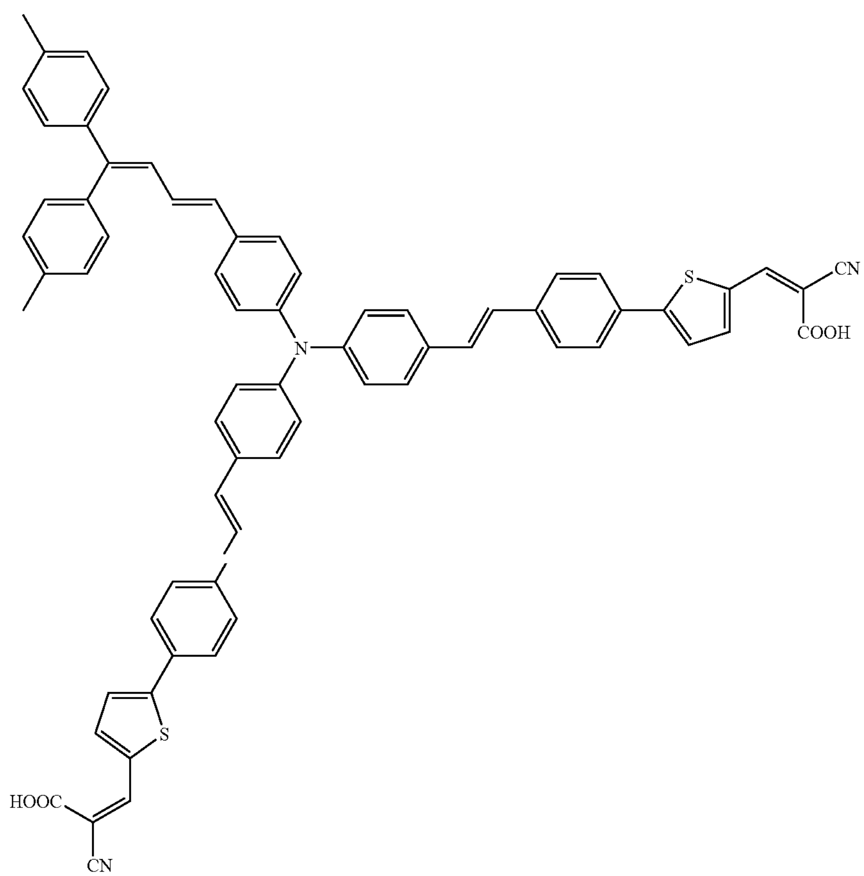

-continued
A-99
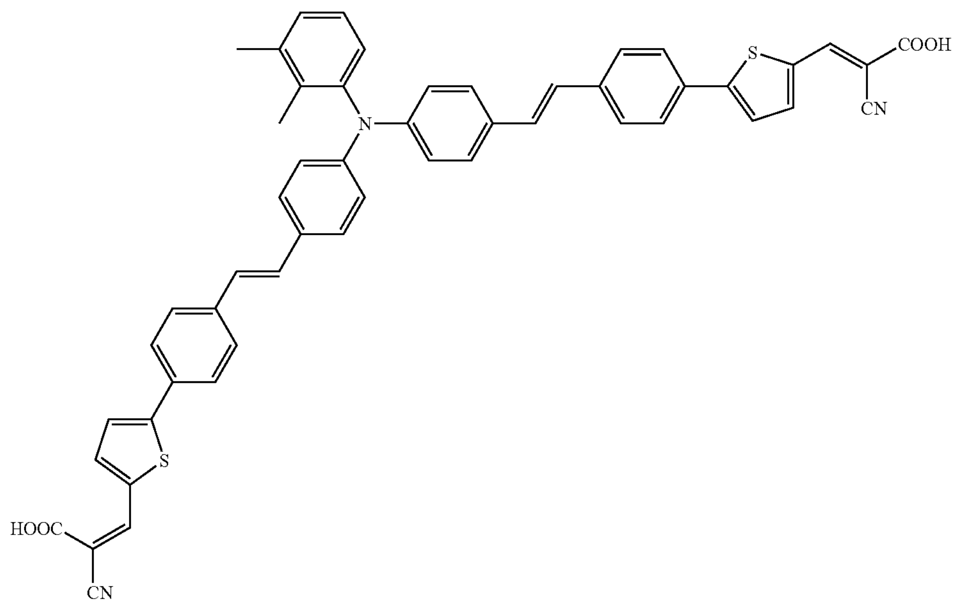
A-100
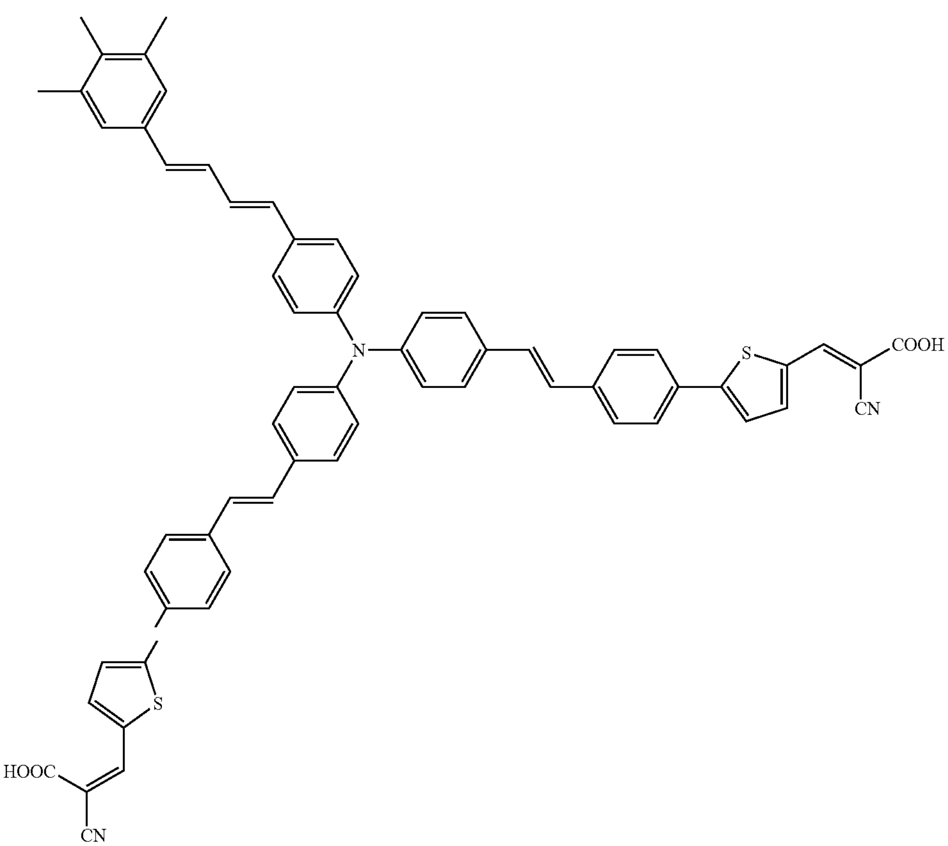

-continued
A-101
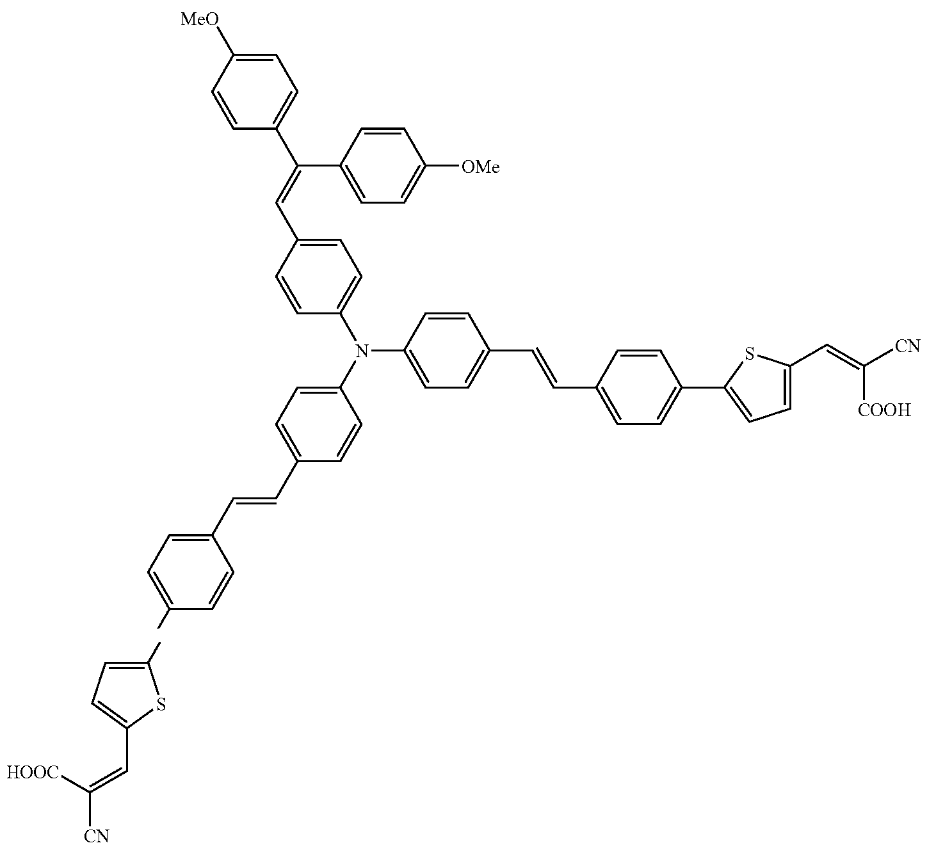
A-102
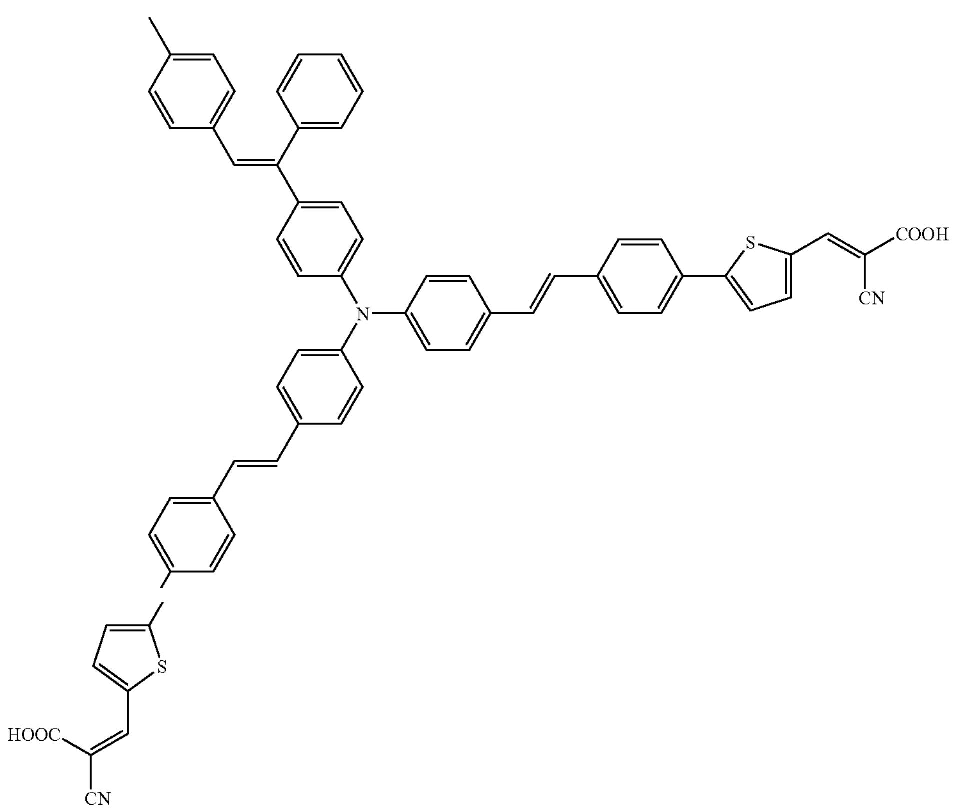

-continued
A-103
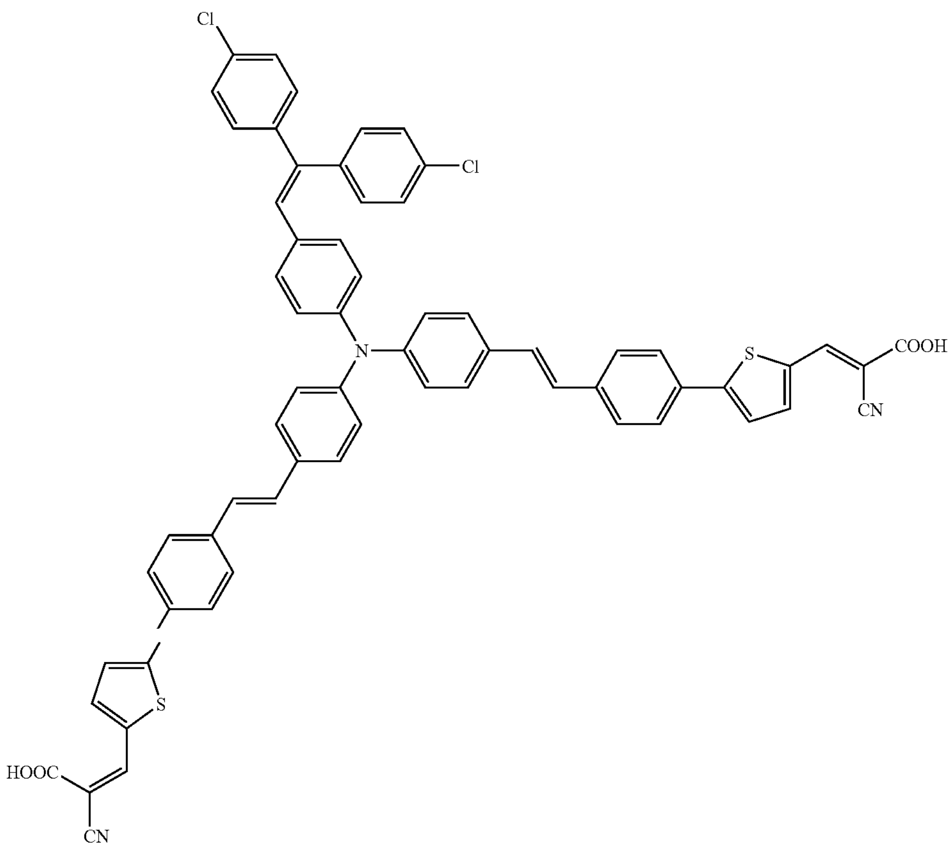
A-104
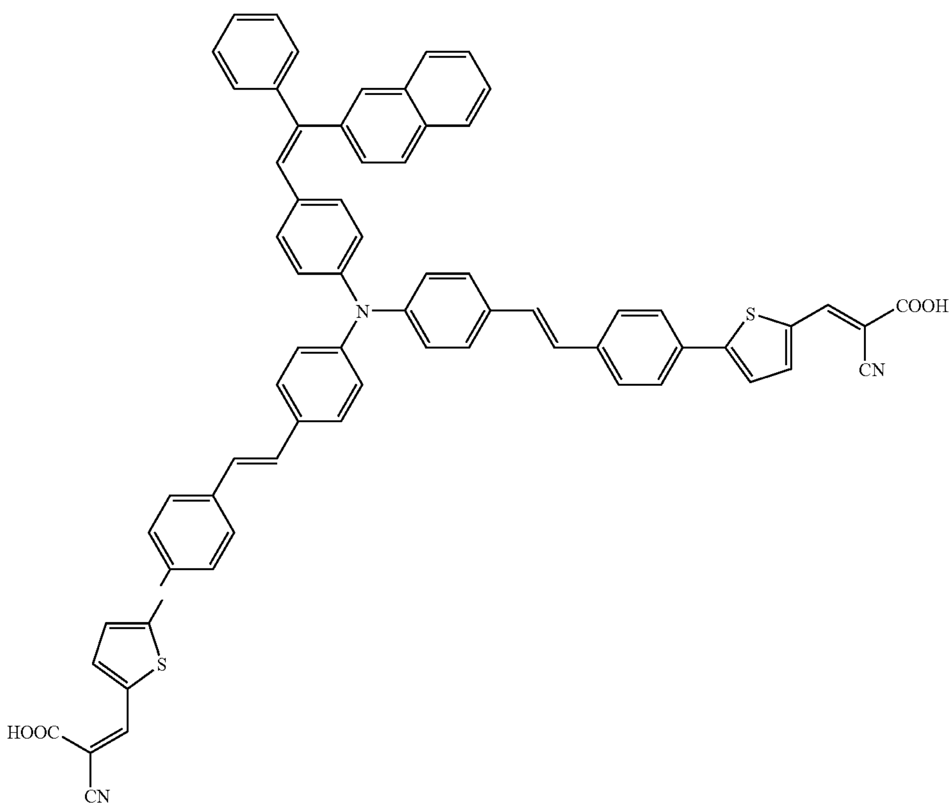

-continued
A-105
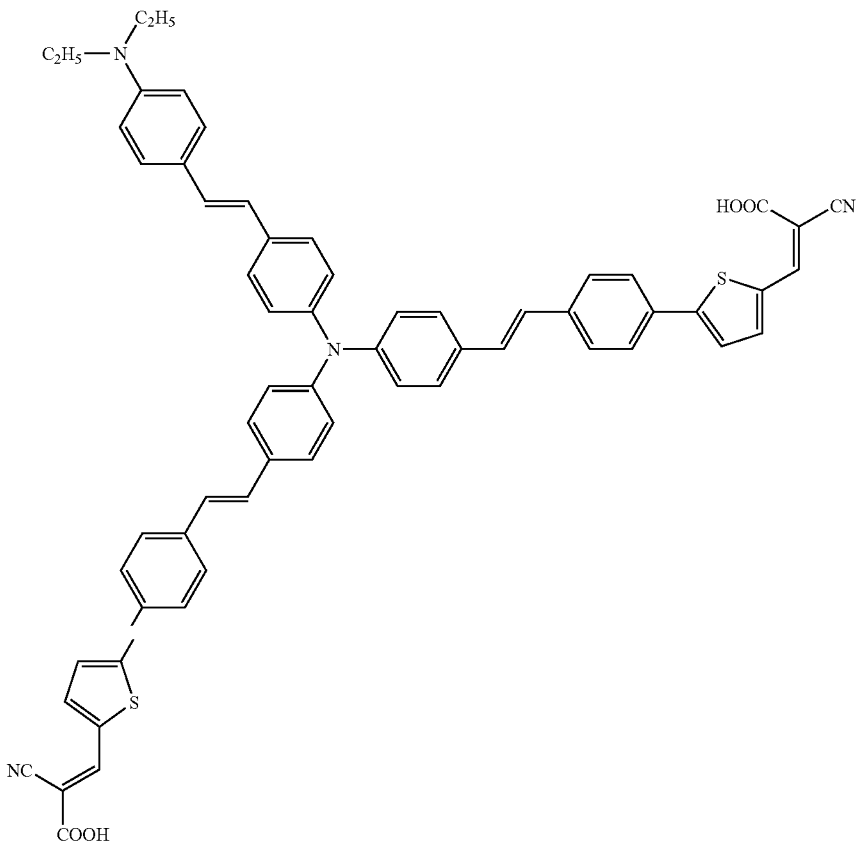
A-106
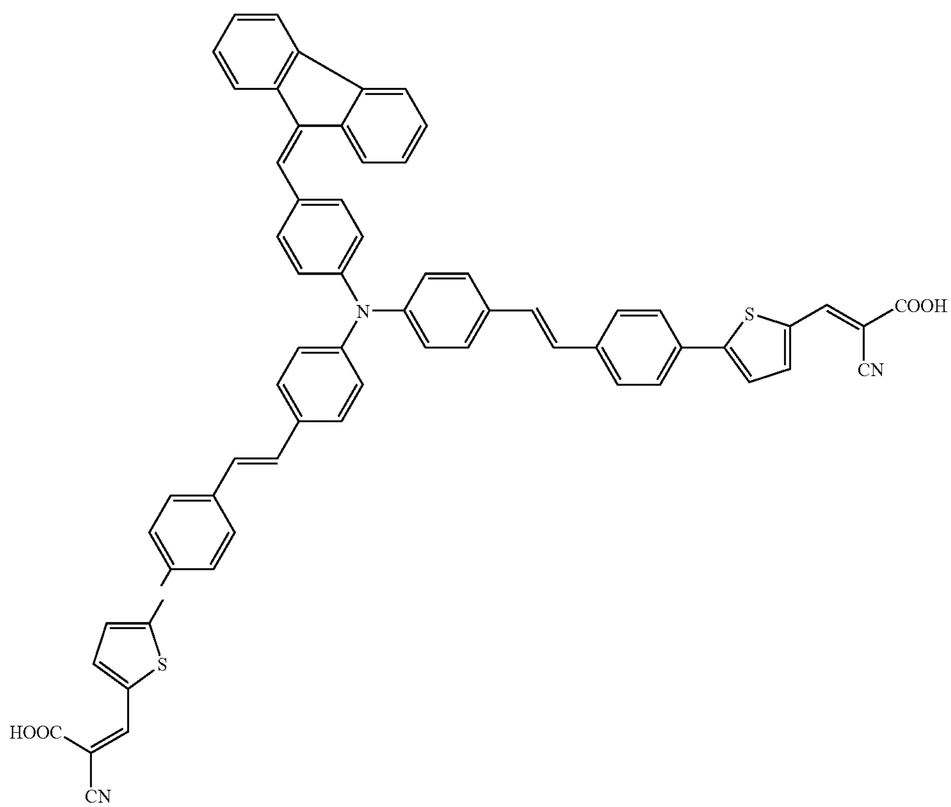

-continued
A-107
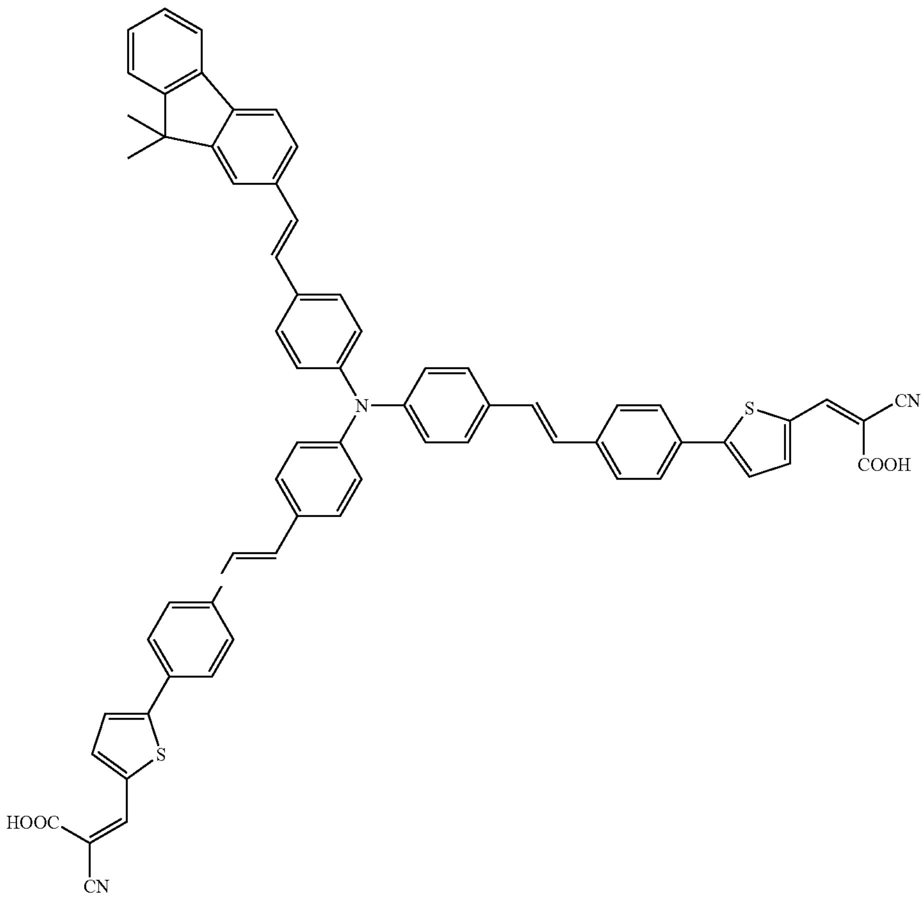
A-108
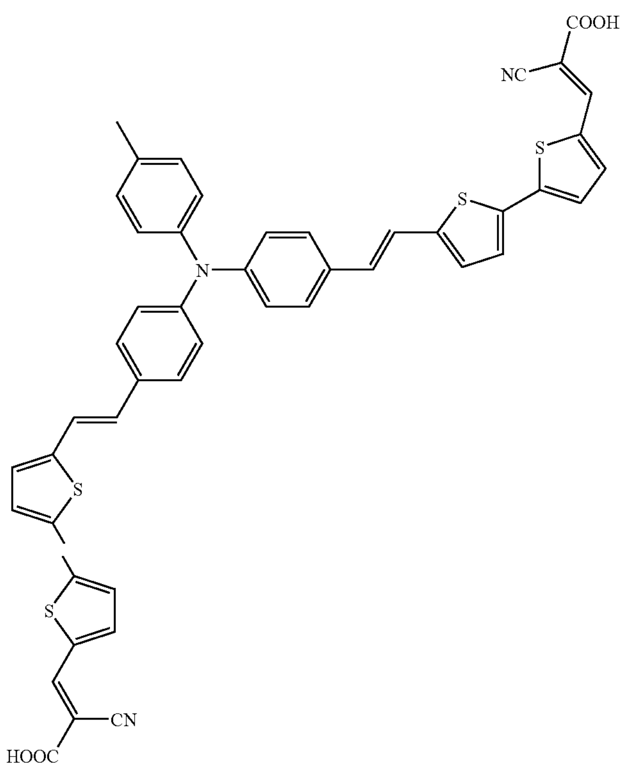

-continued
A-109
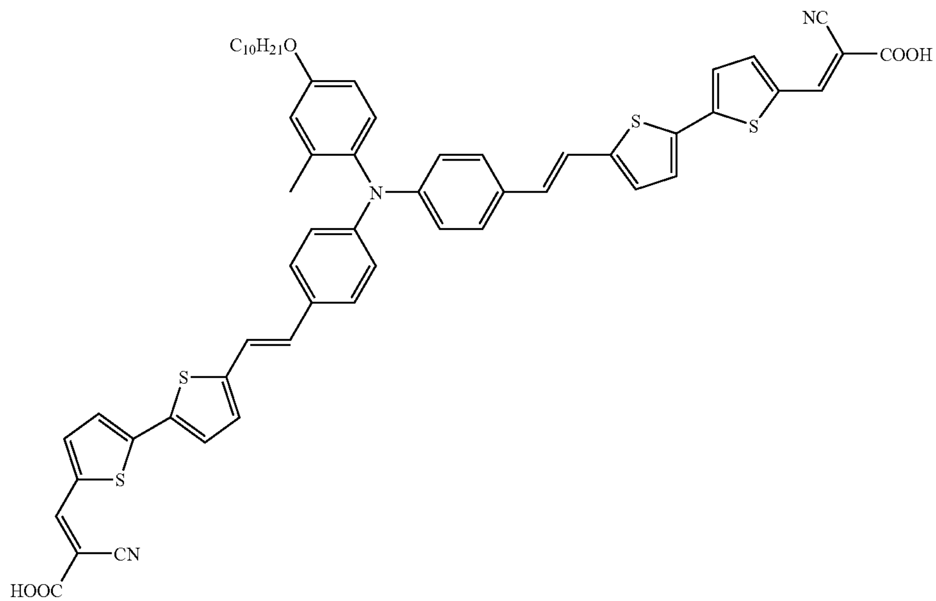
A-110
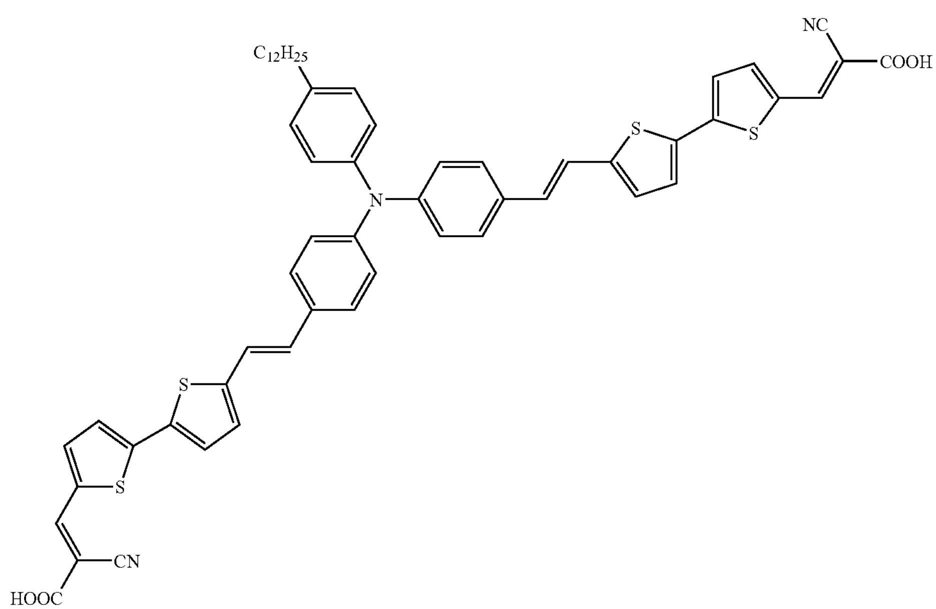

-continued
A-111
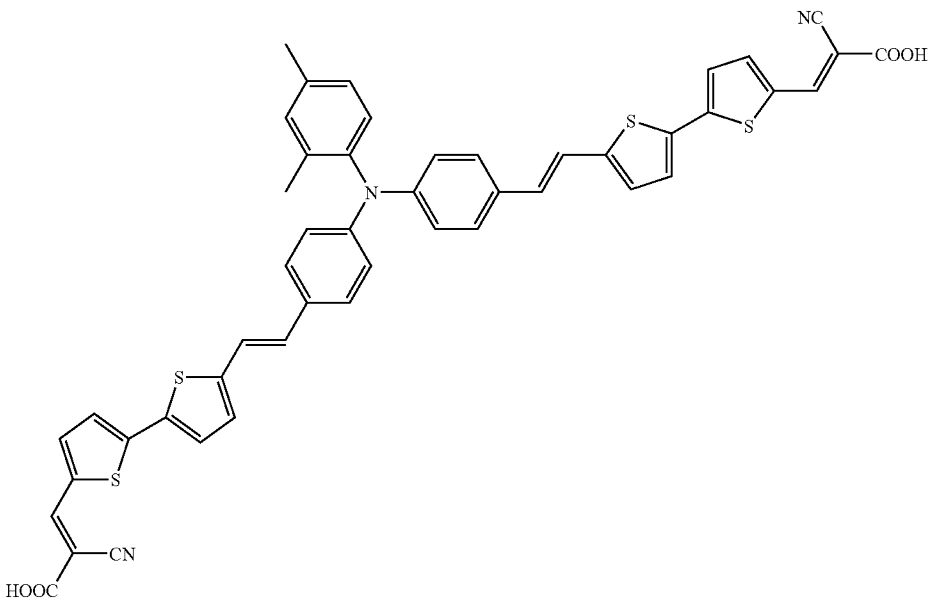
A-112
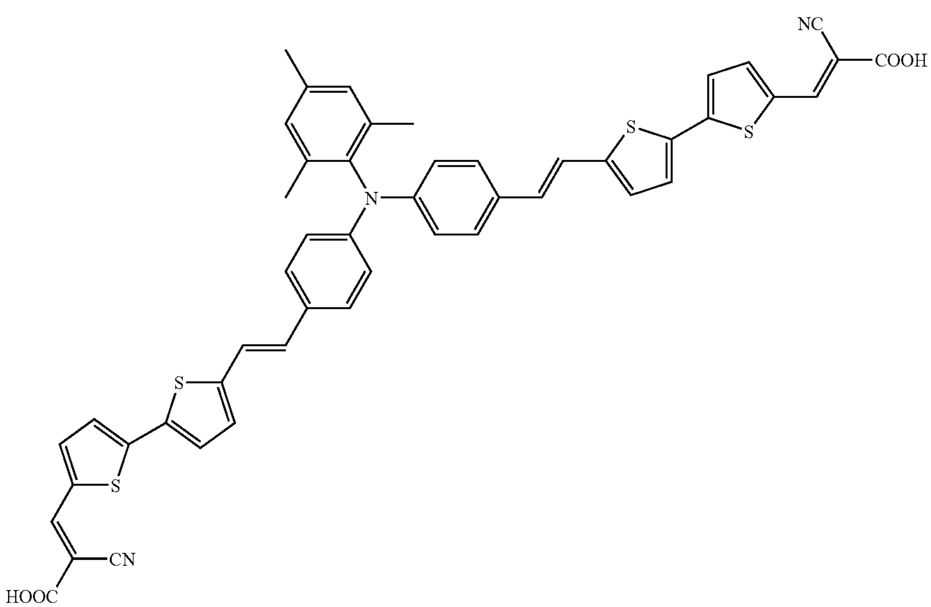

-continued
A-113
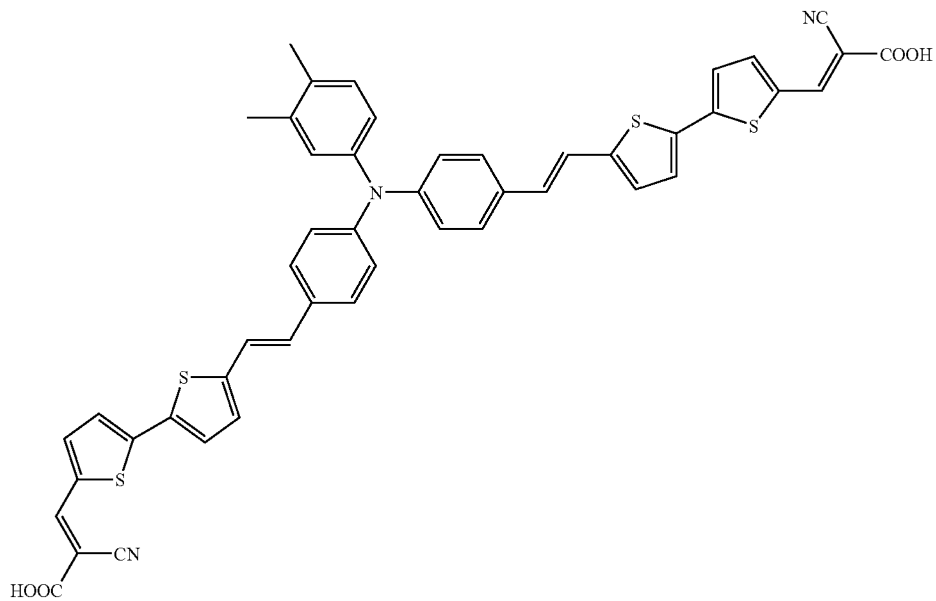
A-114
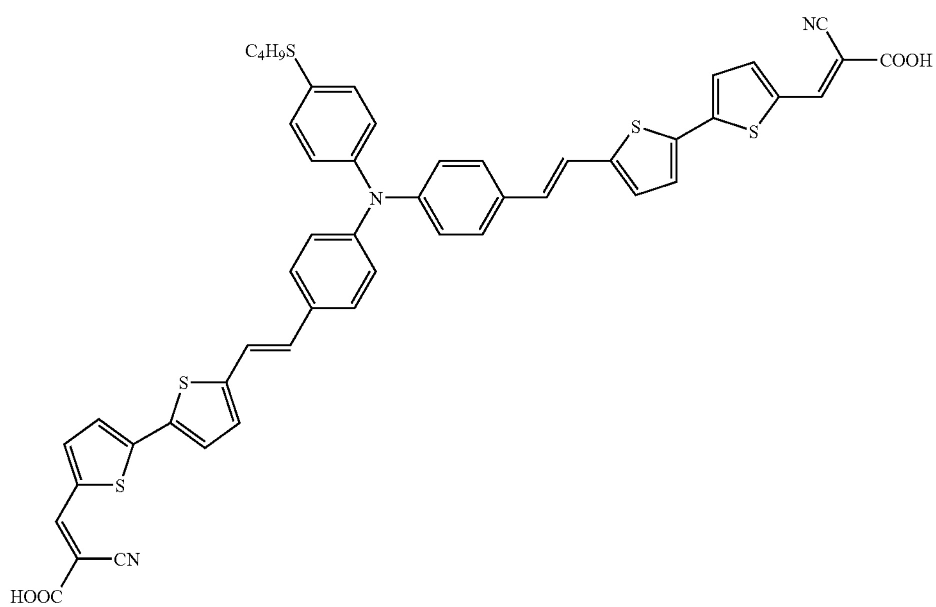

-continued
A-115
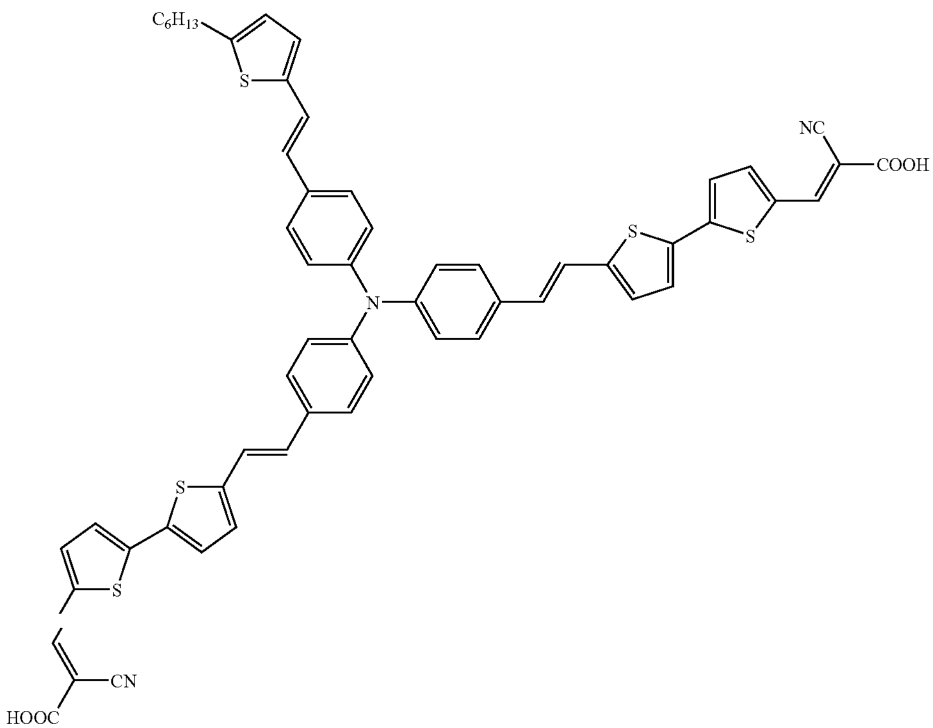
A-116
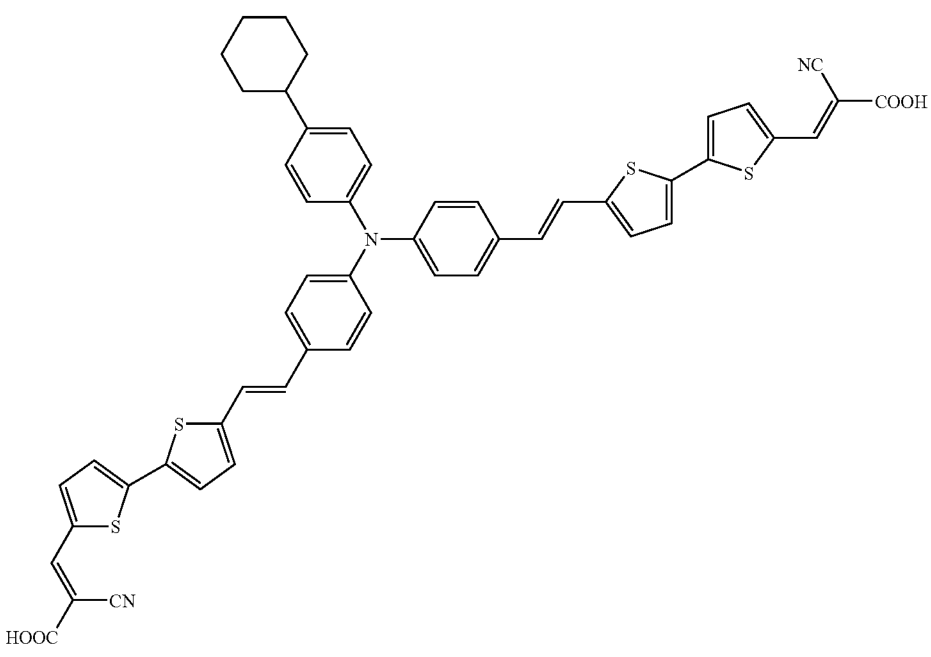

-continued
A-117
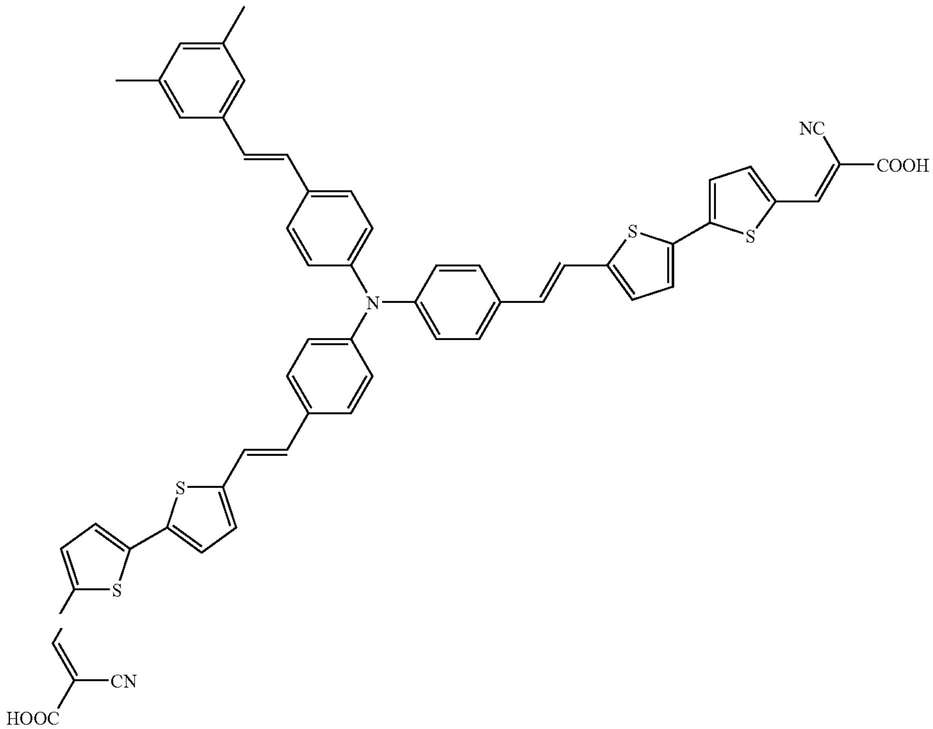
A-118
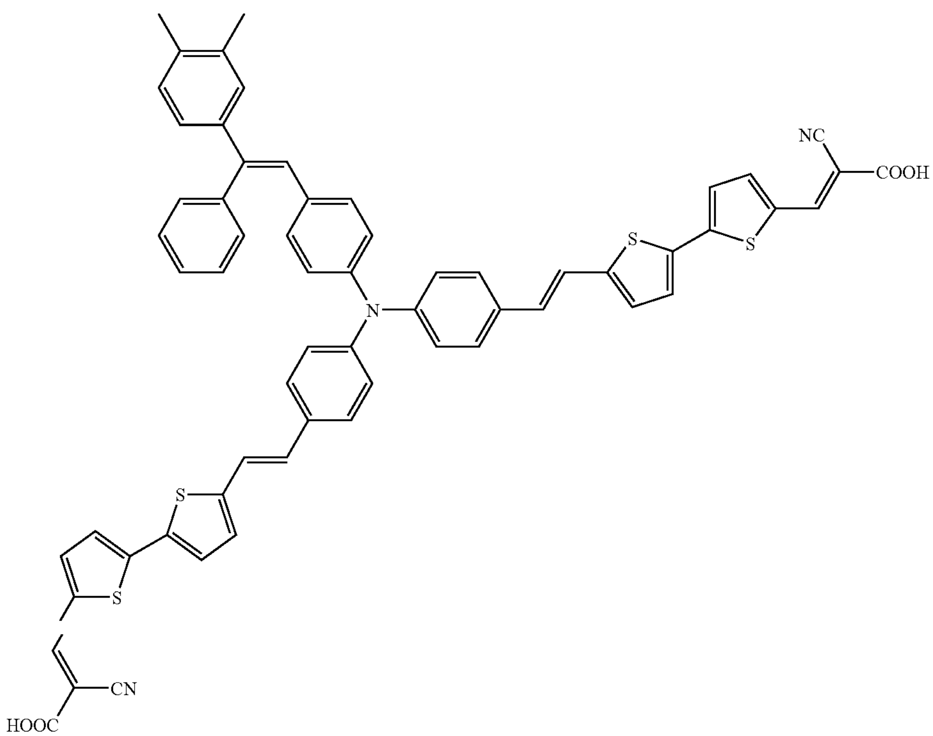

-continued
A-119
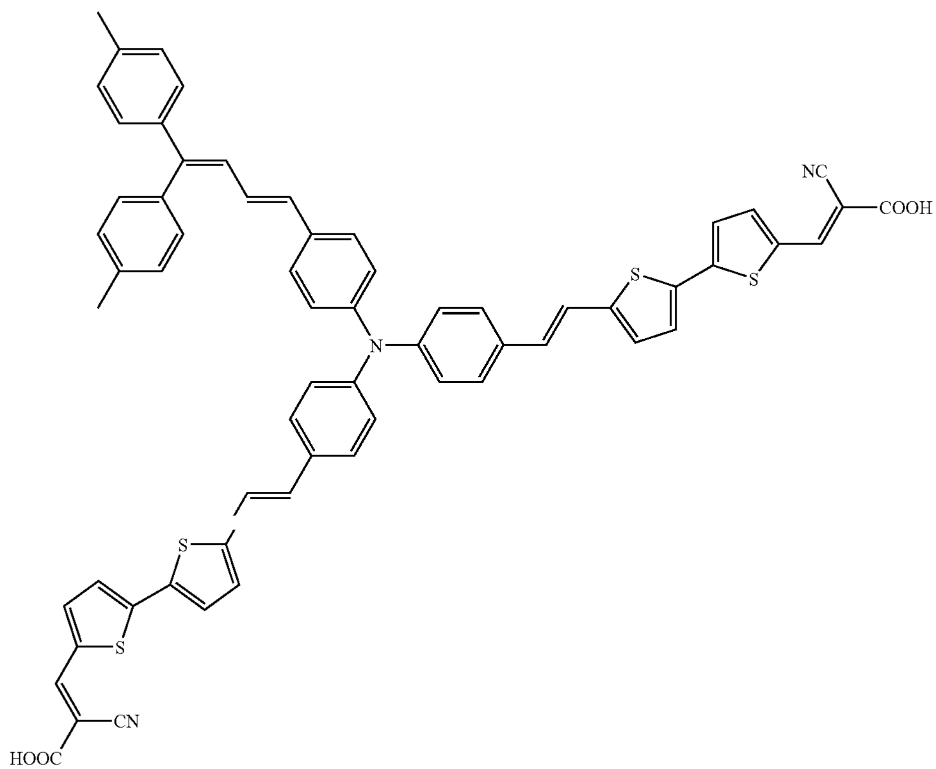
A-120
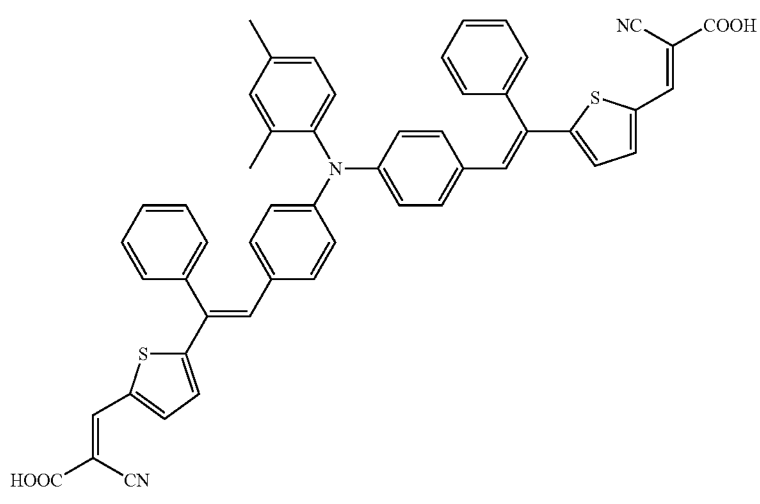

-continued
A-121
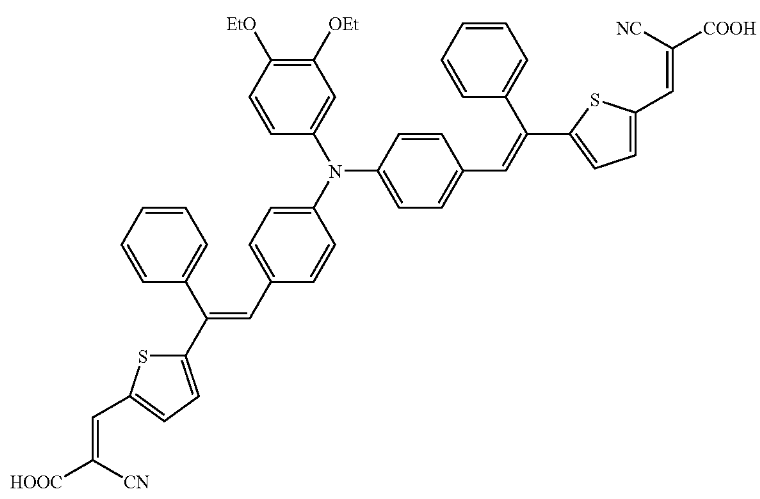
A-122
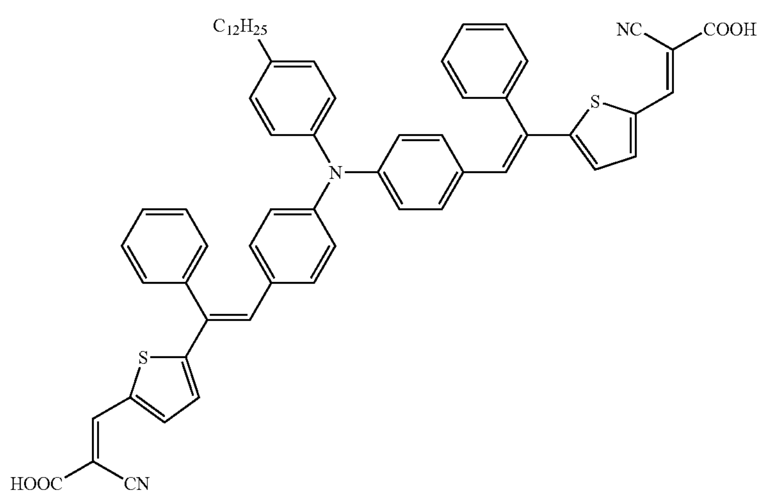
A-123
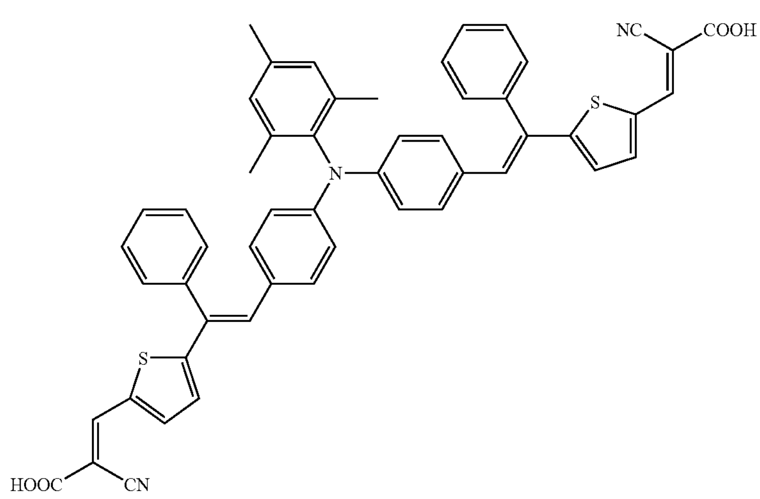

-continued
A-124
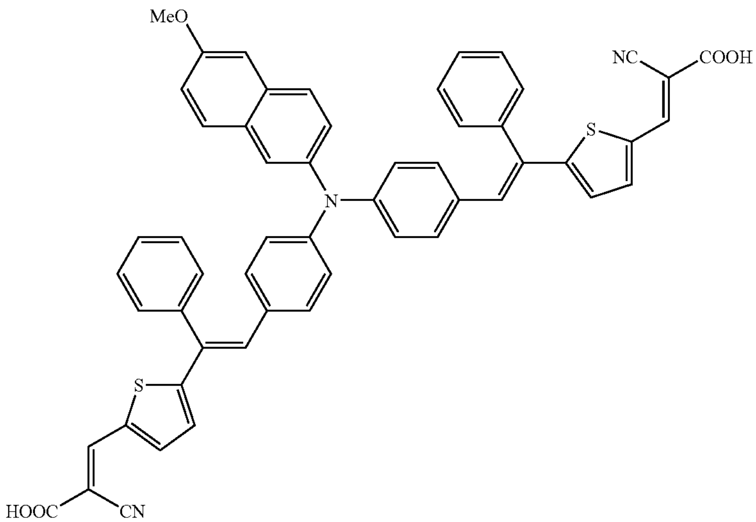
A-125
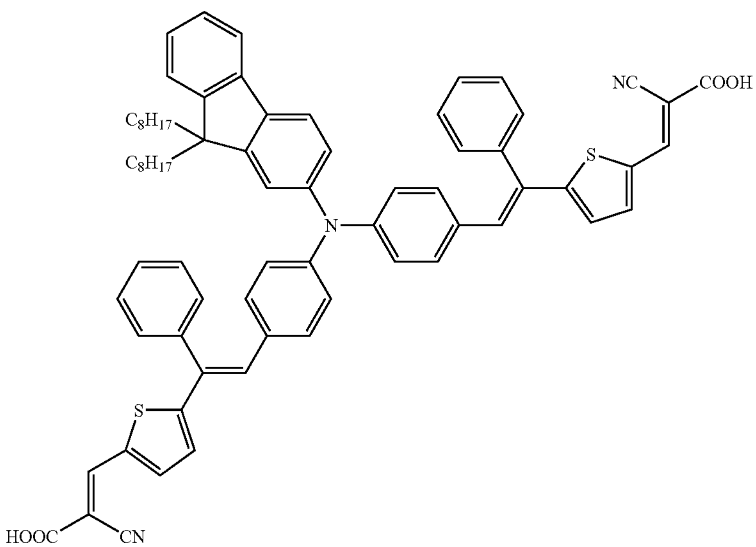
A-126
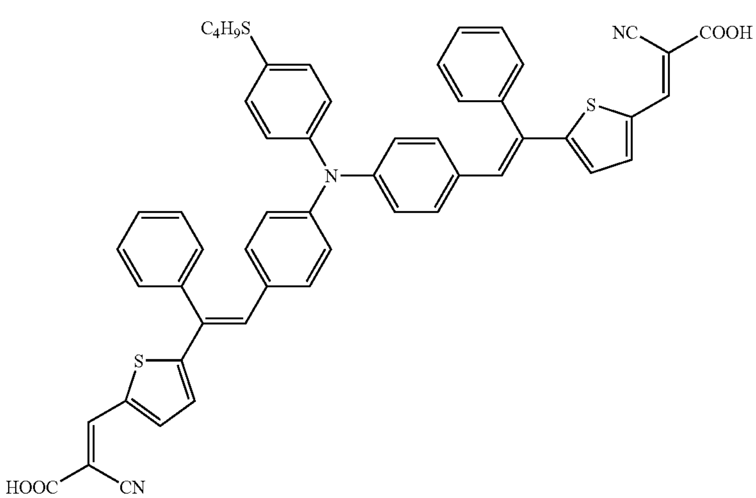

-continued
A-127
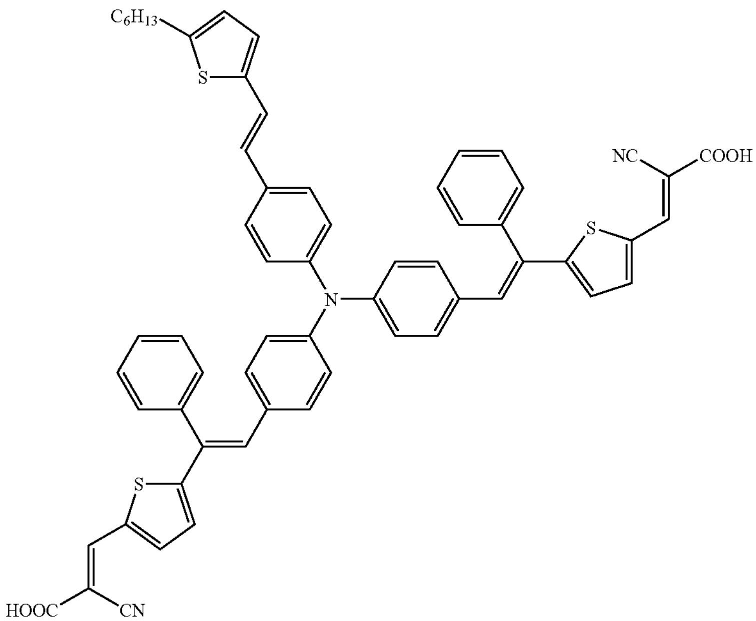
A-128
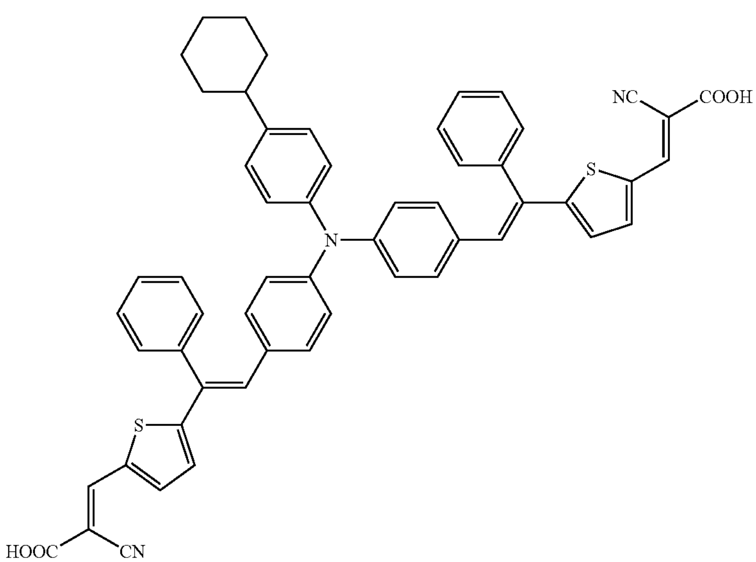

-continued
A-129
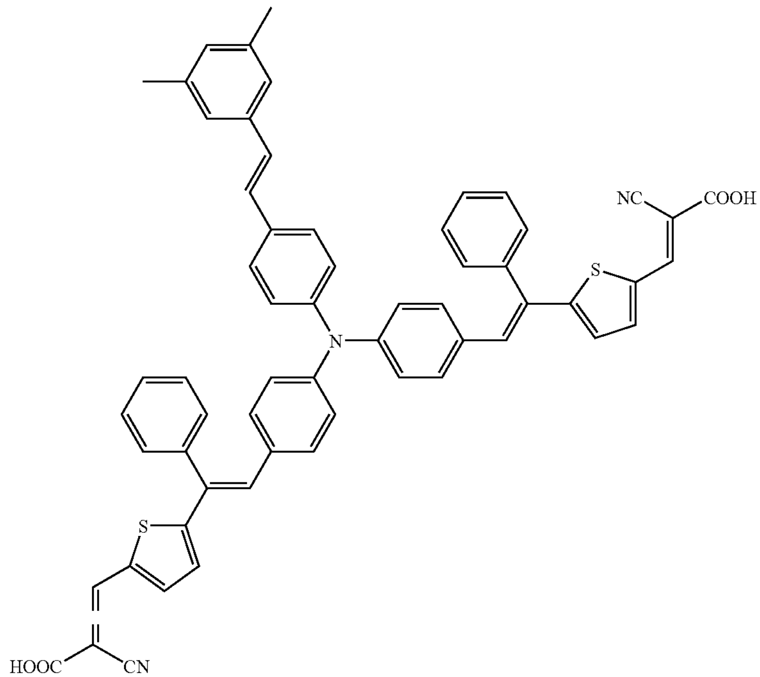
A-130
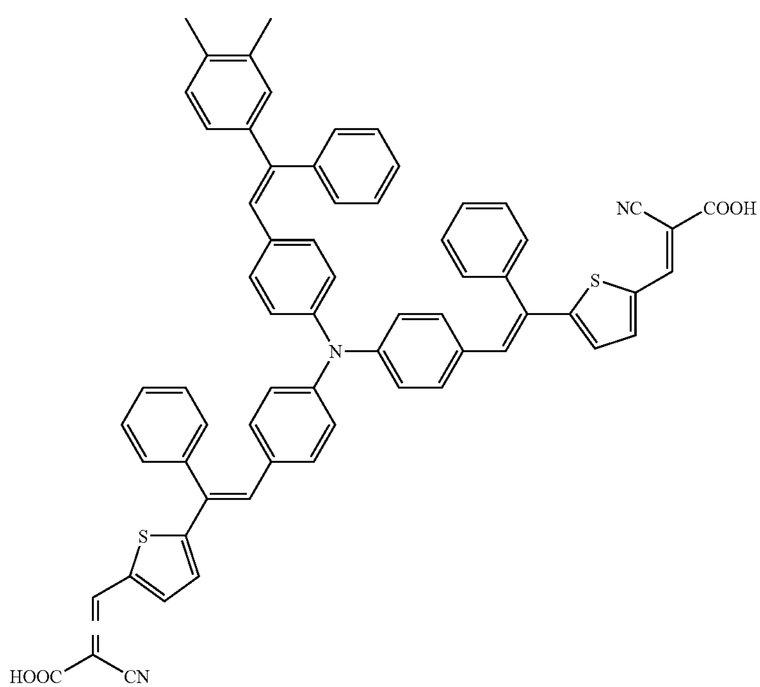

-continued
A-131
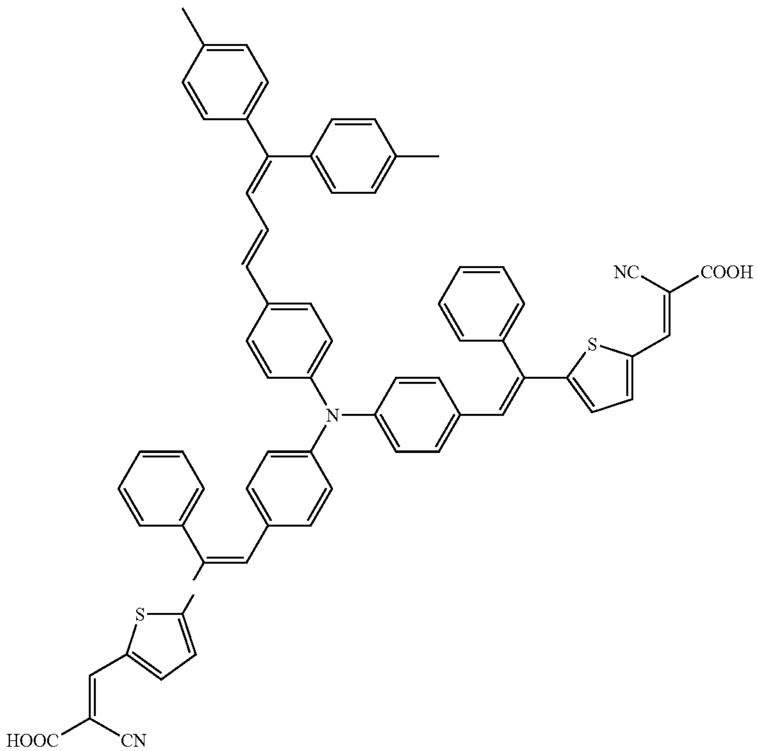
A-132
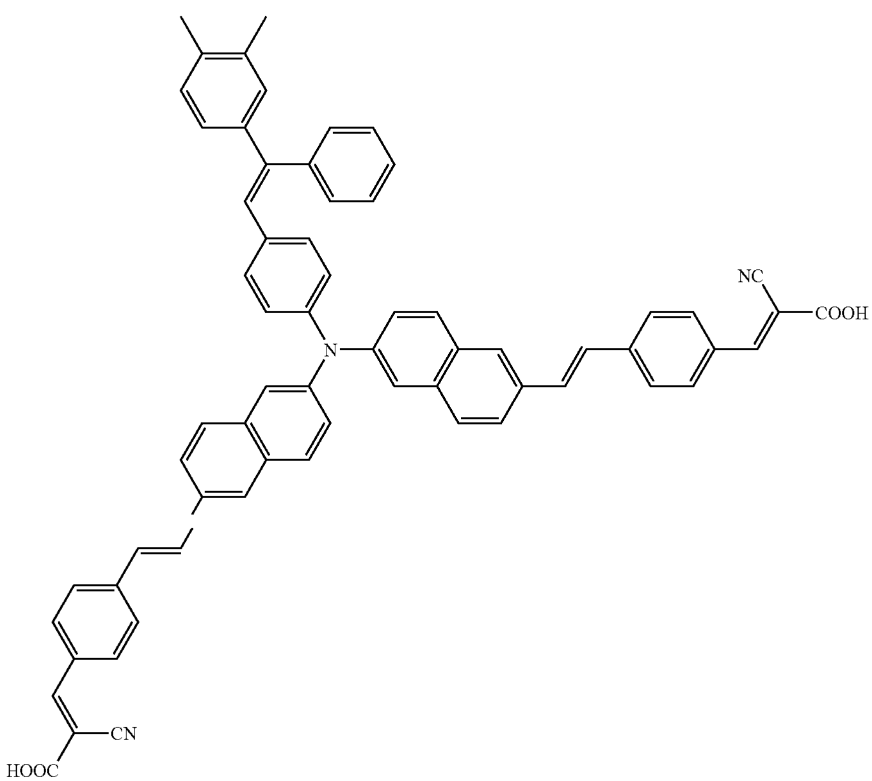

-continued
A-133
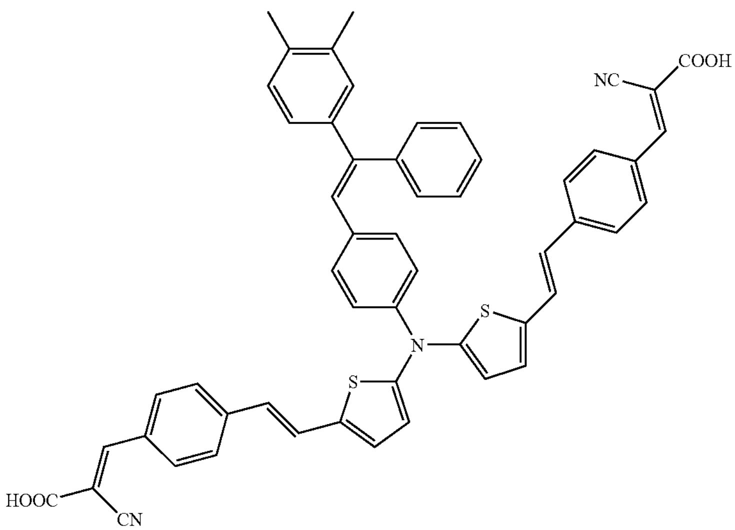
A-134
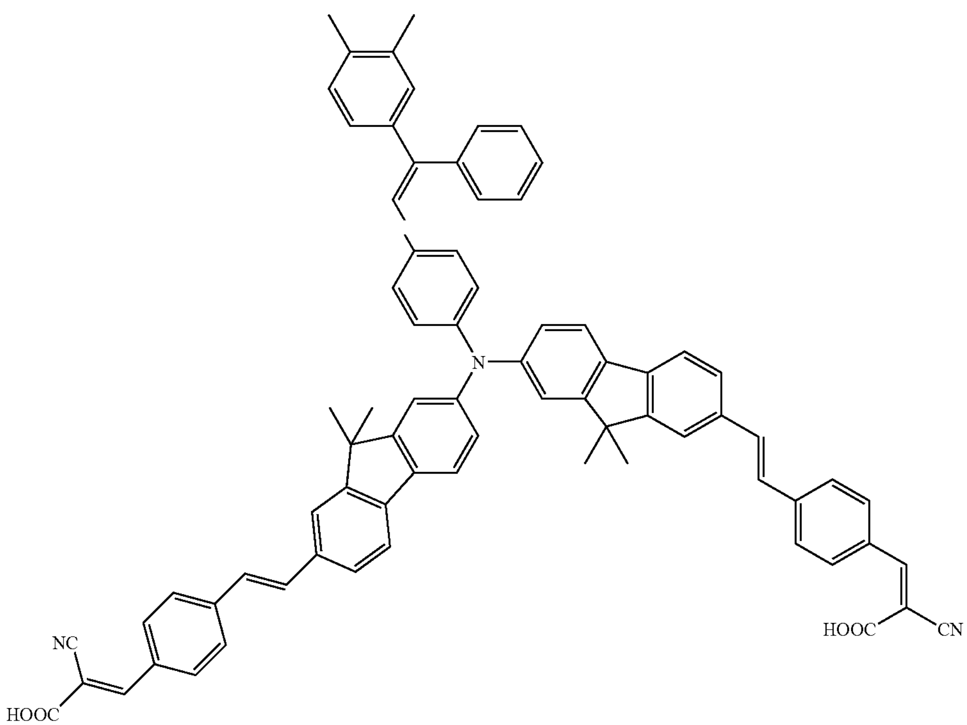

-continued
A-135
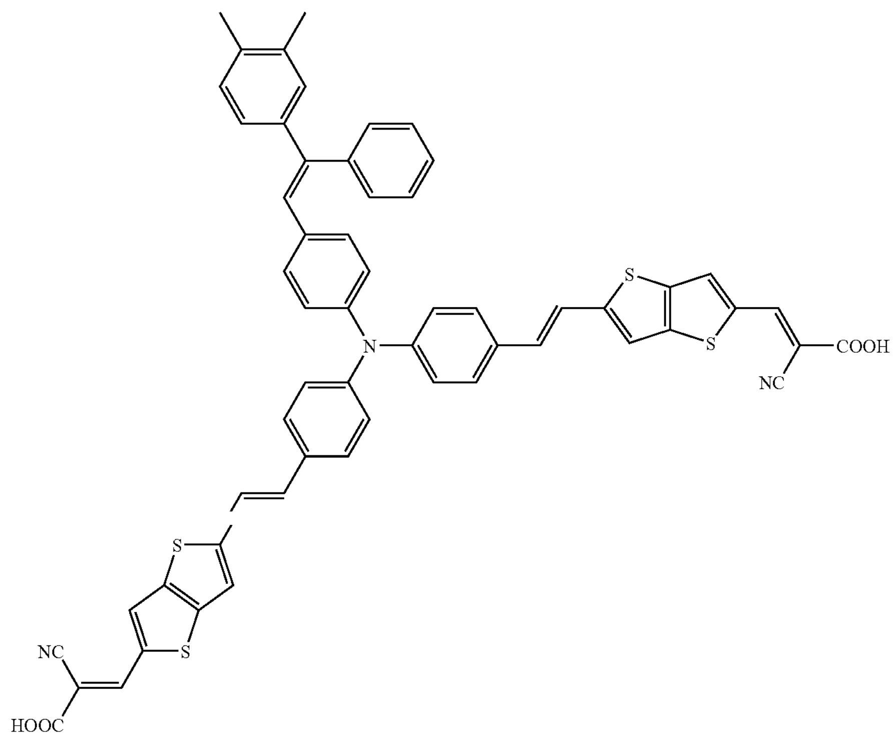
A-136
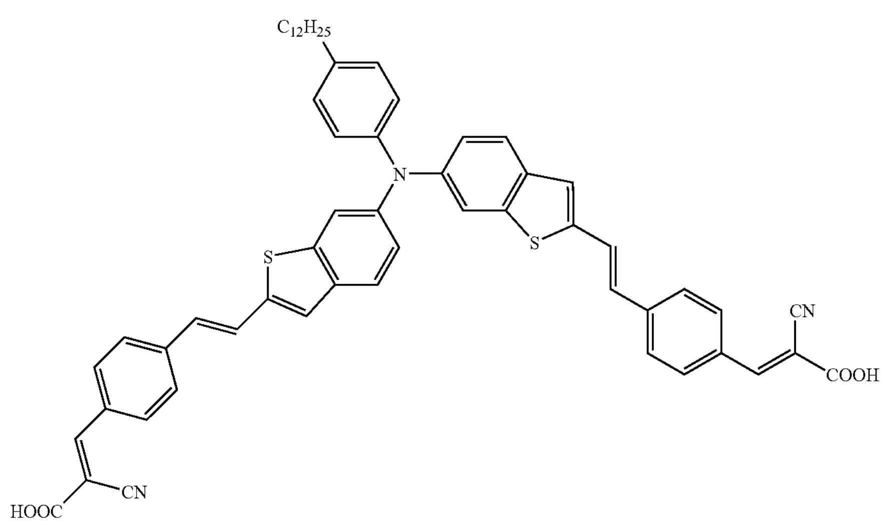

-continued

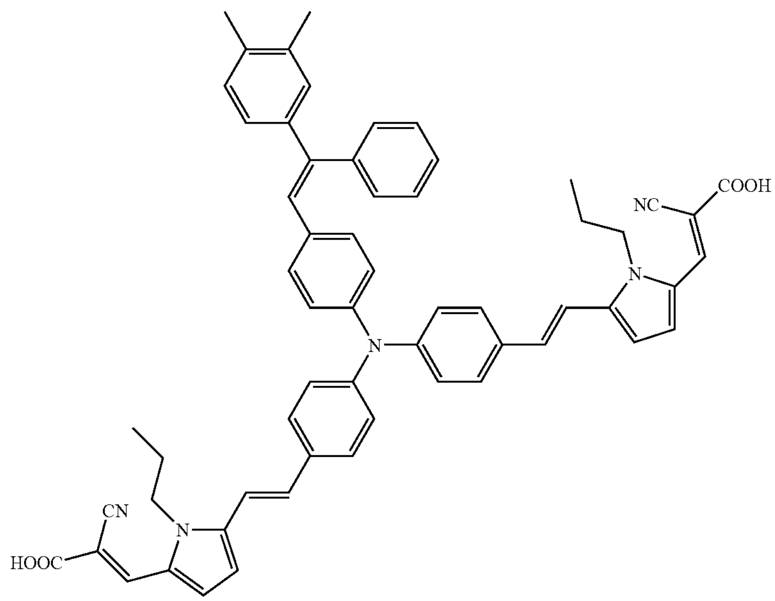

A-137

Furthers the sensitizing dye of the present invention is possible to be prepared via a conventional synthesis method. A synthesized example of exemplified compound A-1 as one of the sensitizing dyes employed in the present invention will be shown below.

[Synthesis of Exemplified Compound A-1]

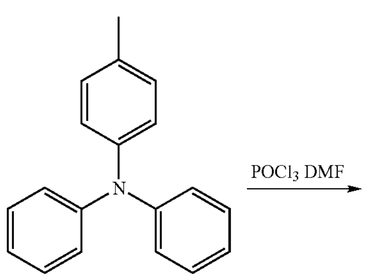

-continued

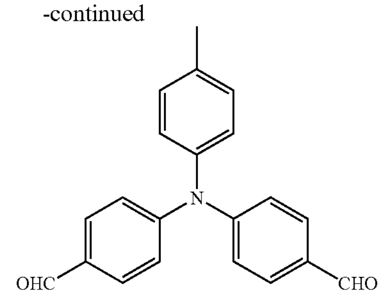

(1)

After dissolving 25.9 parts by weight (0.1 mole) of 4-methyltriphenylamine in 250 ml of toluene, 31 ml of N,N-dimethylformamide are added to drop 30 ml of phosphorous oxychloride at 5° C. via ice cooling. Next, after stirring at room temperature for 2 hours, the resulting is heated to 60° C., and then stands to cool. After cooling, the resulting is diluted with 200 ml of methylene chloride to nutralize with an aqueous potassium carbonate solution. Next, after an organic phase of the neutralizing solution is sorted, and anhydrous sodium sulfate is added, followed by drying, vacuum concentration is conducted to refine the resulting residue by column chromatography. Twenty parts by weight of formylated compound (1) (4,4'-diformyl-4"-methyltriphenylamine) can be obtained via the foregoing procedures.

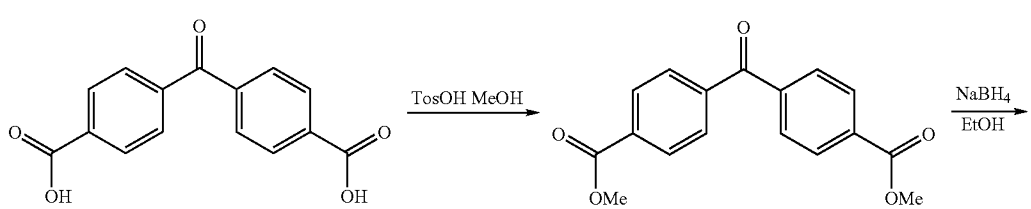

(2)

-continued

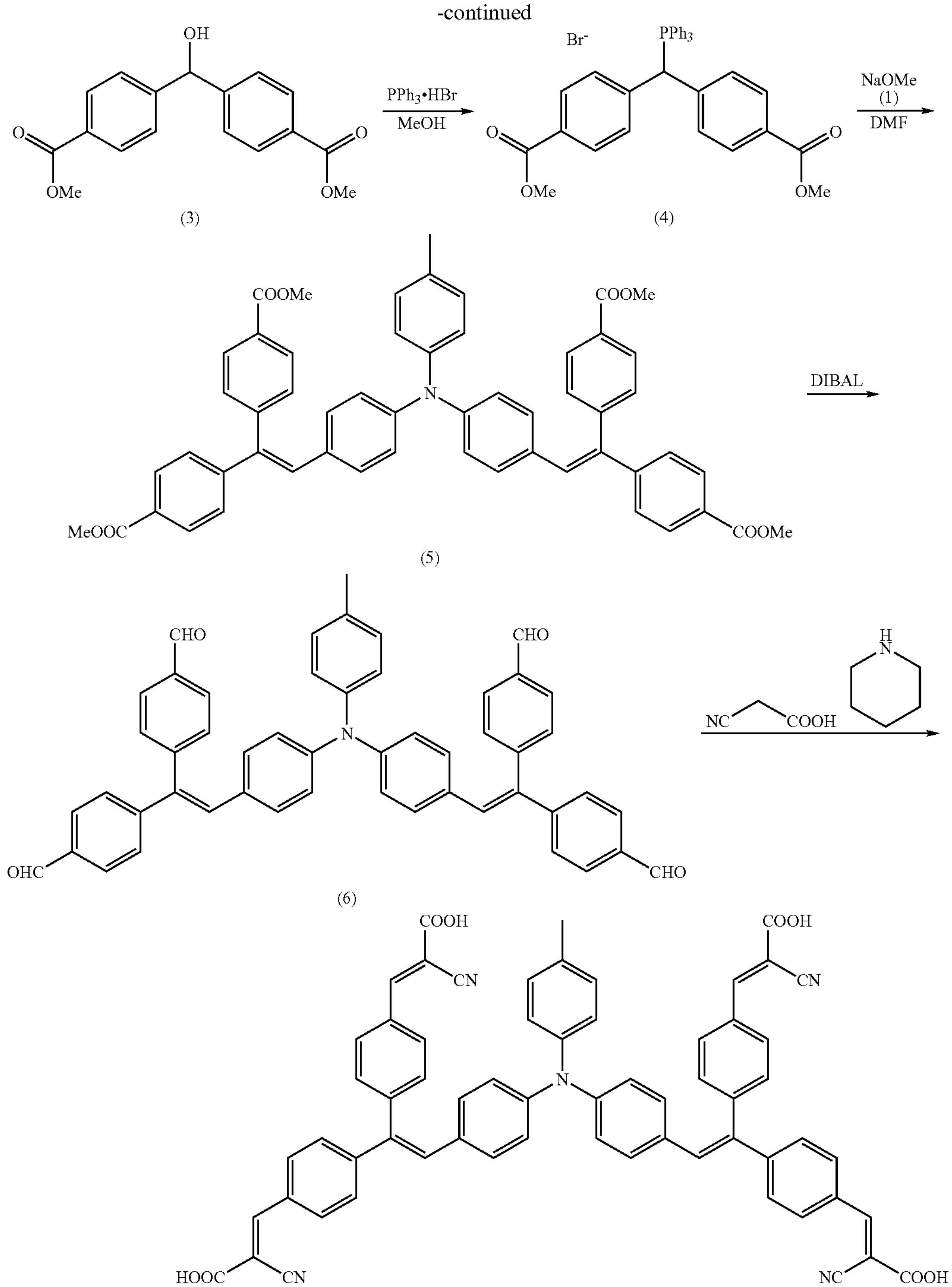

A-1

In 200 ml of chloroform, dissolved are 27 parts by weight (0.1 mol.) of benzophenone-4,4'-dicarboxylic acid, and 9.6 parts by weight of methanol (0.3 mol.) and 1 part by weight of a paratoluene sulfonic acid are added, and refluxed with heat for 6 hours. After standing to cool, a washing treatment is conducted with water, an aqueous 10% sodium hydrogen carbonate solution, and water in orders. After an organic phase is sorted, and an anhydrous sodium sulfate is added, followed by drying, concentration at reduced pressure is conducted, and the resulting residue is purified via column chromatography to obtain 20 parts by weight of compound (2).

In 60 ml of ethanol, dissolved are 20 parts by weight of compound (2), and 1.26 parts by weight of $NaBH_4$ are added while stirring at room temperature for 5 hours. After concentration, a washing treatment is conducted with water, and the resulting residue is purified via column chromatography to obtain 16 parts by weight of compound (3).

In 100 ml of methanol, dissolved are 15 parts by weight of compound (3), 50 ml of a methanol solution of 17.1 parts by weight of triphenyl phosphine hydrobromide are dropped at room temperature while stirring. The precipitate is filtrated, and washed with methanol, followed by drying to obtain 14 parts of compound (4).

Compound (4) (10.0 parts by weight), 100 ml of a DMF solution (5.0 parts by weight), and sodium methoxide (0.8 parts by weight) are added at a liquid temperature of 30-40 C while stirring for 2 hours. Then, 100 ml of water are added while stirring, the resulting crystals are subjected to a column chromatography treatment to obtain 6 parts by weight of compound (5).

In 50 ml of methylene chloride, dissolved are 4 parts by weight of compound (5), and 4.7 ml of a 1M hexane solution of doisobutyl aluminum hydride are dropped at −78° C. Next, after stirring for 30 minutes, a saturated $NH_4Cl$ aqueous solution is dropped, and the liquid temperature was returned to the room temperature while stirring. Then, concentration at reduced pressure is conducted, and the resulting residue is purified via column chromatography to obtain 1.2 parts by weight of compound (6).

In 10 ml chloroform, dissolved are 0.36 parts by weight, 0.15 parts by weight of a cyanoacetic acid, and 0.2 ml of piperidine to reflux with heat for 10 hours. The, concentration at reduced pressure is conducted, and the resulting residue is washed with water and subsequently washed with toluene to obtain 0.15 parts by weight of exemplified compound (A-1) via reprecipitation employing ethyl acetate and toluene.

A semiconductor layer carries exemplified compound (A-1) prepared by the above-described procedures to achieve sensitization, enabling to realize the effects produced in the present invention. As the method of carrying a sensitizing dye with a semiconductor layer, there are various methods such as a method of adsorbing a sensitizing dye on the semiconductor surface, and in the case of a semiconductor having a porous structure, a method of filling the foregoing sensitizing dye in the porous structure of the semiconductor layer.

The total carrying amount of a sensitizing dye of the present invention per $m^2$ of a semiconductor layer (or a semiconductor) is preferably 0.01-100 mmol, more preferably 0.1-50 mmol, and still more preferably 0.5-20 mmol.

When a sensitization treatment is conducted employing a sensitizing dye of the present invention, the sensitizing dye may be used singly or plural kinds of sensitizing dyes may be used in combination. Further, the sensitizing dye may be used in combination with commonly known other compounds. Examples of the commonly known other compounds include compounds disclosed in U.S. Pat. Nos. 4,684,537 4,927,721, 5,084,365, 5,350,644, 5,463,057, 5,525,440, Japanese Patent O.P.I. Publication No. 7-249790, and Japanese Patent O.P.I. Publication No. 2000-150007.

In the case of the photoelectric conversion element of the present invention used for a solar cell, at least two dyes differing in absorption wavelength ranges are preferably used, so that the wavelength region for photoelectric conversion is expanded as broad as possible to achieve effective utilization of solar light.

In order to carry a sensitizing dye of the present invention with a semiconductor, in general, is dissolved in an appropriate solvent (ethanol or the like) and a well-dried semiconductor is immersed into the solution for a long duration.

When using plural kinds of sensitizing dyes of the present invention or using the sensitizing dye in combination with other sensitizing dyes, a mixed solution of the dyes may be prepared or solutions of the individual dyes are prepared, in which a semiconductor is immersed. In the latter, immersion in the individual solutions may be conducted in any order. Further, semiconductor particles which were previously adsorbed with the sensitizing dyes may be mixed.

Details of the sensitization treatment of a semiconductor in the present invention will be described in the after-mentioned photoelectric conversion element.

In the case of a semiconductor having high porosity, it is preferred to subject the semiconductor to an adsorption treatment of the sensitizing dye before moisture or water vapor is adsorbed onto the semiconductor surface or into pores in the interior of the semiconductor.

Next, a photoelectric conversion element of the present invention will be described.

[Photoelectric Conversion Element]

The photoelectric conversion element is placed and formed by facing a photoelectrode formed by containing a dye in a semiconductor provided on a conductive support, to a facing electrode via an electrolyte layer. Next, the semiconductor, the conductive support, preparation of the photoelectrode, electrode and the facing electrode will be described in order.

<<Semiconductor>>

Usable examples of the semiconductor employed for a semiconductor layer include an elemental substance such as silicon, germanium or the like, a compound containing an element in Groups 3-5 and Groups 13-15 of the periodic table (referred to also as the element periodic table), a metal chalcogenide such as oxide, sulfide, selenide or the like, a metal nitride, and so forth.

Preferable examples of metal chalcogenide include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; a telluride of cadmium; and so forth. Examples of other compound-semiconductors include a phosphide of zinc, gallium, indium, cadmium or the like; a selenide of gallium-arsenic or copper-indium; a sulfide of copper-indium; a nitride of titanium; and so forth.

Specific examples include $TiO_2$, $SnO_2$, $Fe_2O_3$, $WO_3$, ZnO, $Nb_2O_5$, CdS, ZnS, PbS, $Bi_2S_{31}$ CdSe, CdTe, GaP, Inp, GaAs, $CuInS_2$, $CuInSe_2$, $Ti_3N_4$ and so forth. Of these, $TiO_2$, ZnO, $SnO_2$, $Fe_2O_3$, $WO_3$, $Nb_2O_5$, CdS and PbS are preferably usable, $TiO_2$ and $Nb_2O_5$ are more preferably usable, and $TiO_2$ is most preferably usable.

As a semiconductor employed for a photoelectrode, The above-described plural semiconductors may be used in combination. For example, several kinds of the above-described metal oxide or metal sulfide may be used in combination, and 20% by weight of titanium nitride ($Ti_3N_4$) may be mixed in titanium oxide semiconductor to be used. The zinc oxide/tin oxide composite described in J. Chem. Soc., Chem. Commun., 15 (1999) may also be applied. In this case, when a component other than metal oxide or metal sulfide is added as a semiconductor, a content of such the addition component is preferably 30% by weight with respect to the metal oxide or metal sulfide semiconductor.

A semiconductor utilized for a photoelectrode may be subjected to a surface treatment employing an organic base. Preferable examples of the foregoing organic base include diarylamine, triarylamine, pyridine, 4-t-butylpyridine, polyvinylpyridine, quinoline, piperidine, amidine and so forth. Among them, pyridine, 4-t-butylpyridine and polyvinylpyridine are preferable.

In cases where the above-described organic base is liquid, a solution dissolved in an organic solvent is prepared when it is solid, and a surface treatment can be conducted by immersing a semiconductor of the present invention in liquid amine or an amine solution.

<<Conductive Support>>

One having a structure in which a conductive substance is provided in a conductive material like a metal plate or a nonconductive material like a glass plate and a plastic film can be utilized for a conductive support employed for a photoelectric conversion element and a solar cell relating to the present invention. Examples of the material used for the conductive support include a metal such as platinum, gold, silver, copper, aluminum, rhodium and indium or conductive metal oxide such as indium-tin oxide composite oxide and fluorine-doped tin oxide, and carbon. The conductive support preferably has a thickness of 0.3-5 mm, but the thickness is not specifically limited.

It is preferable that the conductive support is substantially transparent. The term "substantially transparent" means that transmittance is at least 10%, preferably at least 500-0, and more preferably at least 80%. In order to obtain a transparent conductive support, a conductive layer made of conductive metal oxide is preferably provided on the surface of a glass plate or a plastic film. When the transparent conductive support is employed, light should enter from the support side.

The conductive support preferably has a surface resistance of 50 $\Omega/cm^2$ or less and more preferably has a surface resistance of 10 $\Omega/cm^2$ or less.

<<Preparation of Photoelectrode>>

A method of preparing a photoelectrode constituting an photoelectric conversion element of the present invention of the present invention.

In cases where a semiconductor for a photoelectrode of the present invention is particle-shaped, a photoelectrode may be prepared by coating or spraying particles onto a conductive support. Further, in cases where the semiconductor of the present invention is in the form of a film, and is not supported on the conductive support, the photoelectrode is preferably prepared by attaching the semiconductor onto the conductive support.

As a preferable embodiment of a photoelectrode formed constituted in the present invention, provided is a method of forming via calcination employing semiconductor particles provided on the above-described conductive support.

When a semiconductor of the present invention is prepared via calcination, the semiconductor is preferably subjected to a sensitization (adsorption, filling in a porous layer, and so forth) treatment employing a sensitizing dye after calcination. After the calcination, specifically, the compound is preferably subjected to the sensitization treatment rapidly before adsorbing water to the semiconductor.

Next, a method of forming a photoelectrode via calcination employing semiconductor particles, which is preferably utilized in the present invention, will be described in detail.

(Preparation of Semiconductor Powder-containing Coating Solution)

First, a semiconductor powder-containing coating solution is prepared. The primary particle diameter of this semiconductor powder is preferably as fine as possible. The semiconductor powder preferably has a primary particle diameter of 1-5,000 nm, and more preferably has a primary particle diameter of 2-50 nm. The coating solution containing the semiconductor powder can be prepared by dispersing the semiconductor powder in a solvent. The semiconductor powder dispersed in the solvent is dispersed in the form of the primary particle. The solvent is not specifically limited as long as it can disperse the semiconductor powder.

As the foregoing solvent, water, an organic solvent, and a mixture of water and an organic solvent are included. As the organic solvent, alcohol such as methanol, ethanol or the like, ketone such as methyl ethyl ketone, acetone, acetylacetone, or the like and hydrocarbon such as hexane, cyclohexane or the like are usable. A surfactant and a viscosity controlling agent (polyhydric alcohol such as polyethylene glycol or the like) can be added into a coating solution, if desired. The content of the semiconductor powder in the solvent is preferably 0.1-70% by weight, and more preferably 0.1-30% by weight.

(Coating of Semiconductor Powder-Containing Coating Solution and Calcination Treatment of Formed Semiconductor Layer)

The semiconductor powder-containing coating solution obtained as described above is coated or sprayed onto the conductive support, followed by drying, and then burned in air or inactive gas to form a semiconductor layer (referred to also as a semiconductor film) on the conductive support.

The layer formed via coating the semiconductor powder-containing coating solution onto the conductive support, followed by drying is composed of an aggregate of semiconductor particles, and the particle diameter corresponds to the primary particle diameter of the utilized semiconductor powder.

The semiconductor particle layer formed on a conductive layer of the conductive support or the like in such the way is subjected to a calcination treatment in order to increase mechanical strength and to produce a semiconductor layer firmly attached to a substrate, since the semiconductor particle layer exhibits bonding force with the conductive support, as well as bonding force between particles, and also exhibits weak mechanical strength.

In the present invention, this semiconductor layer may have any structure, but a porous structure layer (referred to also as a porous layer possessing pores) is preferable.

The semiconductor layer preferably has a porosity of 10% by volume or less, more preferably has a porosity of 8% by volume or less, and most preferably has a porosity of 0.01-5% by volume. In addition, the porosity of the semiconductor layer means a through-hole porosity in the direction of thickness of a dielectric, and it can be measured by a commercially available device such as a mercury porosimeter (Shimadzu Pore Analyzer 9220 type) or the like.

A semiconductor layer as a calcine film having a porous structure preferably has a thickness of at least 10 μm, and more preferably has a thickness of 1-25 μm.

A calcination temperature of 1,000° C. or less is preferable, a calcination temperature of 200-800° C. is more preferable, and a calcination temperature of 300-800° C. is still more preferable in view acquisition of a calcine film having the above-described porosity by suitably preparing real surface area of the calcine film during calcination treatment.

Further, a ratio of the real surface area to the apparent surface area can be controlled by a diameter and specific surface area of the semiconductor particle, the calcination temperature and so forth. After conducting a heat treatment, chemical plating employing an aqueous solution of titanium tetrachloride or electrochemical plating employing an aqueous solution of titanium trichloride may be conducted in order to increase the surface area of a semiconductor particle and purity in the vicinity of the semiconductor particle, and to increase an electron injection efficiency from a dye to a semiconductor particle.

(Sensitization Treatment of Semiconductor)

The sensitization treatment of the semiconductor is carried out by immersing a substrate burned with the foregoing semiconductor into a solution prepared after dissolving a sensitizing dye in a suitable solvent as described before. In this case, Bubbles in the layer are preferably removed by conducting a reduced pressure treatment or a heat treatment for a substrate on which a semiconductor layer (referred to also as a semiconductor film) is formed via calcination. Through such the treatment, a sensitizing dye can easily be penetrated deeply into the inside of the semiconductor layer (semiconductor film), and such the treatment is specifically preferable when the semiconductor layer (semiconductor film) possesses a porous structure film.

The solvent to dissolve the foregoing sensitizing dye in the present invention is not specifically limited as long as the solvent can dissolve the foregoing compound, and neither dissolve the semiconductor nor react with the semiconductor. However, the solvent is preferably subjected to deaeration and purification via distillation to prevent penetration of moisture and gas dissolved in the solvent into the semiconductor layer so as to avoid the sensitization treatment such as adsorption of the foregoing compound or the like.

Examples of preferably usable solvents to dissolve the foregoing compound include an alcohol based solvent such as methanol, ethanol, n-propanol and so forth; a ketone type solvent such as acetone, methylethyl ketone and so forth; an ether based solvent such as diethyl ether, diisopropyl ether, tetrahydrofuran, 1,4-dioxane and so forth; and a halogenated hydrocarbon solvent such as methylene chloride, 1,1,2-trichloroethane and so forth. Specifically preferred are methanol, ethanol, acetone, methylethyl ketone, tetrahydrofuran, and methylene chloride.

(Temperature and Time for Sensitization Treatment)

As to time to immerse a substrate on which the semiconductor layer is formed via calcination in a solution containing a sensitizing dye of the present invention, it is preferable to sufficiently sensitize the semiconductor by sufficiently making progress of adsorption by penetrating deeply into the semiconductor layer (semiconductor film). The time is preferably 1-48 hours, and more preferably 2-24 hours at 25° C. in order to inhibit that decomposed products prepared via decomposition of a sensitizing dye in a solution obstruct adsorption of the sensitizing dye formed by decomposition of the dye in the solvent. This effect is remarkable when the semiconductor film is specifically a porous structure film. However, the immersion time is that at 25° C. and is not always applied when the temperature is varied.

During the immersion, a solution containing a sensitizing dye employed in the present invention may be heated up to the temperature of no boiling, as long as the foregoing sensitizing dye is not decomposed. The temperature range is preferably 10-100° C., and more preferably 25-80° C., as long as the solution is not boiled in the foregoing temperature range.

<Electrolyte>>

The electrolyte utilized in an electrolyte layer constituting a photoelectric conversion element of the present invention will be described.

In the case of a photoelectric conversion element of the present invention, an electrolyte is filled in between facing electrodes to form an electrolyte layer. A redox electrolyte is preferably utilized as an electrolyte. As the redox electrolyte, $I^-/I_3^-$ system, $Br^-/Br_3^-$ system and quinone/hydroquinone system are cited. Such the redox electrolyte can be obtained by a commonly known method, and the electrolyte of $I^-/I_3^-$ system, for example, can be obtained by mixing an ammonium salt of iodine and iodine. The electrolyte layer is composed of the dispersion of such the redox electrolyte. When such the dispersion is a solution, the dispersion is called a liquid electrolyte; when one being a solid at room temperature is dispersed in a polymer, it is called a solid polymer electrolyte; and when it is dispersed in a material in the form of a gel, it is called a gel electrolyte. When the liquid electrolyte is employed as a liquid electrolyte, an electrochemically inactive substance is used as the solvent such as acetonitrile, propylene carbonate, ethylene carbonate and so forth. Examples of the solid polymer electrolyte are disclosed in Japanese Patent O.P.I. Publication No. 2001-160427, and examples of the gel electrolyte are disclosed in "Hyomen Kagaku (Surface Science)" Vol. 21, No. 5, pages 288-293.

<<Facing Electrode>>

The facing electrode employed in the present invention will be described

Any conductive material is optionally usable for the facing electrode, but preferable is one exhibiting catalytic ability to perform oxidation of a redox ion of $I_3^-$ and reducing reaction of another ion at sufficient speed. As such the electrode, a platinum electrode, those subjected to platinum plating or platinum evaporation on the surface of a conductive material, rhodium metal, ruthenium metal, ruthenium oxide, carbon and so forth are cited.

<<Solar Cell>>

Next, the solar cell of the present invention will be described.

As an embodiment of a photoelectric conversion element in the present invention, the solar cell of the present invention is designed to be optimized for circuit design to solar light, and possesses a structure capable of performing optimum photoelectric conversion when solar light is utilized as a light source. That is, the solar cell possesses a structure in which a dye-sensitized semiconductor can be exposed to solar light.

In the case of a solar cell to be designed in the present invention, the foregoing photoelectrode, electrolyte layer and facing electrode are stored in a case and sealed, or they are entirely sealed with a resin.

When the solar cell of the present invention is exposed to solar light or electromagnetic waves identical to solar light, the foregoing sensitizing dye carried by a semiconductor absorbs exposure light or exposure electromagnetic waves, and is exited. Electrons are generated via excitation, generated electrons are moved to the semiconductor and subsequently to the facing electrode via a conductive support to reduce a redox electrolyte in a charge transfer layer. On the other hand, a sensitizing dye of the present invention by which electrons are moved to the semiconductor becomes an oxidized body, but electrons are supplied from the facing electrode via the redox electrolyte in the electrolyte layer to conduct reducing, and returned to the original state. The redox electrolyte in the charge transfer layer is simultaneously oxidized so as to be returned to a state where it is reduced again by electrons supplied from the facing electrode. Since electrons can be moved by such the mechanism, a solar cell of the present invention can be constituted by using a photoelectric conversion element.

EXAMPLE

Example A

Next, specific examples of the present invention will be described, but the present invention is not limited thereto 1. Preparation of Photoelectric Conversion Element The photoelectric conversion element was prepared by the following procedures.

<Preparation of Liquid Electrolyte Cell>

(Preparation of Photoelectric Conversion Element SC-1)

A commercially available titanium oxide paste having a particle diameter of 18 nm was coated onto a fluorine-doped tin oxide conductive glass substrate (herein after, referred to also as FTO) by a doctor blade method. The paste was dried at 60° C. for 10 minutes, and burned at 500° C. for 30 minutes to obtain a titanium oxide thin film having a thickness of 5 μm.

Exemplified compound A-1 prepared by the method shown in the foregoing synthesis example was dissolved in ethanol to prepare a $3\times10^{-4}$ M solution. After s FTO glass substrate on which titanium oxide paste was coated and burned was immersed in this solution at room temperature for 16 hours to conduct an adsorption treatment of the dye, a washing treatment was conducted with chloroform, followed by vacuum drying to prepare a photoelectric conversion electrode.

A 3-methylpropionitrile solution containing 0.4 M lithium iodide, 0.05 M iodine, and 0.5 M 4-(t-butyl)pyridine was employed as an electrolytic solution.

A platinum plate was used as the facing electrode. The facing electrode was assembled by a clump cell together with the previously prepared photoelectric conversion electrode and the electrolytic solution to prepare photoelectric conversion element (solar cell) SC-1.

(Preparation of Photoelectric Conversion Elements SC-2-SC-14)

Photoelectric conversion elements SC-2-SC-14 each were prepared similarly to preparation of photoelectric conversion element SC-1, except that exemplified compound A-1 was replaced by exemplified compound A-14, exemplified compound A-16, exemplified compound A-21, exemplified compound A-23, exemplified compound A-32, exemplified compound A-24, exemplified compound A-43, exemplified compound A-57, exemplified compound A-71, exemplified compound A-83, exemplified compound A-109, exemplified compound A-127 and exemplified compound A-136, respectively.

(Preparation of Comparative Photoelectric Conversion Element SC-R1)

Photoelectric conversion element SC-R1 was prepared similarly to preparation of photoelectric conversion element SC-1, except that exemplified compound A-1 was replaced by the following compound R-1.

R-1

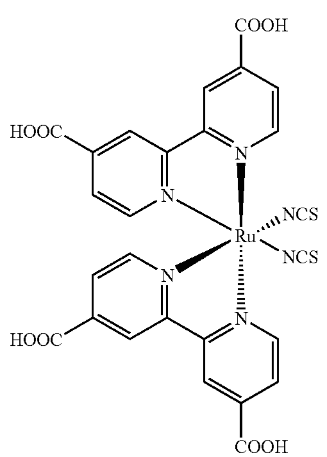

(Preparation of Comparative Photoelectric Conversion Element SC-R2)

Photoelectric conversion element SC-R2 was prepared similarly to preparation of photoelectric conversion element SC-1, except that exemplified compound A-1 was replaced by the following compound R-2.

R-2

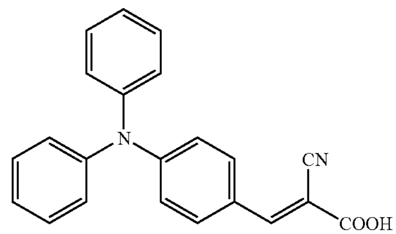

(Preparation of Solid Electrolyte Cell)

(Preparation of Comparative Photoelectric Conversion Element SC-R1)

An alkoxytitanium solution (produced by Matsumoto Kosho, TA-25/IPA dilution) was coated on a FTO electrode by a spin coating method. After standing at room temperature for 30 minutes, it was burned at 450° C. to form a short circuit prevention layer. Subsequently, a commercially available titanium oxide paste (a particle diameter of 18 nm) was coated on the foregoing short-circuited prevention layer by a doctor blade method, followed by a heat treatment at 60° C. for 10 minutes and then a burning treatment at 500° C. for 30 minutes to obtain a semiconductor electrode substrate having a titanium oxide thin layer of a thickness of 5 μm.

The foregoing compound R-2 was dissolved in ethanol to prepare a $3\times10^{-4}$ mol/L solution. The above-described semiconductor electrode substrate was immersed in this solution at room temperature for 16 hours to conduct an adsorption treatment of a sensitizing dye, then, washed with chloroform, followed by vacuum drying to obtain a photoelectric conversion electrode.

Next, 0.17 M spiro-MeO TAD as a hole transport agent, 0.33 mM $N(PhBr)_3SbCl_6$ as a hole doping agents and 15 μM $Li[(CF_3SO_2)_2N]$ were dissolved in a toluene solvent to form a hole transfer layer on the foregoing photoelectric conversion electrode by a spin coating method after adsorbing the dye. Further, a 30 nm thick gold layer was deposited via vacuum evaporation to form a facing electrode, whereby photoelectric conversion element SE-R1 was obtained.

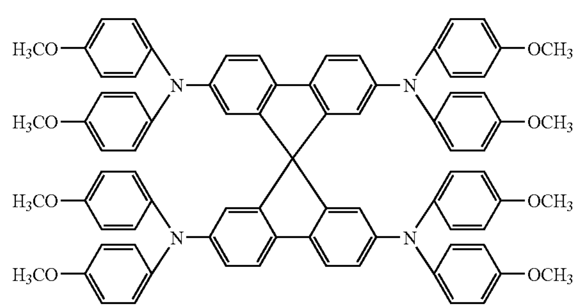

spiro-MeO TAD (Preparation of Comparative Photoelectric Conversion Element SE-1)

Photoelectric conversion element SE-1 was prepared similarly to preparation of photoelectric conversion element SE-R1, except that compound used in the preparation of photoelectric conversion element SE-R1 was replaced by exemplified compound A-1.

2. Evaluation of Power Generation

Photoelectric conversion characteristics were measured via exposure to a xenon lamp at an incident light intensity of 100 $mW/cm^2$, under the condition of covering an oxide semiconductor electrode with a mask of 5×5 $mm^2$.

That is, as to photoelectric conversion elements SC-1, SC-2, SC-3, SC-4, SC-5, SC-6 and SE-1, and comparative photoelectric conversion elements SC-R1, SC-R2 and SE-R1, current-voltage characteristics at room temperature were measured by an I-V tester to evaluate power generation characteristics. In addition, concerning evaluations, photoelectric conversion elements SC-1, SC-2, SC-3, SC-4, SC-5, SC-6 and SE-1 are in relation to Example 1, Example 2, Example 3, Example 4, Example 5, Example 6 and Example 7, respectively, and comparative photoelectric conversion elements SC-R1, SC-R2, SE-R1 are in relation to Comparative example 1, Comparative example 2 and Comparative example 3, respectively.

The current-voltage characteristics are measured by a I-V tester to obtain short circuit current density Jsc (mA/cm$^2$), open circuit voltage Voc (V), and form factor (F. F.), whereby photoelectric conversion efficiency η (%) was determined by utilizing the following formula with the foregoing values. In addition, photoelectric conversion efficiency η (%) is represented by the following equation. That is, photoelectric conversion efficiency η=100×(Voc×Jsc×F. F.)/P, wherein P represents the forgoing incident light intensity (mw/cm$^2$).

Further, after an oxide semiconductor electrode was subjected to an ozone exposure treatment under atmosphere having an ozone concentration of 9 ppm for 20 minutes, photoelectric conversion efficiency η was obtained to evaluate variation before and after conducting the ozone exposure treatment as an efficiency ratio. That is, the foregoing efficiency ratio is represented by the following equation.

Efficiency ratio=photoelectric conversion efficiency after conducting at least one of light exposure and an ozone exposure treatment/photoelectric conversion efficiency before conducting light exposure•ozone exposure treatment These results are shown in Table 1.

Further, light exposure was conducted for 30 minutes employing a Xenon lamp having an intensity of 100 mW/cm$^2$, and subsequently, the variation ratio was further determined.

Results are shown in Table 1.

As shown in Table 1, it was confirmed that Examples 1-7 of the present invention exhibited higher photoelectric conversion efficiency ratio before and after conducting an ozone exposure treatment, and much higher oxidation resistance than those of each of comparative examples 1-3 employing Ru complex compound R-1 or triphenylamine based compound R-2. It was also confirmed from results in Examples of the present invention that introducing a styryl structure into a triarylamine base moiety led to the effect of producing a sensitizing dye exhibiting high durability.

Example B

After measuring the photoelectric conversion efficiency before conducting light exposure•ozone exposure treatment in Example A, when the oxide semiconductor electrode is rinsed with ethanol, samples of Examples 1-5 are not colored with respect to the rinsed ethanol liquid, whereby no dye spillage is produced, whereas in the case of a sample of Example 6, wispy dye spillage is produced, and spillage of the dye in Comparative example 1 is large. It is confirmed that the compound of the present invention exhibits excellent adsorption, and specifically, improved adsorption of an acidic group in which the organic residue having an acidic group is an ethylene group substituted by a carboxylic acid group or a cyano group.

EFFECT OF THE INVENTION

It becomes possible in the present invention to provide a dye-sensitizing type photoelectric conversion element exhibiting excellent durability and high photoelectric conversion efficiency, and also to provide a solar cell fitted with the photoelectric conversion element.

What is claimed is:

1. A photoelectric conversion element comprising a compound represented by the following Formula (1) between a pair of facing electrodes:

TABLE 1

| Photoelectric conversion element | Compound | Short circuit current mA/cm$^2$ | Open voltage mV | Form factor | *1 | *2 | Efficiency ratio | Photoelectric conversion efficiency % after light exposure | Efficiency ratio | Remarks |
|---|---|---|---|---|---|---|---|---|---|---|
| SC-1 | A-1 | 8.95 | 700 | 0.65 | 4.07 | 2.73 | 0.67 | 2.2 | 0.54 | Inv. |
| SC-2 | A-14 | 8.53 | 680 | 0.63 | 3.65 | 2.56 | 0.7 | 2.3 | 0.63 | Inv. |
| SC-3 | A-16 | 7.94 | 790 | 0.64 | 4.01 | 2.77 | 0.69 | 2.45 | 0.61 | Inv. |
| SC-4 | A-21 | 8.2 | 680 | 0.62 | 3.46 | 2.11 | 0.64 | 2 | 0.58 | Inv. |
| SC-5 | A-23 | 8.4 | 690 | 0.53 | 3.07 | 1.84 | 0.6 | 1.7 | 0.50 | Inv. |
| SC-6 | A-32 | 7.2 | 614 | 0.67 | 2.96 | 1.81 | 0.61 | 1.4 | 0.47 | Inv. |
| SC-7 | A-24 | 6.5 | 610 | 0.64 | 2.54 | 1.5 | 0.59 | 1.29 | 0.51 | Inv. |
| SC-8 | A-43 | 7.1 | 720 | 0.62 | 3.17 | 2.1 | 0.66 | 1.9 | 0.60 | Inv. |
| SC-9 | A-57 | 9.9 | 660 | 0.67 | 4.38 | 2.93 | 0.67 | 2.58 | 0.59 | Inv. |
| SC-10 | A-71 | 8.7 | 710 | 0.68 | 4.2 | 2.73 | 0.65 | 2.44 | 0.58 | Inv. |
| SC-11 | A-83 | 7.9 | 730 | 0.7 | 4.04 | 2.42 | 0.6 | 1.98 | 0.49 | Inv. |
| SC-12 | A-109 | 7.8 | 640 | 0.72 | 3.59 | 2.16 | 0.6 | 1.83 | 0.51 | Inv. |
| SC-13 | A-127 | 8.3 | 690 | 0.65 | 3.72 | 2.42 | 0.65 | 2.27 | 0.61 | Inv. |
| SC-14 | A-136 | 8.6 | 660 | 0.68 | 3.86 | 2.55 | 0.66 | 2.32 | 0.60 | Inv. |
| SE-1 | A-1 | 1.2 | 730 | 0.67 | 0.59 | 0.42 | 0.71 | 0.38 | 0.64 | Inv. |
| SC-R1 | R-1 | 13 | 767 | 0.65 | 6.48 | 2.46 | 0.38 | 2 | 0.31 | Comp. |
| SC-R2 | R-2 | 6.1 | 588 | 0.6 | 2.15 | 0.9 | 0.42 | 0.84 | 0.39 | Comp. |
| SE-R1 | R-2 | 1 | 700 | 0.65 | 0.46 | 0.18 | 0.39 | 0.14 | 0.30 | Comp. |

*1: Photoelectric conversion efficiency % before ozone exposure treatment

*2: Photoelectric conversion efficiency % after ozone exposure treatment

Inv.: Present invention,

Comp.: Comparative

Formula (1)

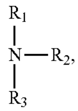

wherein each of $R_1$, $R_2$ and $R_3$ represents an aromatic hydrocarbon group or a heterocyclic group that may have a substituent; and each of at least two of $R_1$, $R_2$ and $R_3$ is represented by the following Formula (2):

Formula (2)

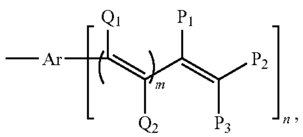

wherein Ar represents an aromatic hydrocarbon group or a heterocyclic group that may have a substituent; n is an integer of 1-5; m is 0 or 1; each of $Q_1$ and $Q_2$ independently represents a hydrogen atom, a nitro group, a cyano group, a hydroxyl group, a carbonyl group, a thiol group, an alkyl group that may be substituted, an alkenyl group, an alkynyl group, an alkoxy group, a thioalkyl group, an amino group, an arylene group or a heterocyclic group; each of $P_1$, $P_2$ and $P_3$ independently represents a hydrogen atom, a halogen atom, a nitro group, a cyano group, a hydroxyl group, a carbonyl group, a thiol group, an alkyl group that may be substituted, an alkenyl group that may be substituted, an alkynyl group, an alkoxy group that may be substituted, a thioalkyl group that may be substituted, an amino group that may be substituted, an aryl group that may be substituted or a heterocyclic group that may be substituted; at least one of $P_1$, $P_2$ and $P_3$ represents an aromatic hydrocarbon group or a heterocyclic group substituted by an organic residue having an acidic group; $R_1$, $R_2$, $R_3$, $P_1$, $P_2$, $P_3$, $Q_1$ and $Q_2$ may form a cyclic structure directly, or via other bonded atoms; and a carbon-carbon double bond may be in any of a cis arrangement and a trans arrangement, and wherein the organic residue having the acidic group comprises an ethylene group substituted by a carboxylic acid group or a cyano group.

2. The photoelectric conversion element of claim 1, wherein Ar in Formula (2) comprises a phenylene group.

3. The photoelectric conversion element of claim 1, wherein m is 0 in Formula (2).

4. photoelectric conversion element of claim 1, wherein n is 1 in Formula (2).

5. photoelectric conversion element of claim 1, wherein $P_1$ comprises a hydrogen atom, and at least one of $P_2$ and $P_3$ comprises an aromatic hydrocarbon group substituted by an organic residue having an acidic group.

6. photoelectric conversion element of claim 1, wherein each of $R_1$ and $R_2$ is represented by Formula (2); Ar is an arylene group; m is 0; n is 1; $P_1$ is a hydrogen atom; and $P_2$ or $P_3$ comprises a phenyl group substituted by an organic residue having an acidic group.

7. The photoelectric conversion element of claim 1, wherein Formula (2) is represented by the following Formula (3), and $P_2$ comprises a phenyl group that may have a hydrogen atom or a substituent:

Formula (3)

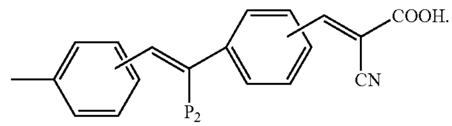

8. The photoelectric conversion element of claim 1, wherein Formula (2) is represented by the following Formula (4):

Formula (4)

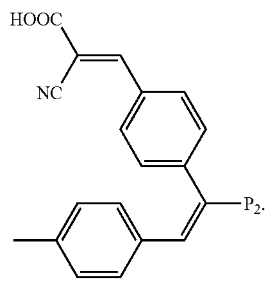

9. The photoelectric conversion element of claim 1, wherein Formula (2) is represented by the following Formula (5):

Formula (5)

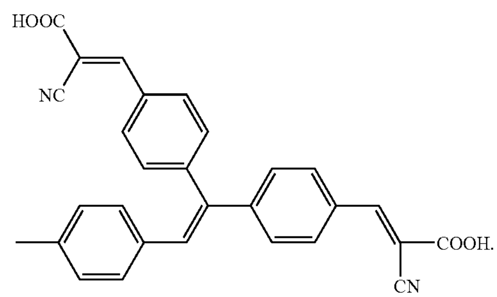

10. The photoelectric conversion element of claim 1, comprising a charge transfer layer and a semiconductor layer carrying a compound having a structure represented by Formula (1).

11. A solar cell comprising the photoelectric conversion element of claim 1.

* * * * *